(12) United States Patent
Takafuji et al.

(10) Patent No.: US 7,619,250 B2
(45) Date of Patent: Nov. 17, 2009

(54) SEMICONDUCTOR DEVICE AND MANUFACTURING METHOD THEREOF, SOI SUBSTRATE AND DISPLAY DEVICE USING THE SAME, AND MANUFACTURING METHOD OF THE SOI SUBSTRATE

(75) Inventors: Yutaka Takafuji, Nara (JP); Takashi Itoga, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 35 days.

(21) Appl. No.: 11/502,598

(22) Filed: Aug. 11, 2006

(65) Prior Publication Data

US 2007/0063281 A1    Mar. 22, 2007

Related U.S. Application Data

(62) Division of application No. 10/377,875, filed on Mar. 4, 2003, now Pat. No. 7,119,365.

(30) Foreign Application Priority Data

| Mar. 26, 2002 | (JP) | ............................... 2002-86999 |
| Aug. 23, 2002 | (JP) | ............................... 2002-243927 |
| Sep. 25, 2002 | (JP) | ............................... 2002-280036 |

(51) Int. Cl.
  *H01L 29/04* (2006.01)
  *H01L 31/036* (2006.01)
  *H01L 31/0376* (2006.01)
  *H01L 31/20* (2006.01)

(52) U.S. Cl. .............................. 257/59; 257/64; 257/66; 257/69; 257/70; 257/72; 257/347; 257/E21.505

(58) Field of Classification Search ................... 257/59, 257/64, 66, 69, 70, 72, 347
See application file for complete search history.

(56) References Cited

U.S. PATENT DOCUMENTS 5,909,627 A    6/1999    Egloff (Continued)

FOREIGN PATENT DOCUMENTS

EP    0559389    9/1993

(Continued)

OTHER PUBLICATIONS

U.S. Appl. No. 10/377,875, filed Mar. 4, 2003.

(Continued)

*Primary Examiner*—Thien F Tran
(74) *Attorney, Agent, or Firm*—Nixon & Vanderhye P.C.

(57) ABSTRACT

A polycrystalline Si thin film and a single crystal Si thin film are formed on an $SiO_2$ film deposited on an insulating substrate. A polycrystalline Si layer is grown by thermally crystallizing an amorphous Si thin film so as to form the polycrystalline Si thin film. A single crystal Si substrate, having (a) an $SiO_2$ film thereon and (b) a hydrogen ion implantation portion therein, is bonded to an area of the polycrystalline Si thin film that has been subjected to etching removal, and is subjected to a heating process. Then, the single crystal Si substrate is divided at the hydrogen ion implantation portion in an exfoliating manner, so as to form the single crystal Si thin film. As a result, it is possible to provide a large-size semiconductor device, having the single crystal Si thin film, whose property is stable, at a low cost.

24 Claims, 15 Drawing Sheets

U.S. PATENT DOCUMENTS

| | | |
|---|---|---|
| 5,993,677 A | 11/1999 | Biasse et al. |
| 6,157,421 A | 12/2000 | Ishii |
| 6,271,101 B1 | 8/2001 | Fukunaga |
| 6,300,175 B1 | 10/2001 | Moon |
| 6,319,867 B1 | 11/2001 | Chacon et al. |
| 6,534,380 B1 | 3/2003 | Yamauchi et al. |
| 7,119,365 B2 | 10/2006 | Takafuji et al. |
| 7,303,980 B2 * | 12/2007 | Yamazaki et al. ........... 438/478 |
| 2002/0001921 A1 | 1/2002 | Fukunaga |
| 2002/0070454 A1 | 6/2002 | Yasukawa |
| 2002/0100941 A1 | 8/2002 | Yonehara et al. |
| 2003/0047289 A1 | 3/2003 | Jaussaud et al. |
| 2003/0201508 A1 | 10/2003 | Yasukawa |
| 2003/0207545 A1 | 11/2003 | Yasukawa |
| 2004/0023448 A1 | 2/2004 | Fukunaga |
| 2005/0151201 A1 | 7/2005 | Fukunaga |
| 2005/0202595 A1 | 9/2005 | Yonehara et al. |
| 2007/0108510 A1 | 5/2007 | Fukunaga |

FOREIGN PATENT DOCUMENTS

| | | |
|---|---|---|
| JP | 211128/1993 | 8/1993 |
| JP | 6-11729 | 1/1994 |
| JP | 08-078516 | 3/1996 |
| JP | 9-121039 A | 5/1997 |
| JP | 10-293320 | 11/1998 |
| JP | 10-293322 | 11/1998 |
| JP | 11-24106 | 1/1999 |
| JP | 11-97379 | 4/1999 |
| JP | 163363/1999 | 6/1999 |
| JP | 2000-021782 | 1/2000 |
| JP | 2000-106424 | 4/2000 |
| JP | 23948/2001 | 1/2001 |
| JP | 2001-255559 | 9/2001 |
| JP | 2002-170942 | 6/2002 |
| JP | 2002-217417 | 8/2002 |
| JP | 2002-231909 | 8/2002 |
| WO | WO 00/32528 | 6/2000 |

OTHER PUBLICATIONS

Hara et al., "Ultra-high Performance Poly-Si TFTs on a Glass by a Stable Scanning CW Laser Lateral Crystallization," 2001 International Workshop on Active Matrix Liquid Crystal Displays—TFT Technologies and Related Materials—AM-LCD2001, Digest of Technical Papers (Jul. 11-13, 2001), Japan Society of Applied Physics, pp. 227-230.

Tong et al., "Semiconductor Wafer Bonding: Science and Technology," A Wiley-Interscience Publication (1999, John Wiley & Sons, Inc.), pp. 11, 108, and 118.

Korean Office Action mailed Apr. 22, 2005 (w/English translation thereof).

Chinese Office Action mailed Apr. 22, 2005 (w/English translation thereof).

* cited by examiner

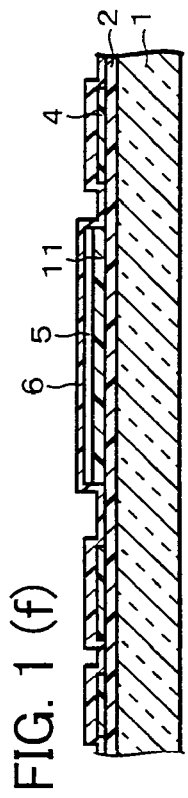
FIG. 1 (a)
FIG. 1 (b)
FIG. 1 (c)
FIG. 1 (d)
FIG. 1 (e)
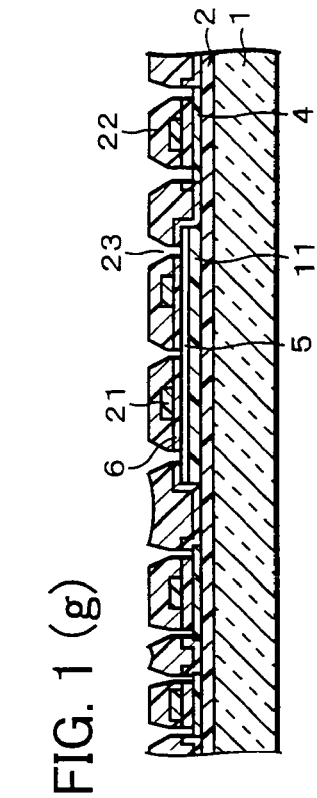
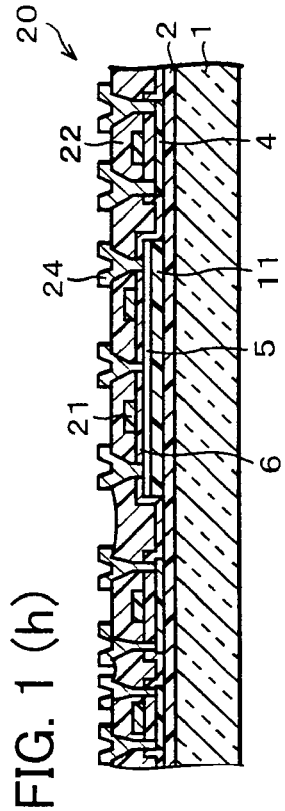
FIG. 1 (f)
FIG. 1 (g)
FIG. 1 (h)

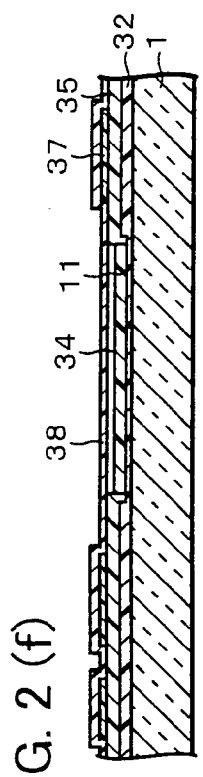
FIG. 2 (a)
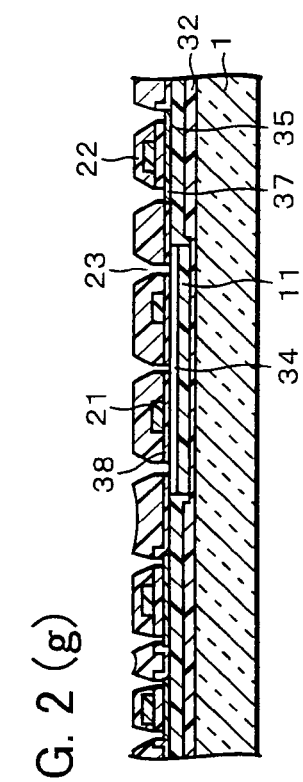
FIG. 2 (b)
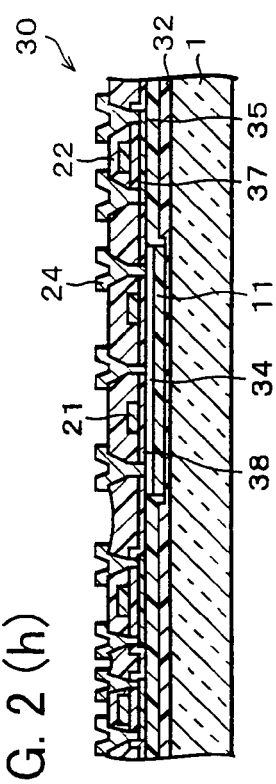
FIG. 2 (c)
FIG. 2 (d)
FIG. 2 (e)
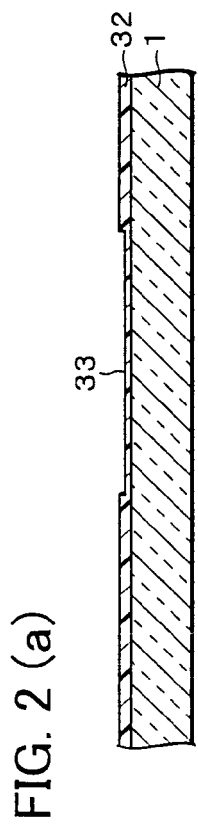
FIG. 2 (f)
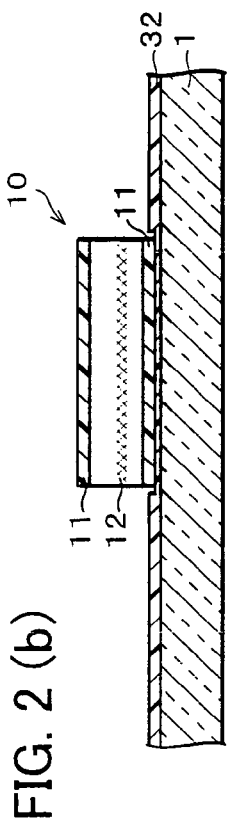
FIG. 2 (g)
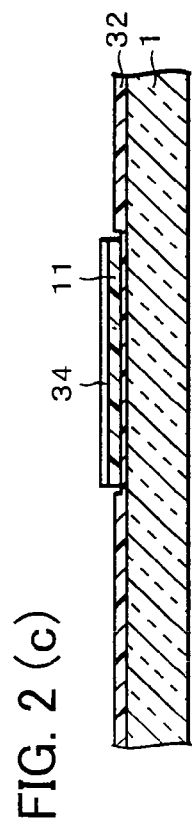
FIG. 2 (h)
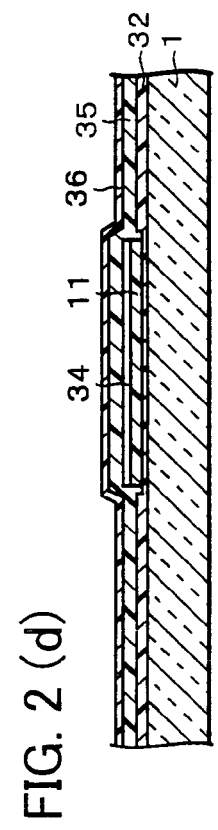
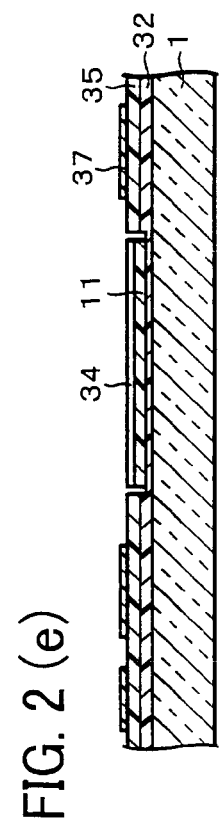

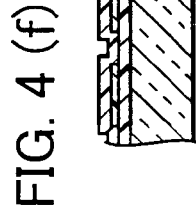
FIG. 4 (a)
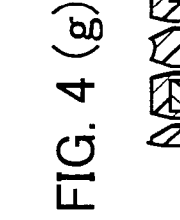
FIG. 4 (b)
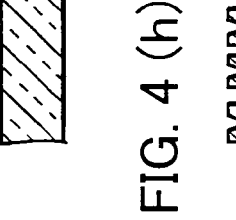
FIG. 4 (c)
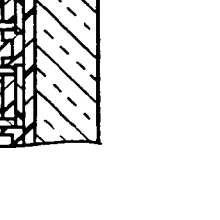
FIG. 4 (d)
FIG. 4 (e)
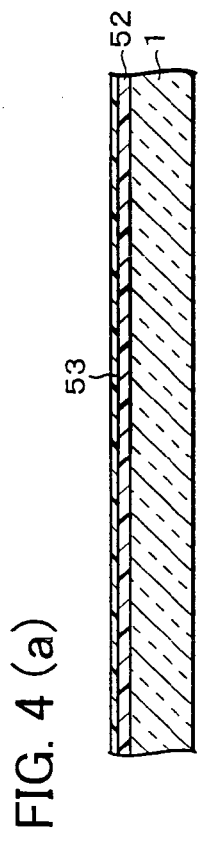
FIG. 4 (f)
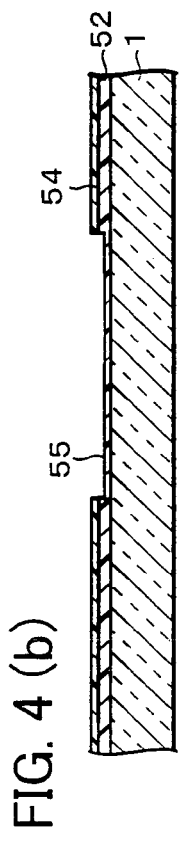
FIG. 4 (g)
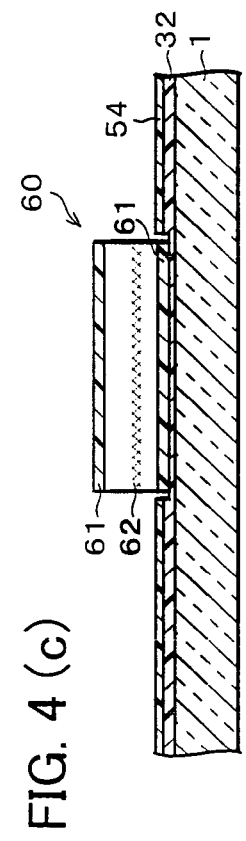
FIG. 4 (h)

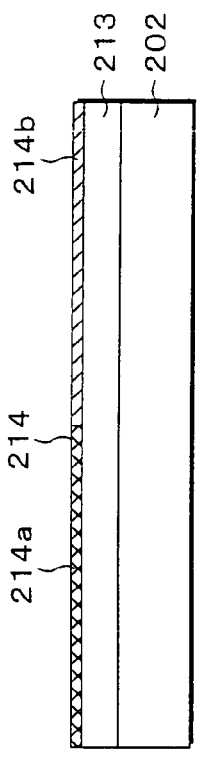
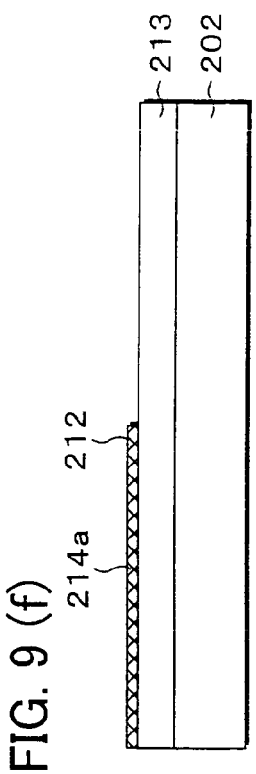
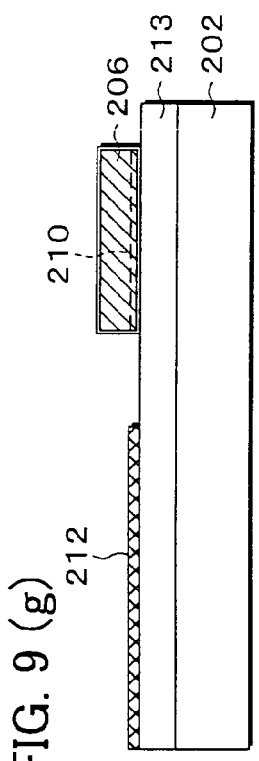
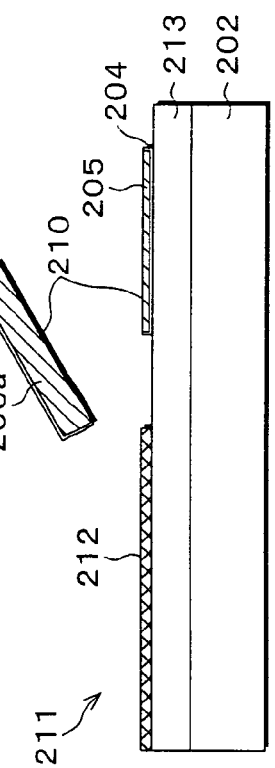
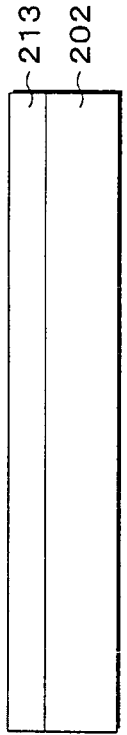
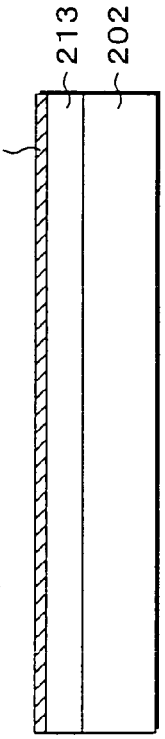
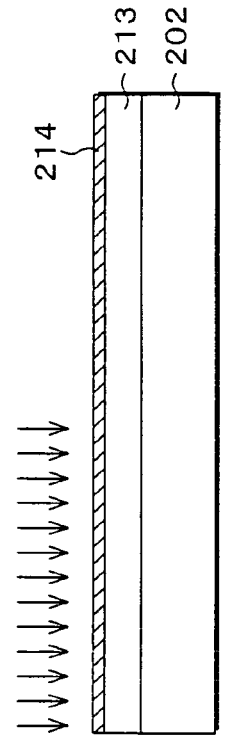

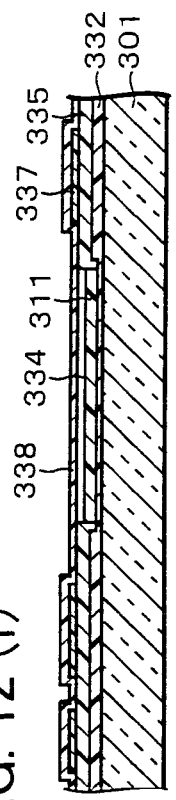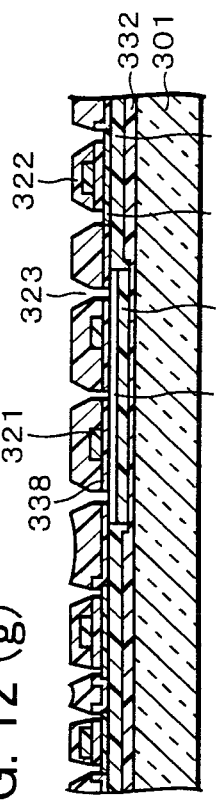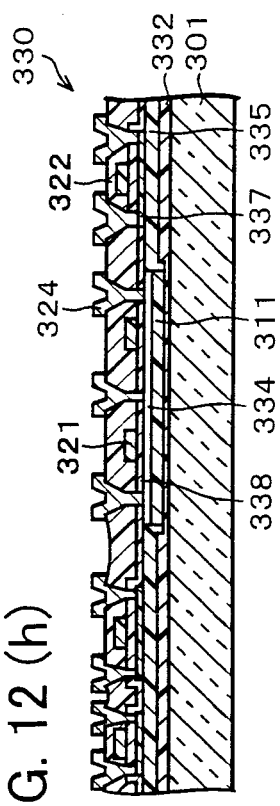
FIG. 12 (f)  FIG. 12 (g)  FIG. 12 (h)
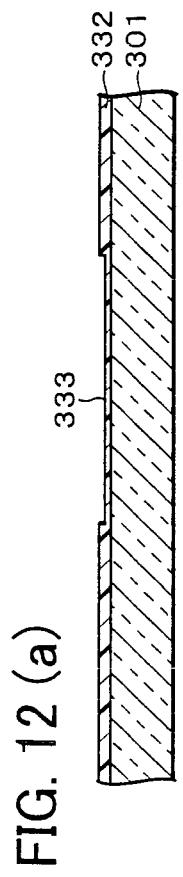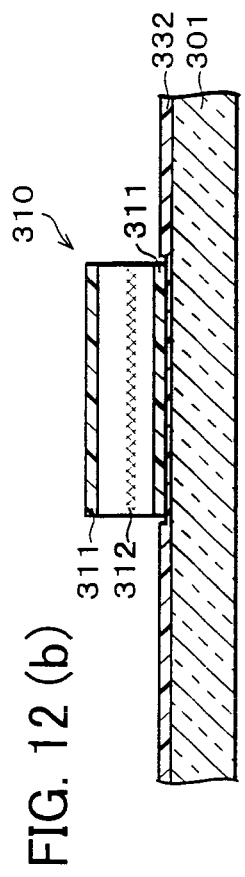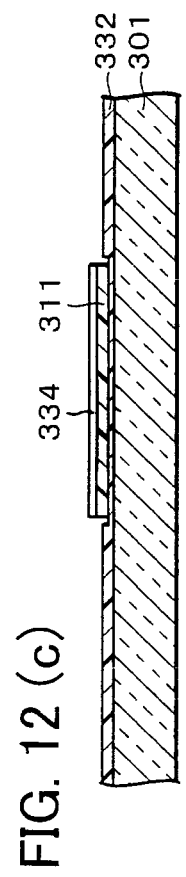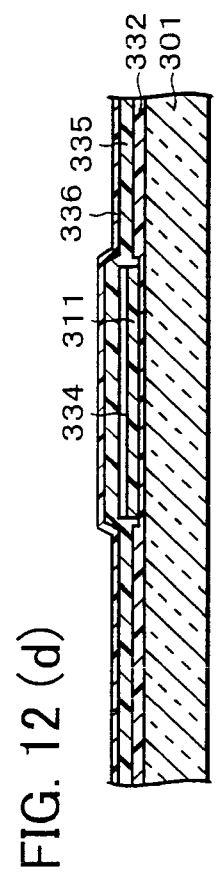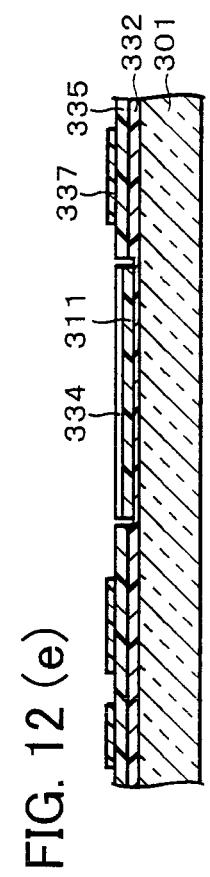
FIG. 12 (a)  FIG. 12 (b)  FIG. 12 (c)  FIG. 12 (d)  FIG. 12 (e)

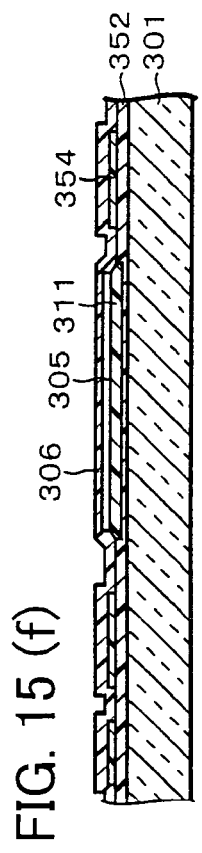
FIG. 15 (a)
FIG. 15 (b)
FIG. 15 (c)
FIG. 15 (d)
FIG. 15 (e)
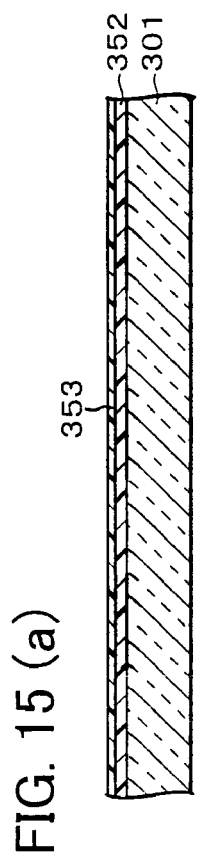
FIG. 15 (f)
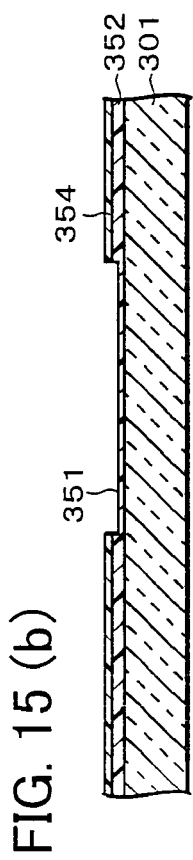
FIG. 15 (g)
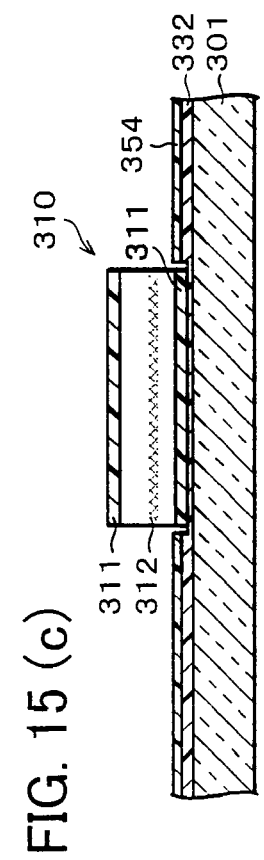
FIG. 15 (h)

SEMICONDUCTOR DEVICE AND MANUFACTURING METHOD THEREOF, SOI SUBSTRATE AND DISPLAY DEVICE USING THE SAME, AND MANUFACTURING METHOD OF THE SOI SUBSTRATE

This application is a Divisional of application Ser. No. 10/377,875, filed Mar. 4, 2003 now U.S. Pat. No. 7,119,365, the entire content of which is hereby incorporated herein by reference in this application.

FIELD OF THE INVENTION

The present invention relates to a semiconductor device and to a manufacturing method thereof, and particularly relates to a semiconductor device having an integrated circuit constituted of plural MOSs and to a manufacturing method thereof.

Further, the present invention relates to an SOI substrate constituted by (a) bonding a single crystal silicon thin film in which hydrogen ions have been implanted to a substrate and (b) dividing the single crystal silicon thin film at a hydrogen ion implantation portion, and the present invention further relates to a semiconductor device using the SOI substrate, and to a manufacturing method of the SOI substrate.

In addition, the present invention relates to a semiconductor device, used in an active matrix driving liquid crystal display device and the like, that improves circuit performance of a device in which peripheral driving circuits, a control circuit, and the like are integrated.

BACKGROUND OF THE INVENTION

Conventionally, so-called active matrix driving has been employed, and the active matrix driving is such that: thin film transistors (hereinbelow referred to as TFT) such as a-Si (amorphous Si) and p-Si (polycrystalline Si) are formed on a glass substrate, so as to drive a liquid crystal display panel, an organic EL panel, and the like. Further, by using the p-Si whose mobility is so high as to operate at a high speed, peripheral drivers have been integrated. Alternately, study has been performed with respect to forming of a device which utilizes higher-performance Si so as to integrate a system constituted of an image processor, a timing controller, and the like, that are required to have higher performance.

This is because the polycrystalline Si brings about the following problems: because of (a) a localized state in the band gap that is caused by incomplete crystallization, (b) deficiency in the vicinity of a crystal grain boundary, drop in the mobility that is caused by the presence of the localized state in the band gap, and (d) increase in an S coefficient (sub-threshold coefficient), performance of the transistor is too insufficient to form a high-performance device of Si.

Then, in order to form a higher-performance device of Si, not only laser crystallization, but also the following techniques have been proposed: a technique for improving crystallization, for example, further advanced techniques such as SLS (Sequential Lateral Solidification) and the like (for example, a specification of U.S. Pat. No. 6,300,175 (Publication date: Oct. 9, 2001), CLC (CW Laser Lateral Crystallization)(for example, A. Hara et al., "Ultra-high Performance Poly-Si TFTs on a Glass by a Stable Scanning CW Laser Lateral Crystallization", 2001 International Workshop on Active Matrix Liquid Crystal Displays—TFT Technologies and Related Materials—(AM-LCD2001), Digest of Technical Papers, p. 227-230, Jul. 11-13, 2001, Japan Society of Applied Physics). These techniques are to deposit an a-Si film on a glass substrate so as to control the crystallization in a preferable manner, or so as to realize single crystallization.

However, in these techniques using laser, a merely Si film is heated to a high temperature so as to perform crystal growth while keeping a temperature of an insulating substrate whose heat resistance is low like glass etc. Thus, generally, a tensile stress of approximately $10^9$ Pa is exerted on the Si film, so that there occur such problems: cracks appear in the film, reproducibility in the TFT property is deteriorated, non-uniformity is large, and the like.

While, there is a technique in which the single crystal Si is bonded to the insulating substrate so as to make the film thinner (for example, Japanese Laid-Open Patent Application No. 211128/1993 (Tokukaihei 5-211128)(Publication date: Aug. 20, 1993). With this technique, it is possible to form an oxide film on the single crystal Si substrate, and to form the single crystal Si thin film thereon. However, when the single crystal Si thin film is to be bonded to an insulating substrate other than the Si substrate, for example, a glass substrate or a quartz substrate, there occurs such problem that Si is stripped because of a thermal-expansion-coefficient difference between Si and the insulating substrate such as the quartz substrate.

In order to prevent the foregoing damage brought about in the thermal-bond-strength-improving process due to the thermal-expansion-coefficient difference between Si and the quartz substrate, there is proposed a method of changing composition of crystallized glass (for example, Japanese Laid-Open Patent Application No. 163363/1999 (Tokukaihei 11-163363) (Publication date: Jun. 18, 1999).

Further, as described above, conventionally, there have been brought about dramatic improvements in (a) an integrated circuit element technique such that: the single crystal silicon substrate is processed and hundreds of millions of transistors are formed on the substrate, and (b) a thin film transistor (TFT) liquid crystal display technique such that: after a polycrystal semiconductor thin film such as a silicon film is formed on an amorphous material such as a glass substrate, they are processed into a transistor, so as to make picture elements and drivers of a liquid crystal display, as well as popularization of computers and personal information terminals using liquid crystal displays.

In these techniques, the integrated circuit element is made by processing a commercial single crystal silicon wafer whose thickness is scant 1 mm and diameter ranges from 150 mm to 300 mm, and forming a large number of transistors on the processed single crystal silicon wafer. Further, in the TFT liquid crystal display, an amorphous silicon film on an amorphous nonalkali glass is fused/polycrystallized by heat of laser etc., and the amorphous silicon film is processed, so as to form a MOS type transistor which functions as a switching element.

In fields of the liquid crystal display and the organic EL display using the TFT, a TFT of an amorphous silicon film or a polysilicon film is formed on a transparent glass substrate, so as to form a device of silicon for driving the picture element, that is, for performing so-called active matrix driving. Further, in order to integrate the peripheral drivers, the timing controller, and the like as a system in terms of the active matrix driving, forming of a higher-performance device of silicon has been studied. This is because the polycrystalline Silicon film brings about the following problem: because of (a) a localized state in the band gap that is caused by incomplete crystal, (b) drop in the mobility, or (c) increase in a sub-threshold coefficient (S coefficient) that are brought about by the presence of the localized state in the band gap in the vicinity of a crystal grain boundary, performance of the transistor is too insufficient to form a high-performance device of silicon.

Then, attention is paid to an SOI technique. The SOI is the abbreviation of Silicon on Insulator, and is a technique for forming a single crystal semiconductor thin film on an insulating substrate (this technique is seldom used to form a polycrystalline Silicon film). The technique has been actively studied since around 1981. Further, the SOI substrate used in the field of the integrated circuit is to dramatically improve performance of the semiconductor element by using preferable transistors. Thus, as long as the substrate functions as an insulating film, it does not matter whether the substrate is transparent or not, or it does not matter whether the substrate is crystalline or amorphous. In this field, when the transistor is formed by using the SOI substrate, elements are completely separated, so that there is little restriction in operating, thereby obtaining preferable property as a transistor.

Now, as a representative of the SOI substrate, a SIMOX (Separation by Implantation of Oxygen) substrate is on sale. In the SOI substrate, oxygen is implanted into a silicon wafer, and the thus formed silicon oxide layer separates a single crystal silicon thin film from a bulk of the substrate. Thus, oxygen which is an element much heavier than hydrogen is implanted to a predetermined depth so that the implantation is performed at high energy and at high dose. Thus, crystals are severely damaged, so that there occur the following problems: it is impossible to obtain sufficient property of the single crystal, or it is impossible to obtain complete insulating property because of deviation from stoichiometry of a silicon dioxide film portion.

Then, Tokukaihei 5-211128 discloses a technique such that: the single crystal silicon is bonded to the substrate, and this is made to be a thin film. This prior art is called "smart cut process", and is such that: hydrogen ions are implanted into a single crystal silicon substrate in accordance with an ion implantation process, and the resultant is bonded to an enforcing member, and minute bubbles are brought about in a hydrogen ion implanted layer by a heating process, and the single crystal silicon substrate is divided at the hydrogen ion implanted layer, so as to form the single crystal silicon thin film, so that the SOI structure is realized. As a result, it is possible to manufacture a single crystal silicon transistor whose element property is high. From this view point, the technique is superior.

However, as to this prior art, Tokukaihei 5-211128 discloses merely that: the oxide film is formed on the single crystal silicon substrate, and the single crystal silicon thin film is formed thereon. The suitability for other substrates such as the glass substrate for display is not taken into consideration. Then, Tokukaihei 11-163363 mentions examples in which other substrates are compared in terms of the bonding suitability. In the prior art, it is recited that: crystallized glass is used to prevent the damages of the substrate in the heating process for improving the bond strength with respect to the substrate, and composition thereof is changed so as to correspond to the silicon piece in terms of the thermal expansion rate.

However, the crystallized glass typically contains alkali atoms, and has property contrary to a transistor whose property is stabilized. Further, in the foregoing techniques, the single crystal Si substrate is shaped in a wafer of 6, 8, and 12 inches in diameter, so that the insulating substrate which is to be bonded is limited to a substrate of 6, 8, and 12 inches. Thus, it is impossible to manufacture large size liquid crystal display panel and organic EL panel. In a case of a small size panel, the manufacturing cost becomes high, and it is difficult to use the technique in practice.

Moreover, in a case of using a quartz substrate, when the single crystal Si substrate is bonded to the insulating substrate, the bond strength drops because of the thermal expansion rate difference. Further, in a case where a stress is exerted on a bonded interface, the TFT property is deteriorated because of differences and non-uniformity in the stress exerted on the interface.

Further, in the prior art, it is considered that: when the single crystal silicon substrate is bonded, it is impossible to obtain the sufficient bond strength unless exposed in a high temperature. Thus, a temperature for performing the heating process is 800° C. to 1200° C. It is considered that a high-heat-resistant crystallized glass whose strain point is not less than 750° C. is suitable, so that there occurs the following problem: the technique cannot be applied to a high-strain-point nonalkali glass, typically used in a liquid crystal panel of the active matrix driving, whose strain point is not more than 700° C.

SUMMARY OF THE INVENTION

An object of the present invention is to provide (a) a semiconductor device, having no non-uniformity or differences in a bond strength of the single crystal Si thin film or a stress exerted on a bonded interface, which is constituted of a large size and inexpensive substrate in which a single crystal Si thin film is provided and its property is stabilized, and (b) a manufacturing method of such a semiconductor device.

Another object of the present invention is to provide a semiconductor device constituted of a large size and inexpensive substrate in which a single crystal Si thin film is provided and its property is stabilized.

Still another object of the present invention is to provide (a) an SOI substrate which can be manufactured without using a crystallized glass whose composition has been adjusted or a high heat resistant glass at low cost, (b) a display device using such SOI substrate, and (c) a manufacturing method of such SOI substrate.

In order to achieve the foregoing objects, the semiconductor device of the present invention includes a polycrystalline Si thin film and a single crystal Si thin film are respectively provided on different areas of an insulating substrate.

With the foregoing configuration, the polycrystalline Si thin film and the single crystal Si thin film are respectively provided on different areas of the insulating substrate such as a large size glass substrate. The single crystal Si solves the following problems: (a) a localized state in the band gap that is caused by incomplete crystallization, (b) deficiency in the vicinity of a crystal grain boundary, (c) drop in mobility that is caused by the presence of the localized state in the band gap, and (d) increase in an S coefficient (sub-threshold coefficient) etc., peculiar to the polycrystalline Si, all of which make it difficult to form a high performance device. Thus, it is possible to make an arrangement such that: a device of higher performance, such as a timing controller, is formed in an area where the single crystal Si thin film is formed, and other devices are formed in an area where the polycrystalline Si thin film is formed.

That is, even when a size of the single crystal Si thin film is limited, the size may be sufficient as long as it is possible to form a high speed logic, a timing generator, a high speed DAC (with current buffer), and the like, that are required to realize a high speed, low power consumption, and little non-uniformity, that are enabled by the single crystal Si. Thus, it is possible to integrate a high performance and well-functioning circuit system, which can be realized only by the single crystal Si, on a substrate, so that it is possible to manufacture a semiconductor device used in a display device such as a liquid crystal panel or an organic EL panel in which a high performance system is integrated at much lower cost compared with a case where all devices are constituted of the single crystal Si.

Further, a substrate shape of the single crystal Si is limited to wafer sizes of an LSI manufacturing equipment, such as 6, 8, and 12 inches in diameter, but the polycrystalline Si thin film is formed on the substrate, so that it is possible to manufacture a large size liquid crystal panel or an organic EL panel for example.

Further, in order to achieve the foregoing object, the method of the present invention for manufacturing the semiconductor device, including a polycrystalline Si thin film and a single crystal Si thin film that are provided on an insulating substrate, includes the steps of: depositing an $SiO_2$ film and an amorphous Si film sequentially on a surface of the insulating substrate; growing a polycrystalline Si layer, by thermally crystallizing the amorphous Si film, so as to form the polycrystalline Si thin film; removing a predetermined area of the polycrystalline Si layer by etching; cutting a single crystal Si substrate into a predetermined shape so as to partially or substantially entirely cover the predetermined area that has been subjected to the etching, said single crystal Si substrate having a surface which has been oxidized or on which an $SiO_2$ film has been deposited, and having a hydrogen ion implantation portion in which hydrogen ions of a predetermined dose have been implanted to a predetermined depth; bonding a hydrogen ion implanted surface of the single crystal Si substrate that has been cut into the predetermined shape to the predetermined area that has been subjected to the etching; and dividing the single crystal Si substrate at the hydrogen ion implantation portion in an exfoliating manner by performing a heating process, so as to form the single crystal Si thin film.

With the foregoing configuration, it is possible to enforce the bond strength by heating the single crystal Si substrate in which the hydrogen ions of the predetermined dose are implanted to the predetermined depth, that is, by heating the single crystal Si substrate having the hydrogen ion implantation portion in which the hydrogen ions have been implanted in advance, and it is possible to obtain the single crystal Si thin film by dividing the single crystal Si substrate at the hydrogen ion implantation portion in an exfoliating manner. Thus, the single crystal Si solves the following problems: (a) a localized state in the band gap caused by incomplete crystallization, (b) deficiency in the vicinity of a crystal grain boundary, (c) drop in mobility that is caused by the presence of the localized state in the band gap, and (d) increase in an S coefficient etc., peculiar to the polycrystalline Si, all of which make it difficult to manufacture a high performance device. Therefore, it is possible to form the single crystal Si thin film and the polycrystalline Si thin film on the insulating substrate, so that devices required to have higher performance can be constituted of the single crystal Si and other devices can be constituted of the polycrystalline Si in accordance with a common manufacturing process after forming the single crystal Si thin film and the polycrystalline Si thin film. Thus, it is possible to manufacture the semiconductor device for a display device etc. such as a liquid crystal panel or an organic EL panel, in which a high performance system is integrated, at low cost.

Further, the oxide layer or the $SiO_2$ film is formed in advance, and the single crystal Si substrate is bonded to the insulating substrate such as a glass substrate via the formed oxide layer or $SiO_2$ film, so that it is possible to prevent the following problems: (a) drop in the mobility that is brought about by distortion of the Si crystal caused by a stress exerted on a bonded Si interface, or (b) deficiency in the interface, and an interface fixed charge that is brought about with the deficiency, and (c) a threshold shift that is brought about by a localized state in the interface, and (d) drop in the characteristics stability. Thus, it is not necessary to use a crystallized glass whose composition has been adjusted so as to prevent damages caused by thermal expansion rate difference with respect to a glass substrate when the bond strength is improved and the exfoliation is performed by heat treatment, so that a high-strain-point glass can be used. Thus, there is not such a problem that the crystallized glass is contaminated with the alkali metal, so that it is possible to prevent the damages caused by thermal expansion rate difference with respect to a glass substrate when the bond strength is improved and the exfoliation is performed by heat treatment.

Further, for example, the polycrystalline Si film is formed on a large-area high-strain-point glass substrate, and etching removal is performed with respect to the polycrystalline Si thin film so as to cover an area that is to be bonded to the single crystal Si substrate processed into an appropriate size.

Further, the single crystal Si substrate is bonded to the area, and the single crystal Si thin film and the $SiO_2$ film are left by exfoliation. Other single crystal Si is removed by exfoliation, so that it is possible to prevent the bias of the stress entirely exerted on the glass substrate by performing exfoliation removal with respect to other single crystal Si.

That is, a surface of the area is oxidized or an $SiO_2$ film is deposited on the surface, and the single crystal Si substrate, having the hydrogen ion implantation portion, that has been cut into a predetermined shape so as to partially or substantially entirely cover the area having been subjected to the etching removal, is bonded to the area having been subjected to the etching removal so that a surface close to the hydrogen ion implantation portion is in contact with the area, and the single crystal Si substrate is subjected to a heating process, and the single crystal Si substrate is divided at the hydrogen ion implantation portion in an exfoliating manner, so that the single crystal Si thin film and the $SiO_2$ film are left, and other single crystal Si is removed by exfoliation, so that it is possible to prevent the bias of the stress entirely exerted on the glass substrate.

Thus, it is possible to obtain the substrate, in which an area is constituted of the single crystal Si thin film and other area is constituted of the polycrystalline Si thin film, without bringing about stripping, cracking, and damages of the Si.

Further, a shape of the single crystal Si substrate is limited to wafer sizes of an LSI manufacturing equipment, such as 6, 8, and 12 inch disks, but also the polycrystalline Si thin film is formed on the insulating substrate, so that it is possible to manufacture the semiconductor device such as a large size liquid crystal display panel and an organic EL panel.

Further, in order to achieve the foregoing object, the method of the present invention for manufacturing the semiconductor device, including a polycrystalline Si thin film and a single crystal Si thin film that are provided on an insulating substrate, includes the steps of: depositing an $SiO_2$ film and an amorphous Si film sequentially on a surface of the insulating substrate; growing a polycrystalline Si layer, by thermally crystallizing the amorphous Si film, so as to form the polycrystalline Si thin film; removing a predetermined area of the polycrystalline Si layer by etching, and removing a part of the $SiO_2$ film, that corresponds to the predetermined area, in a direction of thickness of the $SiO_2$ film by etching; cutting a single crystal Si substrate into a predetermined shape so as to partially or substantially entirely cover the predetermined area that has been subjected to the etching, said single crystal Si substrate having a surface which has been oxidized or on which an SiO$_2$ film has been deposited, and having a hydrogen ion implantation portion in which hydrogen ions of a predetermined dose have been implanted to a predetermined depth; bonding a hydrogen ion implantation surface (surface of ion implanted side) of the single crystal Si substrate that has been cut into the predetermined shape to the predetermined area that has been subjected to the etching at a room temperature; and dividing the single crystal Si substrate at the hydrogen ion implantation portion in a cleaving manner by performing a heating process, so as to form the single crystal Si thin film.

With the foregoing configuration, in addition to advantages of the foregoing manufacturing method, the predetermined area of the polycrystalline Si layer is removed by etching, and a part of the SiO$_2$ film of the same area is removed in a direction of thickness of the SiO$_2$ film by etching, so that it is possible to obtain a substrate such that: a bonded surface of the single crystal Si substrate is free from the influence exerted by a thickness of the SiO$_2$ film, and the single crystal Si thin film and the polycrystalline Si thin film formed on the insulating substrate are substantially equal to each other in terms of a height. As a result, it is possible to perform almost all the following processes including the step of etching performed to form the island shape. Further, the foregoing method enables forming of a transistor or a circuit in which a large step is not brought about. Thus, in case of a liquid crystal panel for example, it is possible to obtain an advantage in controlling a cell thickness.

Further, in order to achieve the foregoing object, the method of the present invention for manufacturing the semiconductor device, including a polycrystalline Si thin film and a single crystal Si thin film that are provided on an insulating substrate, includes the steps of: depositing an SiO$_2$ film on a surface of the insulating substrate; removing a part of the SiO$_2$ film, that corresponds to the predetermined area, in a direction of thickness of the SiO$_2$ film by etching; cutting a single crystal Si substrate into a predetermined shape so as to partially or substantially entirely cover the predetermined area that has been subjected to the etching, said single crystal Si substrate having a surface which has been oxidized or on which an SiO$_2$ film has been deposited, and having a hydrogen ion implantation portion in which hydrogen ions of a predetermined dose have been implanted to a predetermined depth; bonding a surface of hydrogen ion implanted side of the single crystal Si substrate that has been cut into the predetermined shape to the predetermined area that has been subjected to the etching at a room temperature; and dividing the single crystal Si substrate at the hydrogen ion implantation portion in an exfoliating manner by performing a heating process, so as to form the single crystal Si thin film on the insulating substrate; depositing a second SiO$_2$ film and an amorphous Si film sequentially on a surface of the insulating substrate; and growing a polycrystalline Si layer, by thermally crystallizing the amorphous Si film, so as to form the polycrystalline Si thin film.

With the foregoing configuration, it is possible to obtain the same advantage as in the foregoing manufacturing methods.

Further, in order to achieve the foregoing object, an SOI substrate of the present invention includes: an amorphous nonalkali glass substrate; and a single crystal silicon piece in which hydrogen ions have been implanted, and the single crystal silicon piece is bonded to the amorphous nonalkali glass substrate, wherein the single crystal silicon piece is divided at a hydrogen ion implantation portion in which the hydrogen ions have been implanted, so as to form a single crystal silicon thin film.

With the foregoing configuration, hydrogen ions are implanted to the single crystal silicon piece in accordance with an ion implantation process, and hydrogen embrittlement is brought about by the heating process in the layer in which the hydrogen ions have been implanted, and the single crystal silicon thin film is formed by dividing the single crystal silicon piece at the layer (in accordance with a so-called smart cut process), and the single crystal silicon thin film is bonded to the substrate, so as to form the SOI substrate. As to the SOI substrate, the present inventors paid attention to the following fact: the SOI substrate is such that it is possible to obtain the sufficient bond strength even at 300° C. upon bonding the single crystal silicon piece to the substrate. Thus, it is possible to set a heating temperature for improving the bond strength to be lower compared with a conventional method, so that it is possible to use an amorphous nonalkali glass substrate whose strain point is not more than 700° C.

The present inventors studied the foregoing point repeatedly, and found that: in a case where hydrogen ions much lighter than oxygen ions in terms of a mass are implanted so as to divide the single crystal silicon piece into the single crystal silicon thin film, approximately 600° C. is sufficient as the heating temperature upon manufacturing the element. By heat treatment at a temperature or temperatures above the hydrogen dissociation temperature from Si, single crystal silicon is separated to form single crystal silicon film, and it is possible to restore a crystalline material of the single crystal silicon thin film to a level, at which the hydrogen ions have not been implanted, so as to perform a process for suppressing the deterioration of the crystalline material at the same time. Thus, by performing the heating process at approximately 600° C., it is possible to improve the bond strength between the single crystal silicon piece and the substrate as well as the separation and the improvement of the crystalline material.

That is, as to the SOI substrate manufactured by bonding the single crystal silicon thin film obtained by the so-called smart cut process with the substrate, when the single crystal silicon piece is bonded to the substrate, it is possible to obtain the sufficient bond strength even at approximately above 300° C. From this view point, the single crystal silicon piece is bonded to the substrate and the thin film is separated at approximately 600° C. by using the amorphous nonalkali glass substrate.

Thus, it is not necessary to use a crystallized glass or a high heat resistance glass whose composition has been adjusted, so that it is possible to manufacture the SOI substrate at low cost using a high-strain-point nonalkali glass generally used in a liquid crystal display panel etc. based on active matrix driving. Further, since the heating temperature is low, it is possible to prevent the alkaline metal from dispersing into the semiconductor layer. Thus, since the alkaline metal is prevented from dispersing, it is possible to make a thickness of an oxide film formed on the side of the single crystal silicon piece or a silicon dioxide film formed on the side of the substrate thinner, so that it is possible to improve the throughput.

Note that, in the present invention, a substrate, containing SOI, in which the single crystal silicon piece is bonded to a part of a large area glass substrate, may be used as the SOI substrate.

Further, in order to achieve the foregoing object, the display device of the present invention is arranged so that the amorphous nonalkali glass substrate uses any one of the foregoing SOI substrates made of an amorphous glass which allows transmittance of visible light.

With the foregoing configuration, the SOI substrate is made of the amorphous glass which allows the transmittance of the visible light, and a transistor and a separately formed polycrystalline Silicon film are provided on the single crystal silicon thin film, so that it is possible to arrange a liquid crystal display device or an organic EL display device.

Thus, it is possible to form a high performance transistor on a specific portion of a large area substrate of the display device.

Further, in order to achieve the foregoing object, the method of the present invention for manufacturing the SOI substrate includes the steps of: bonding a single crystal silicon piece, in which hydrogen ions have been implanted, to an amorphous nonalkali glass substrate; and dividing said single crystal silicon piece at a hydrogen ion implantation portion by performing a heating process at a maximum of 600° C., so as to form a single crystal silicon thin film.

With the foregoing configuration, as to the manufacturing method of the SOI substrate manufactured by bonding the single crystal silicon thin film that has been obtained by the smart cut process etc. to the substrate, the present inventors paid attention to a fact that it is possible to obtain the sufficient bond strength even at 300° C. upon bonding the single crystal silicon piece to the substrate, so that they think it preferable to set the maximum temperature for the heating process to approximately 600° C. at which the single crystal silicon piece is divided, for example, the heating process is performed at 600° C. for 30 to 60 minutes.

Thus, it is not necessary to use a crystallized glass whose composition has been adjusted or a high heat resistance glass, so that it is possible to manufacture the SOI substrate at low cost by using a high-strain-point nonalkali glass generally used in a liquid crystal display panel etc. based on active matrix driving. Further, the heating process temperature is low, so that it is possible to prevent the alkali metal from dispersing into the semiconductor layer. Thus, the alkaline metal is prevented from dispersing, so that the oxide film formed on the side of the single crystal silicon piece and the silicon dioxide film formed on the side of the substrate can be made thinner. As a result, it is possible to improve the throughput.

Further, in order to achieve the foregoing object, the method of the present invention for manufacturing the SOI substrate includes the steps of: bonding a single crystal silicon piece, in which hydrogen ions have been implanted, to an amorphous nonalkali glass substrate; and dividing said single crystal silicon piece at a hydrogen ion implantation portion by performing a heating process in accordance with lamp anneal including a peak temperature of not less than 850° C., so as to form a single crystal silicon thin film.

With the foregoing configuration, as to the manufacturing method of the SOI substrate manufactured by bonding the single crystal silicon thin film that has been obtained by the smart cut process etc. to the substrate, the present inventors paid attention to a fact that it is possible to obtain the sufficient bond strength even at a maximum of 600° C. upon bonding the single crystal silicon piece to the substrate, so that they think it preferable that the heating process is performed in accordance with the lamp anneal including a peak temperature of approximately 700° C.

Thus, it is not necessary to use a crystallized glass whose composition has been adjusted or a high heat resistance glass, so that it is possible to manufacture the SOI substrate at low cost by using a high-strain-point nonalkali glass generally used in a liquid crystal display panel etc. based on active matrix driving. Further, the heating process temperature is low, so that it is possible to prevent the alkali metal from dispersing into the semiconductor layer. Thus, the alkaline metal is prevented from dispersing, so that the oxide film formed on the side of the single crystal silicon piece and the silicon dioxide film formed on the side of the substrate can be made thinner. As a result, it is possible to improve the throughput.

Further, the shrinkage of the glass substrate occurs upon heating in an electric furnace when the glass substrate is heated above the strain point. On the other hand, rapid thermal anneal (hereinbelow referred to as RTA) using lamp etc. or heating anneal using laser (laser anneal) prevents the shrinkage of the entire substrate, and causes an annealed portion to be heated, thereby improving the crystallization or the separating efficiency. Furthermore, it is possible to improve the throughput upon manufacturing the SOI substrate.

Note that, as the peak temperature of the lamp anneal is higher, the characteristics of the transistor are further improved, but the substrate largely bends, and largely expands and contracts, so that it is preferable to set an appropriate temperature and an appropriate holding time according to the substrate size and a type of a formed device. For example, as to a substrate of 300 to 400 mm, the heating process is performed at 700° C. for about 5 minutes.

Further, in order to achieve the foregoing object, the method of the present invention for manufacturing the SOI substrate includes the steps of: depositing a silicon dioxide film and an amorphous silicon film sequentially on a surface of the amorphous nonalkali glass substrate; growing a polycrystalline Silicon layer, by thermally crystallizing the amorphous silicon film, so as to form the polycrystalline Silicon thin film; removing a predetermined area of the polycrystalline Silicon layer by etching, and removing a part of the silicon dioxide film, that corresponds to the predetermined area, in a direction of thickness of the silicon dioxide film by etching; oxidizing a surface of the single crystal silicon piece or depositing a silicon dioxide film on the surface of the single crystal silicon piece, and implanting the hydrogen ions in the single crystal silicon piece; cutting the single crystal silicon piece, in which the hydrogen ions have been implanted, into a shape so as to cover the predetermined area that has been subjected to the etching; bonding a hydrogen ion implantation surface of the single crystal silicon piece that has been cut into the predetermined shape to the predetermined area that has been subjected to the etching; and dividing the single crystal silicon piece in accordance with hydrogen embrittlement caused by the heating process, so as to form the single crystal silicon thin film on the insulating substrate.

With the foregoing configuration, when manufacturing the SOI substrate in which the transistor is formed not only on the single crystal silicon thin film bonded in the foregoing manner but also on the polycrystalline Silicon thin film deposited by CVD etc., the etching removal is performed with respect to the polycrystalline Silicon layer in the predetermined area of the bonded area, and a part of the silicon dioxide film in the same area is subjected to the etching removal in a direction of thickness of the silicon dioxide, before bonding the single crystal silicon piece.

Thus, it is possible to obtain the SOI substrate in which a height of the bonded single crystal silicon thin film area and a height of the polycrystalline Silicon thin film area are substantially equal to each other. As a result, it is possible to perform substantially all the steps thereafter, including the etching for forming the island shape, with respect to both the single crystal silicon thin film area and the polycrystal thin film area at the same time. Further, the transistor or the circuit having small step is formed, so that this is advantageous in controlling the cell thickness in a case of a liquid crystal panel for example.

Further, in order to achieve the foregoing object, the semiconductor device of the present invention includes a polycrystalline Si thin film and a single crystal Si thin film, that are respectively provided on different areas of an insulating substrate, wherein a difference between the insulating substrate and the single crystal Si thin film in terms of a difference of total linear expansion (normalized) is approximately not more than 250 ppm for temperature range from room temperature to 600° C.

Generally, the single crystal Si constitutes the semiconductor thin film used as an activating layer, so that it is possible to solve the following problems: (a) a localized state in the band gap that is caused by incomplete crystallization, (b) deficiency in the vicinity of a crystal grain boundary, (c) drop in mobility that is caused by the presence of the localized state in the band gap, and (d) increase in an S coefficient (sub-threshold coefficient) etc., all of which make it difficult to manufacture a high performance equipment.

Then, with the foregoing configuration, the polycrystalline Si thin film and the single crystal Si thin film are formed on the different areas of a large size glass substrate etc. Thus, devices required to have higher performance, for example, a timing controller, a microprocessor, and the like, can be formed on an area where the single crystal Si thin film has been formed, and other devices can be formed on an area where the polycrystalline Si thin film has been formed.

That is, even when a size of the single crystal Si thin film is limited, the size may be sufficient as long as it is possible to form a high speed logic, a timing generator, a high speed DAC (with current buffer), and the like, that are required to realize a high speed, low power consumption, and little non-uniformity, that are enabled by the single crystal Si. Thus, it is possible to integrate a high performance and well-functioning circuit system, which can be realized only by the single crystal Si, on a substrate, so that it is possible to manufacture a semiconductor device used in a display device such as a liquid crystal panel or an organic EL panel in which a high performance system is integrated at much lower cost compared with a case where all devices are constituted of the single crystal Si.

Further, a substrate shape of the single crystal Si is limited to wafer sizes of an LSI manufacturing equipment, such as 6, 8, and 12 inches in diameter, but the polycrystalline Si thin film is formed on the substrate, so that it is possible to manufacture a large size liquid crystal panel or an organic EL panel for example.

Further, it is not necessary to use a crystallized glass whose composition has been adjusted so as to prevent damages caused by thermal expansion rate difference with respect to a substrate when the bond strength is improved by heat treatment. Thus, there is not such a problem that the crystallized glass is contaminated with the alkaline metal, so that it is possible to prevent the damages caused by thermal expansion rate difference with respect to a substrate when the bond strength is improved by heat treatment.

Further, a difference between the insulating substrate and the single crystal Si thin film in terms of a difference of total linear expansion is not more than approximately 250 ppm for temperature range from room temperature to 600° C., so that the stress exerted on the insulating substrate and the single crystal Si thin film becomes small. Thus, in the step of forming the single crystal Si thin film on the insulating substrate, it is possible to prevent (a) damages and exfoliation of the bonded surface that are brought about by the difference in terms of the thermal expansion coefficient when the single crystal Si thin film is divided at a hydrogen ion implantation portion in a cleaving manner, or (b) deficiency in the crystal.

Further, it is possible to improve the thermal bond strength. Note that, the thermal expansion is variation in the length thereof caused by the temperature variation.

Further, in order to achieve the foregoing object, the semiconductor device of the present invention includes a polycrystalline Si thin film and a single crystal Si thin film that are respectively provided on different areas of an insulating substrate, wherein a position of Raman shift peak is within $520.5 \pm 1.0$ cm$^{-1}$.

With the foregoing configuration, the polycrystalline Si thin film and the single crystal Si thin film are respectively provided on the different areas. Thus, devices required to have higher performance, for example, a timing controller, a microprocessor, and the like, can be formed on an area where the single crystal Si thin film has been formed, and other devices can be formed on an area where the polycrystalline Si thin film has been formed.

It is general that large stress remains in the Si thin film in a case where crystallization or crystal growth is performed by using laser.

With the foregoing configuration, it is possible to substantially vanish the stress exerted on the Si interface of the single crystal Si thin film, so that the position of Raman shift peak is within $520.5 \pm 1.0$ cm$^{-1}$. Thus, in case of forming a TFT, it is possible to prevent the following problems: (a) drop and non-uniformity in the characteristics that are brought about by stress of the Si crystal that is caused by a stress exerted on an Si interface, or (b) deficiency in the interface, and (c) an interface fixed charge brought about with the deficiency, and (d) a threshold shift or non-uniformity brought about by a localized state in the interface, and (e) drop in the property stability.

That is, devices required to have higher performance, for example, a timing controller, a microprocessor, and the like, can be formed on an area where the single crystal Si thin film has been formed, and other devices can be formed on an area where the polycrystalline Si thin film has been formed.

Further, in order to achieve the foregoing object, the method of the present invention for manufacturing the semiconductor device, including a polycrystalline Si thin film and a single crystal Si thin film that are provided on an insulating substrate, includes the steps of: depositing an SiO$_2$ film and an amorphous Si film sequentially on a surface of the insulating substrate; growing a polycrystalline Si layer, by thermally crystallizing the amorphous Si film, so as to form the polycrystalline Si thin film; removing a predetermined area of the polycrystalline Si layer by etching; cutting a single crystal Si substrate into a predetermined shape so as to partially or substantially entirely cover the predetermined area that has been subjected to the etching, said single crystal Si substrate having a surface which has been oxidized or on which an SiO$_2$ film has been deposited, and having a hydrogen ion implantation portion in which hydrogen ions of a predetermined dose have been implanted to a predetermined depth; cleaning the insulating substrate and the single crystal Si substrate so as to activate surfaces of both the substrates; bonding a hydrogen ion implantation surface of the single crystal Si substrate that has been cut into the predetermined shape to the predetermined area that has been subjected to the etching at a room temperature; and dividing the single crystal Si substrate at the hydrogen ion implantation portion in a cleaving manner by performing a heating process, so as to form the single crystal Si thin film on the insulating substrate.

With the foregoing configuration, by heating the single crystal Si substrate in which hydrogen ions of predetermined dose have been implanted to a predetermined depth, it is possible to improve the bond strength, and by dividing the single crystal Si substrate at the hydrogen ion implantation portion in an exfoliating manner, it is possible to obtain the single crystal Si thin film. Thus, it is possible to solve the following problems: (a) a localized state in the band gap that is caused by incomplete crystallization, (b) deficiency in the vicinity of a crystal grain boundary, (c) drop in mobility caused by the presence of the localized state in the band gap, and (d) increase in an S coefficient (sub-threshold coefficient) etc., all of which make it difficult to manufacture a high performance device. Therefore, it is possible to form the single crystal Si thin film and the polycrystalline Si thin film on the insulating substrate, and steps thereafter are performed as common manufacturing processes, so that devices required to have higher performance can be constituted of the single crystal Si, and other devices can be constituted of the polycrystalline Si. Thus, it is possible to manufacture a semiconductor device used in a display device such as a liquid crystal panel or an organic EL panel, in which a high performance system is integrated, at low cost.

Further, the $SiO_2$ film is formed in advance, and the single crystal Si substrate is bonded with the insulating substrate such as a glass substrate via the $SiO_2$ film, so that it is possible to prevent the following problems: (a) drop in the mobility that is brought about by distortion of the Si crystal that is caused by a stress exerted on an Si interface, or (b) deficiency in the interface, and (c) an interface fixed charge brought about in combination with the deficiency, or (d) a threshold shift brought about by a localized state in the interface, or (e) drop in the property stability. Thus, it is not necessary to use a crystallized glass whose composition has been adjusted so as to prevent damages caused by thermal expansion rate difference with respect to a substrate when the bond strength is improved by heat treatment and the exfoliation is performed, so that it is possible to use the high-strain-point glass. Thus, there is not such a problem that the crystallized glass is contaminated with the alkaline metal, so that it is possible to prevent the damages caused by thermal expansion rate difference with respect to a substrate when the bond strength is improved by heat treatment and the exfoliation is performed.

Moreover, the polycrystalline Si film is formed on a large area high-strain-point glass substrate, and the polycrystalline Si thin film is subjected to etching removal so as to cover an area with which the single crystal Si substrate having been cut into an appropriate size should be bonded, and the single crystal Si substrate is bonded with the area, and the single crystal Si thin film and the $SiO_2$ film are left by exfoliation, and other single crystal Si is removed by exfoliation, so that it is possible to prevent the stress from being biased in the entire glass substrate. Thus, it is possible to obtain a substrate, in which a part is constituted of the single crystal Si thin film and other parts are constituted of the polycrystalline Si thin film, without bring about stripping, cracks, or damages of Si.

Further, a substrate shape of the single crystal Si is limited to wafer sizes of an LSI manufacturing equipment, such as 6, 8, and 12 inches in diameter, but the polycrystalline Si thin film is formed on the substrate, so that it is possible to manufacture a large size liquid crystal panel or an organic EL panel for example.

Further, the single crystal Si substrate is bonded to an insulating substrate 1 via the $SiO_2$ film at a room temperature, so that it is possible to substantially vanish the stress exerted on the bonded Si interface. Thus, it is possible to prevent the following problems: (a) drop and non-uniformity in the mobility that is brought about by distortion of the Si crystal that is caused by a stress exerted on an Si interface, or (b) deficiency in the interface, and (c) an interface fixed charge brought about in combination with the deficiency, and (d) a threshold shift brought about by a localized state in the interface, and (e) drop in the property stability.

Further, in order to achieve the foregoing object, the method of the present invention for manufacturing the semiconductor device, including a polycrystalline Si thin film and a single crystal Si thin film that are provided on an insulating substrate, includes the steps of: depositing an $SiO_2$ film and an amorphous Si film sequentially on a surface of the insulating substrate; growing a polycrystalline Si layer, by thermally crystallizing the amorphous Si film, so as to form the polycrystalline Si thin film; removing a predetermined area of the polycrystalline Si thin film by etching, and removing a part of the $SiO_2$ film, that corresponds to the predetermined area, in a direction of thickness of the $SiO_2$ film by etching; cutting a single crystal Si substrate into a predetermined shape so as to partially or substantially entirely cover the predetermined area that has been subjected to the etching, said single crystal Si substrate having a surface which has been oxidized or on which an $SiO_2$ film has been deposited, and having a hydrogen ion implantation portion in which hydrogen ions of a predetermined dose have been implanted to a predetermined depth; cleaning the insulating substrate and the single crystal Si substrate so as to activate surfaces of both the substrates; bonding a hydrogen ion implantation surface of the single crystal Si substrate that has been cut into the predetermined shape to the predetermined area that has been subjected to the etching at a room temperature; and dividing the single crystal Si substrate at the hydrogen ion implantation portion in a cleaving manner by performing a heating process, so as to form the single crystal Si thin film on the insulating substrate.

With the foregoing configuration, besides the advantages of the foregoing manufacturing method, a predetermined area of the polycrystalline Si thin film is removed by etching, and a part of the $SiO_2$ film in the predetermined area is removed in a direction of thickness of the $SiO_2$ film by etching, so that it is possible to obtain a substrate such that: a bonded surface of the single crystal Si substrate is free from the influence exerted by a thickness of the $SiO_2$ film, and the single crystal Si thin film and the polycrystalline Si thin film formed on the insulating substrate are substantially equal to each other in terms of a height. As a result, it is possible to perform almost all the following processes including the step of etching performed to form the island shape. Further, the foregoing method enables forming of a transistor or a circuit in which a large step is not brought about. Thus, in case of a liquid crystal panel for example, it is possible to obtain an advantage in controlling a cell thickness.

Further, in order to achieve the foregoing object, the method of the present invention for manufacturing the semiconductor device, including a polycrystalline Si thin film and a single crystal Si thin film that are provided on an insulating substrate, includes the steps of: depositing an $SiO_2$ film on a surface of the insulating substrate; cutting a single crystal Si substrate into a predetermined shape, said single crystal Si substrate having a surface which has been oxidized or on which an $SiO_2$ film has been deposited, and having a hydrogen ion implantation portion in which hydrogen ions of a predetermined dose have been implanted to a predetermined depth; cleaning the insulating substrate and the single crystal Si substrate so as to activate surfaces of both the substrates; bonding a hydrogen ion implantation surface of the single crystal Si substrate that has been cut into the predetermined shape to the predetermined area at a room temperature; dividing the single crystal Si substrate at the hydrogen ion implantation portion in a cleaving manner by performing a heating process, so as to form the single crystal Si thin film on the insulating substrate; depositing an insulating film and an amorphous Si film sequentially on a surface of the insulating substrate; and growing a polycrystalline Si layer, by heating the amorphous Si film, so as to form the polycrystalline Si thin film.

With the foregoing configuration, it is possible to obtain advantages similar to those of the foregoing manufacturing methods.

Further, in order to achieve the foregoing object, the method of the present invention for manufacturing the semiconductor device, including a polycrystalline Si thin film and a single crystal Si thin film that are provided on an insulating substrate, includes the steps of: depositing an $SiO_2$ film on a surface of the insulating substrate; removing partially a predetermined area of the $SiO_2$ film in a direction of thickness of the $SiO_2$ film by etching; cutting a single crystal Si substrate into a predetermined shape so as to partially or substantially entirely cover the predetermined area that has been subjected to the etching, said single crystal Si substrate having a surface which has been oxidized or on which an $SiO_2$ film has been deposited, and having a hydrogen ion implantation portion in which hydrogen ions of a predetermined dose have been implanted to a predetermined depth; cleaning the insulating substrate and the single crystal Si substrate so as to activate surfaces of both the substrates; bonding a hydrogen ion implantation surface of the single crystal Si substrate that has been cut into the predetermined shape to the predetermined area that has been subjected to the etching at a room temperature; dividing the single crystal Si substrate at the hydrogen ion implantation portion in a cleaving manner by performing a heating process, so as to form the single crystal Si thin film; depositing an insulating film and an amorphous Si film sequentially on a surface of the insulating substrate; and growing a polycrystalline Si layer, by heating the amorphous Si film, so as to form the polycrystalline Si thin film.

With the foregoing configuration, it is possible to obtain advantages similar to those of the foregoing manufacturing methods.

Further, in order to achieve the foregoing object, the method of the present invention for manufacturing the semiconductor device, including a polycrystalline Si thin film and a single crystal Si thin film that are provided on an insulating substrate, includes the steps of: depositing sequentially a first $SiO_2$ film, an amorphous Si film, and a second $SiO_2$ film, on a surface of the insulating substrate; removing a predetermined area of the second $SiO_2$ film by etching so as to expose a part of the amorphous Si film; forming a very thin oxide (several nm) by oxidizing the amorphous Si film, that has been exposed, so as to spin-coat the oxide film with Ni acetate aqueous solution; growing a polycrystalline Si layer, in which crystal growth has been promoted in accordance with metal assist, by heating the amorphous Si film, so as to form the polycrystalline Si thin film; removing the second $SiO_2$ film and the oxide film; removing a predetermined area of the polycrystalline Si layer by etching; cutting a single crystal Si substrate into a predetermined shape so as to partially or substantially entirely cover the predetermined area that has been subjected to the etching, said single crystal Si substrate having a surface which has been oxidized or on which an $SiO_2$ film has been deposited, and having a hydrogen ion implantation portion in which hydrogen ions of a predetermined dose have been implanted to a predetermined depth; cleaning the insulating substrate and the single crystal Si substrate so as to activate surfaces of both the substrates; bonding a hydrogen ion implantation surface of the single crystal Si substrate that has been cut into the predetermined shape to the predetermined area that has been subjected to the etching at a room temperature; and dividing the single crystal Si substrate at the hydrogen ion implantation portion in a cleaving manner by performing a heating process, so as to form the single crystal Si thin film on the insulating substrate.

With the foregoing configuration, it is possible to obtain advantages similar to those of the foregoing manufacturing methods.

For a fuller understanding of the nature and advantages of the invention, reference should be made to the ensuing detailed description taken in conjunction with the accompanying drawings.

BRIEF DESCRIPTION OF THE DRAWINGS

FIG. 1(a) to FIG. 1(h) are cross sectional views each of which shows an example of a manufacturing process of a semiconductor device according to the present invention.

FIG. 2(a) to FIG. 2(h) are cross sectional views each of which shows an example of a manufacturing process of another semiconductor device according to the present invention.

FIG. 4(a) to FIG. 4(h) are cross sectional views each of which shows an example of a manufacturing process of further another semiconductor device according to the present invention.

FIG. 9(a) to FIG. 9(h) are drawings each of which shows a manufacturing procedure of an SOI substrate of still another embodiment of the present invention.

FIG. 12(a) to FIG. 12(h) are cross sectional views each of which shows an example of a semiconductor device according to further another embodiment of the present invention.

FIG. 15(a) to FIG. 15(h) are cross sectional views each of which shows an example of a semiconductor device according to further another embodiment of the present invention.

DESCRIPTION OF THE EMBODIMENTS

Figure 3:
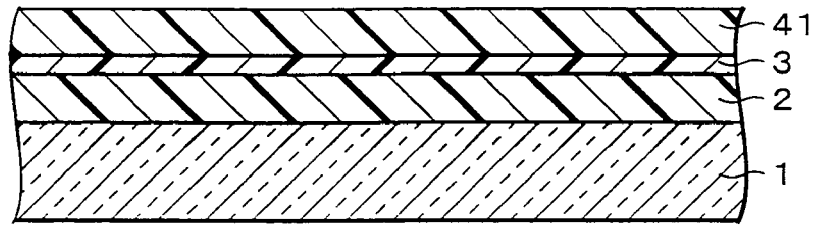
FIG. 3(a) to FIG. 3(d) are cross sectional views each of which shows an example of a manufacturing process of still another semiconductor device according to the present invention.
Figure 3:
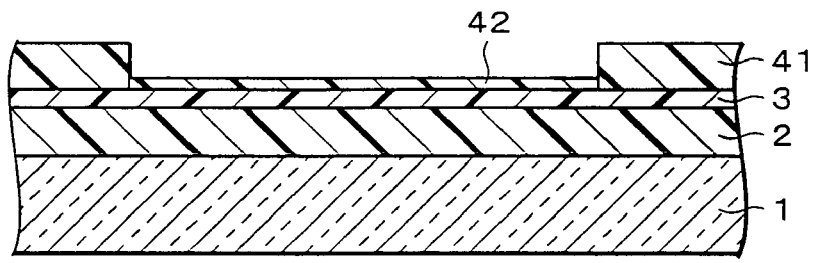
Figure 3:
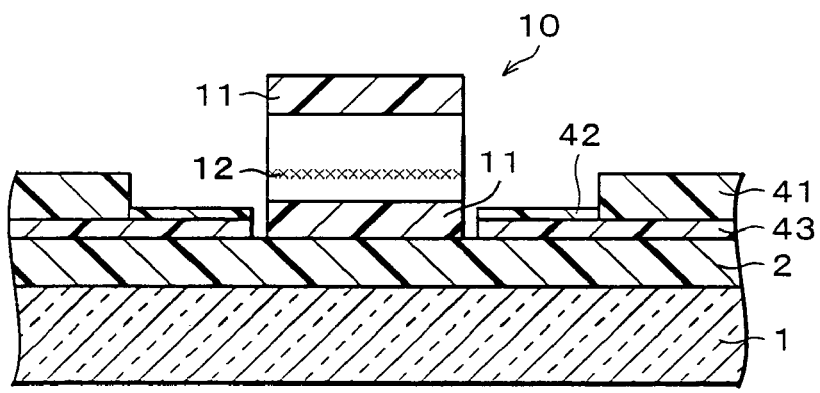
Figure 3:
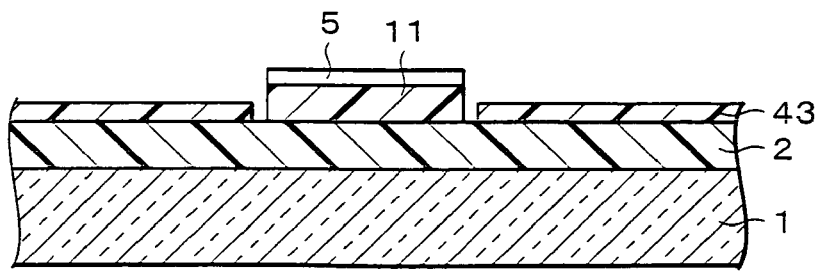

The following description will discuss an active matrix substrate 20 using a TFT which is one embodiment of the present invention referring to FIG. 1(h).

The active matrix substrate 20 which functions as a semiconductor device includes: an insulating substrate 1; $SiO_2$ (silicon oxide) films 2 and 11; a polycrystalline Si thin film 4; a single crystal Si thin film 5; a gate oxide film 6; a gate electrode 21; an interlayer insulating film 22; and a metal wiring 24.

As the insulating substrate 1, #1737 (trade name, alkaline earth-alumino boro-silicated glass, made by Corning Incorporated), which is a high-strain-point glass, is used, but it is also possible to use the following materials: a barium-alumino boro-silicated glass which is a high-strain-point glass, an alkaline earth-alumino boro-silicated glass, a boro-silicated glass, an alkaline earth-zinc-lead-alumino boro-silicated glass, and an alkaline earth-zinc-alumino boro-silicated glass.

The $SiO_2$ film 2 having an approximately 200 nm thickness is formed on an entire surface of the insulating substrate 1.

The polycrystalline Si thin film 4 having an approximately 50 nm thickness is made with the $SiO_2$ film 2 on the surface of the insulating substrate 1 so that the polycrystalline Si thin film 4 are in an island shape. Further, in an area except for the area having the polycrystalline Si thin film 4, the $SiO_2$ film 11 having an approximately 200 nm thickness is formed on the $SiO_2$ film 2 on the surface of the insulating substrate 1, and the single crystal Si thin film 5, having an approximately 50 nm thickness, that is shaped into the same form as the $SiO_2$ film 11, is formed on an island pattern area of the $SiO_2$ film 11. An area of the polycrystalline Si thin film 4 is separated from an area of the single crystal Si thin film 5 by at least 0.3 micrometer, preferably not less than 0.5 micrometer. This prevents metal atoms, such as Ni, Pt, Sn, and Pd, that are used in a producing process of the polycrystalline Si thin film 4 described later, from diffusing into the single crystal Si area, thereby stabilizing its property.

The gate oxide film 6 having an approximately 60 nm is formed on entire surfaces of the $SiO_2$ film 2, the polycrystalline Si thin film 4, and the single crystal Si thin film 5.

The gate electrode 21 constituted of the polycrystalline Si, silicide, or polycide etc. is formed on the gate oxide film 6 on surfaces of the island-shaped polycrystalline Si thin film 4 and the single crystal Si thin film 5.

Further, the interlayer insulating film 22 constituted of $SiO_2$ is formed on the gate oxide film 6 having the gate electrode 21 so as to entirely cover the gate oxide film 6. However, the interlayer insulating film 22 has a contact hole 23 (see FIG. 1(g)) which functions as an opening, and the metal wiring 24 constituted of metal such as AlSi. The metal wiring 24 extends from the surfaces of the island-shaped the polycrystalline Si thin film 4 and the single crystal Si thin film 5.

The active matrix substrate 20 further includes SiNx (silicon nitride), a resin flattening film, a via hole, and a transparent electrode that are used for liquid crystal display. In the polycrystalline Si thin film area, a driver and a TFT used for display are formed. In the single crystal Si thin film area, there is formed a timing controller which controls timing at which driving is performed by the driver.

A TFT formed in a conventional polycrystalline Silicon area was such that its mobility was approximately 100 $cm^2$/V·sec (N channel). On the other hand, in the liquid crystal display active matrix substrate 20, the TFT formed in the single crystal Si area is such that the mobility is approximately 500 $cm^2$/V·sec (N channel).

In the liquid crystal display active matrix substrate 20, not only the driver but also devices formed in the area of the polycrystalline Si thin film 4 require signals and power supply voltages of 7 to 8V. On the other hand, the timing controller which is a device formed in the area of the single crystal Si thin film 5 stably operates at 3.3V.

Note that, in a case where the thickness of the single crystal Si thin film 5 is increased, when the thickness is 50 nm to 100 nm, the condition does not largely change, but when the thickness is 300 nm to 600 nm, a channel portion is not completely depleted, so that an OFF current gradually increases, and an S value (sub-threshold coefficient) increases. Thus, although depending on the doping density of the channel portion, it is necessary to set the thickness of the single crystal Si thin film 5 to not more than 500 nm, preferably not more than 100 nm, taking coverage for non-uniformity into consideration.

Further, in the liquid crystal display active matrix substrate 20, transistors are formed in the area of the polycrystalline Si thin film 4 and in the area of the single crystal Si thin film 5, so that transistors, identical to each other in terms of a conductivity type, that are formed in the respective areas, are different from each other, depending on the areas, in terms of at least one of the mobility, the sub-threshold coefficient, and a threshold value. Thus, it is possible to form a transistor, corresponding to required property, in a suitable area.

In the liquid crystal display active matrix substrate 20, integrated circuits are formed in the area of the polycrystalline Si thin film 4 and in the area of the single crystal Si thin film 5, so that the integrated circuits formed in the respective areas are different from each other, depending on the areas, in terms of at least one of a gate length, a thickness of the gate oxide film, a power supply voltage, and a logic level. Thus, it is possible to form an integrated circuit, corresponding to required property, in a suitable area.

In the liquid crystal display active matrix substrate 20, integrated circuits are formed in the area of the polycrystalline Si thin film 4 and in the area of the single crystal Si thin film 5, so that it is possible to apply design rules, different from each other depending on the respective areas, with respect to the integrated circuits formed in the respective areas. This is based on the following reason: there is no crystal grain boundary in a single crystal portion particularly in a case of a short channel length, so that the non-uniformity in the TFT property hardly increases, but in the polycrystal portion, the influence of the crystal grain boundary rapidly increases the non-uniformity in the TFT property, so that it is necessary to change the design rules with respect to respective portions. Thus, it is possible to form an integrated circuit, corresponding to the design rules, in a suitable area.

Note that, in the present invention, a size of the obtained single crystal Si area is limited due to a wafer size of an LSI manufacturing equipment, but this size is sufficient to form (a) a high speed logic in which high speed, low power consumption, and less non-uniformity are required, (b) a timing generator, a high speed DAC (with current buffer), and the like.

The following description will discuss a manufacturing method of the active matrix substrate 20 described above referring to FIG. 1(a) to FIG. 1(h).

First, #1737 (trade name, alkaline earth-alumino boro-silicated glass, made by Corning Incorporated), which is a high-strain-point glass is used as the insulating substrate 1, and the $SiO_2$ film 2 having an approximately 200 nm thickness is deposited on an entire surface of the insulating substrate 1, as shown in FIG. 1(*a*), in accordance with plasma chemical vapor deposition (hereinbelow referred to as CVD) using mixed gas constituted of $SiH_4$ (silane) and $N_2O$ (dinitrogen monoxide). Further, an amorphous Si film 3 having an approximately 50 nm thickness is deposited on an entire surface of the $SiO_2$ film 2, as shown in FIG. 1(*a*), in accordance with the plasma CVD using $SiH_4$ gas.

Excimer laser is irradiated to heat the amorphous Si film 3 so that the amorphous Si film 3 is crystallized, so as to grow a polycrystalline Si layer, so that the polycrystalline Si thin film 4 is formed. Note that, the heating process of the amorphous Si film 3 is not limited to the irradiation heating based on the excimer laser, but may be irradiation heating based on other laser, or may be a heating process using a furnace. Further, in order to promote the growth of the crystal, at least one of Ni, Pt, Sn, and Pd may be added to the amorphous Si film 3.

A predetermined area of the polycrystalline Si thin film 4 is subjected to etching removal as shown in FIG. 1(*b*).

Next, the $SiO_2$ film 11 having an approximately 200 nm thickness is formed by oxidizing a surface of the single crystal Si substrate 10 in advance or depositing an oxide film ($SiO_2$ film) on the surface, and there is prepared the single crystal Si substrate 10 doped with boron of $3\times10^{15}/cm^{-3}$, in which there is provided a hydrogen ion implanted layer 12 obtained by implanting hydrogen ions of a dose amount of not less than $10^{16}/cm^2$, here $5\times10^{16}/cm^2$, at predetermined energy. The single crystal Si substrate 10 is cut, in accordance with dicing etc., into a shape smaller, by at least 0.3 micrometer, preferably by more than 0.5 micrometer, than the predetermined area of the polycrystalline Si thin film 4 that has been subjected to the etching removal.

After both the substrate having the polycrystalline Si thin film 4 and the single crystal Si substrate 10 are subjected to SC-1 cleaning, a surface of the cut single crystal Si substrate 10 which faces the hydrogen ion implanted layer 12 is in contact with the area having been subjected to the etching removal, so as to be bonded thereto. The SC-1 cleaning is one of cleaning methods generally called RCA cleaning, and in the SC-1 cleaning, rinsing solution is constituted of ammonia, hydrogen peroxide, and pure water.

Thereafter, a thermal process is performed with respect to the bonded substrates at 300° C. to 600° C., here, at approximately 550° C., and a temperature of the hydrogen ion implanted layer 12 of the single crystal Si substrate 10 is increased to a temperature, above the hydrogen dissociation temperature from Si, in accordance with laser irradiation or a lamp anneal including a peak temperature of approximately not less than 700° C., so that the single crystal Si substrate 10 is divided at the hydrogen ion implanted layer 12 in an exfoliating manner.

A damaged layer of the surface of the single crystal Si substrate that is left on the insulating substrate 1 after the exfoliation is removed by isotopic plasma etching or wet etching, here, by performing light etching of approximately 10 nm based on the wet etching using buffered Hydro fluoric acid.

Thus, as shown in FIG. 1(*d*), the polycrystalline Si thin film 4 and the single crystal Si thin film 5 each of which has an approximately 50 nm thickness are provided on the insulating substrate 1. Note that, when the single crystal Si substrate 10 is thermally divided at approximately 550° C. in an exfoliating manner after the single crystal Si substrate 10 is heated at 300° C. to 350° C. for approximately 30 minutes after bonding the substrates at a room temperature, the occurrence of stripping is reduced upon the exfoliation.

Thereafter, the lamp anneal is performed at approximately 800° C. for a minute. Next, an active area of the device is left, and unnecessary portions of the Si thin films 4 and 5 are removed by etching, so that island patterns are obtained as shown in FIG. 1(*e*).

Next, an $SiO_2$ film having an approximately 350 nm thickness is deposited in accordance with a plasma CVD using mixed gas constituted of TEOS (Tetra Ethoxy Silane, namely, $Si(OC_2H_5)_4$) and $O_2$. The deposited $SiO_2$ film is etched back by approximately 400 nm in accordance with RIE which is anisotropic etching. Thereafter, as the gate oxide film 6, a second $SiO_2$ film 6 having an approximately 60 nm thickness is formed, as shown in FIG. 1(*f*), in accordance with the plasma CVD using mixed gas constituted of $SiH_4$ and $N_2O$.

At this time, a space between the first $SiO_2$ film pattern and the single crystal Si thin film pattern is substantially equalized to a length twice as long as the thickness of the first $SiO_2$ film, so that an oxide film is left in a valley-shaped portion between the polycrystalline Si thin film and the single crystal Si thin film pattern, thereby entirely flattening the substrate.

Thereafter, the forming is performed in the same process as in a well-known forming process of a p-Si (polycrystalline Silicon) type TFT matrix substrate. That is, as shown in FIG. 1(*g*), after the gate electrode 21 constituted of polycrystalline Si, silicide, or polycide is formed, $P^+$ and $B^+$ ions are implanted, and the $SiO_2$ film (interlayer insulating film) 22 is deposited, and the contact hole 23 is formed. Thereafter, as shown in FIG. 1(*h*), the metal (AlSi) wiring 24 is formed in the contact hole 23.

Note that, the single crystal Si thin film 5 and the polycrystalline Si thin film 4, that have been formed on the insulating substrate 1, are subjected to patterning based on etching, so as to form a MOS transistor, and $P^+$ ion of not less than $10^{15}/cm^2$ is implanted into at least one part of a source/drain area of an N type MOS transistor and a P type MOS transistor. Thereafter, a heating process is performed in accordance with RTA, laser, and a furnace etc., and gettering of metal atoms is performed with respect not only to the polycrystalline Si thin film 4 area, but also to the single crystal Si thin film 5 area, thereby obtaining a TFT in which its property non-uniformity is little and its property is stable.

Further, there are sequentially formed SiNx (silicon nitride), a resin flattening film, a via hole, and a transparent electrode that are used for liquid crystal display, and the timing controller is formed in the single crystal Si thin film 4 area.

Further, in the present embodiment, in a case where the thickness of the single crystal Si thin film 5 is increased by enlarging implantation energy of the hydrogen ion so as to make a peak position of the hydrogen atom deeper, when the thickness is 50 nm to 100 nm, the condition does not largely change, but when the thickness is 300 nm to 600 nm, the S value of the TFT gradually increases, and an OFF current largely increases. Thus, although depending on the doping density of impurities, it is necessary to set the thickness of the single crystal Si thin film 5 to approximately not more than 600 nm, preferably not more than 500 nm, more preferably not more than 100 nm.

Embodiment 2

The following description will discuss an active matrix substrate 30 using a TFT as another embodiment of the present invention referring to FIG. 2(*h*). Note that, as to the same members as in the active matrix substrate 20 of Embodiment 1, description thereof will be omitted.

The active matrix substrate 30 which functions as a semiconductor device includes: an insulating substrate 1; $SiO_2$ (silicon oxide) films 32 and 11; a second $SiO_2$ film 35; a polycrystalline Si thin film 37; a single crystal Si thin film 34; a gate oxide film 38; a gate electrode 21; an interlayer insulating film 22; and a metal wiring 24.

As the insulating substrate 1, #1737 (trade name, alkaline earth-alumino boro-silicated glass, made by Corning Incorporated) which is a high-strain-point glass is used.

The $SiO_2$ film 32 having an approximately 350 nm is formed on an entire surface of the insulating substrate 1.

The second $SiO_2$ film 35 having an approximately 100 nm thickness is formed on the $SiO_2$ film on the insulating substrate, and the polycrystalline Si thin film 37 having an approximately 50 nm thickness is formed on the second $SiO_2$ film 35 so as to be respectively deposited on island patterns.

Further, in an area except for an area of the polycrystalline Si thin film 37, a concaved portion 33 (see FIG. 2(a)) having an approximately 150 nm depth is formed in the $SiO_2$ film 32 on the surface of the insulating substrate 1. The $SiO_2$ film 11 having an approximately 200 nm is formed on a bottom surface of the concaved portion 33. The single crystal Si thin film 34, having an approximately 50 nm thickness, that is shaped so as to correspond to a shape of the $SiO_2$ film 11, is formed on the $SiO_2$ film 11 so as to be deposited on an island pattern. An area of the polycrystalline Si thin film 37 is separated from an area of the single crystal Si thin film 34 by at least 0.3 micrometer, preferably not less than 0.5 micrometer. This prevents metal atoms such as Ni, Pt, Sn, and Pd from diffusing into the single crystal Si area, thereby stabilizing its property.

The gate oxide film 36 having an approximately 60 nm thickness is formed on entire surfaces of the $SiO_2$ film 32, the polycrystalline Si thin film 37, and the single crystal Si thin film 34.

The gate electrode 21 constituted of polycrystalline Si, silicide, or polycide etc. is formed on surfaces of the island-shaped polycrystalline Si thin film 37 and single crystal Si thin film 34.

Further, as in the active matrix substrate 30, there are formed the interlayer insulating film 22, the contact hole 23 (see FIG. 2(g)), and the metal wiring 24. Further, likewise, the active matrix substrate 30 further includes an SiNx (silicon nitride), a resin flattening film, a via hole, and a transparent electrode that are used for liquid crystal display. In the polycrystalline Si thin film area, a driver and a TFT used for display are formed. In the single crystal Si thin film area, a timing controller is formed.

An N channel TFT formed in a conventional polycrystalline Silicon area was such that its mobility was approximately 100 cm²/V·sec. On the other hand, in the liquid crystal display active matrix substrate 30, the N channel TFT formed in the single crystal Si area is such that the mobility is approximately 500 cm²/V·sec.

In the liquid crystal display active matrix substrate 30, not only the driver but also devices formed in the area of the polycrystalline Si thin film 37 require signals and power supply voltages of 7 to 8V. On the other hand, the timing controller which is a device formed in the area of the single crystal Si thin film 34 stably operates at 3.3V.

The following description will discuss a manufacturing method of the active matrix substrate 20 described above referring to FIG. 2(a) to FIG. 2(h).

1737 (trade name, alkaline earth-alumino boro-silicated glass, made by Corning Incorporated) which is a high-strain-point glass is used as the insulating substrate 1, and the $SiO_2$ film layer 32 having an approximately 350 nm thickness is deposited on an entire surface of the insulating substrate 1 in accordance with plasma CVD using mixed gas constituted of $SiH_4$ and $N_2O$. As shown in FIG. 2(a), a predetermined area of the $SiO_2$ film layer 32 is etched by approximately 150 nm, so as to form the concaved portion 33.

Next, the $SiO_2$ film 11 having an approximately 200 nm thickness is formed by oxidizing a surface of the single crystal Si substrate 10 in advance or depositing an oxide film on the surface, and there is prepared the single crystal Si substrate 10, doped with boron of $3\times10^{16}/cm^{-3}$, in which there is provided a hydrogen ion implanted layer 12 obtained by implanting a hydrogen ion of a dose amount of not less than $10^{16}/cm^2$, at predetermined energy. The single crystal Si substrate 10 is cut into a shape smaller, by at least 0.5 micrometer, than the area having the concaved portion 33.

After both the insulating substrate 1 having the concaved portion 33 and the cut single crystal Si substrate 10 are subjected to SC-1 cleaning, a hydrogen ion implantation surface from which the hydrogen ions have been implanted is bonded to the area having been subjected to the etching removal, so as to be bonded thereto, as shown in FIG. 2(b).

Thereafter, a heating process is performed with respect to the bonded substrates at 300° C. to 600° C., here, at approximately 550° C., and a temperature of the hydrogen ion implanted layer 12 of the single crystal Si substrate 10 is increased to a temperature, above the hydrogen dissociation temperature from Si, in accordance with laser irradiation or a lamp anneal including a peak temperature of approximately not less than 700° C., so that the single crystal Si substrate 10 is divided at the hydrogen ion implanted layer 12 in an exfoliating manner.

A damaged layer of the single crystal Si substrate surface that is left on the insulating substrate 1 after the exfoliation is removed by isotopic plasma etching or wet etching, here, by performing light etching of approximately 10 nm based on the wet etching using buffered Hydro fluoric acid. Thus, as shown in FIG. 2(c), the single crystal Si thin film 34 having an approximately 50 nm thickness is provided on the insulating substrate 1.

Thereafter, a second $SiO_2$ film 35 having an approximately 100 nm is deposited above an entire surface of the insulating substrate 1, as shown in FIG. 2(d), in accordance with the plasma CVD using mixed gas constituted of $SiH_4$ and $N_2O$. Further, an amorphous Si film 36 having an approximately 50 nm thickness is deposited on an entire surface of the $SiO_2$ film 35, as shown in FIG. 2(d), in accordance with the plasma CVD using $SiH_4$ gas.

Excimer laser is irradiated to heat the amorphous Si film 36 so that the amorphous Si film 36 is crystallized, so as to grow a polycrystalline Si layer, so that the polycrystalline Si thin film 37 is formed, and the bond strength is improved.

Next, an unnecessary portion of the polycrystalline Si thin film 37 and at least a portion of the second $SiO_2$ film 35 that exists on the single crystal Si thin film 34 are removed by etching. Next, an active area of the device is left, and unnecessary portions of the Si thin film are removed by etching, so that an island pattern is obtained as shown in FIG. 2(e).

Next, an $SiO_2$ film having an approximately 350 nm thickness is deposited in accordance with plasma CVD using mixed gas constituted of TEOS and oxide. The deposited $SiO_2$ film is etched back by approximately 400 nm in accordance with RIE which is anisotropic etching. Thereafter, as the gate oxide film 38, the $SiO_2$ film 38 having an approximately 60 nm thickness is formed, as shown in FIG. 2(f), in accordance with the plasma CVD using mixed gas constituted of SiH$_4$ and N$_2$O. Here, a space between the first SiO$_2$ film pattern and the single crystal Si thin film pattern is substantially equalized to a length twice as long as the thickness of the first SiO$_2$ film, so that an oxide film is left in a valley-shaped portion between the polycrystalline Si thin film and the single crystal Si thin film pattern that has not been subjected to the island-shape etching, thereby entirely flattening the substrate.

Processes thereafter are performed in the same manner as in Embodiment 1, so that descriptions thereof are omitted.

Embodiment 3

The following description will discuss an active matrix substrate using a TFT as still another embodiment of the present invention. A cross sectional structure of the active matrix substrate is arranged in the same manner as in the active matrix substrate 20 of Embodiment 1, so that only differences between the active matrix substrate of the present embodiment and the active matrix substrate 20 of Embodiment 1 are described.

A polycrystalline Si thin film 43 (see FIG. 3($d$)) of the present embodiment is constituted of polycrystalline Si whose crystal-growing directions are uniformed, and are uniformed, that is, so-called continuous grain silicon Si.

An N channel TFT formed in a conventional continuous grain silicon Si area was such that its mobility was approximately 200 cm$^2$/V·sec. On the other hand, in the liquid crystal display active matrix substrate, the N channel TFT formed in the single crystal Si area is such that the mobility is approximately 500 cm$^2$/V·sec.

In the liquid crystal display active matrix substrate, not only the driver but also devices formed in the area of the polycrystalline Si thin film 43 require signals and power supply voltages of 7 to 8V. On the other hand, the timing controller which is a device formed in the area of the single crystal Si thin film 5 stably operates at 3.3V.

The following description will discuss a manufacturing method of the active matrix substrate described above referring to FIG. 3($a$) to FIG. 3($d$).

In Embodiment 3 of the present invention, as in Embodiment 1, #1737 (trade name, alkaline earth-alumino borosilicated glass, made by Corning Incorporated) which is a high-strain-point glass is used as the insulating substrate 1, and the SiO$_2$ film 2 having an approximately 200 nm thickness is deposited on an entire surface of the insulating substrate 1 in accordance with plasma CVD using mixed gas constituted of SiH$_4$ and N$_2$O. Further, an amorphous Si film 3 having an approximately 50 nm thickness is deposited on an entire surface of the SiO$_2$ film 2 in accordance with the plasma CVD using SiH$_4$ gas. As shown in FIG. 3($a$), a second SiO$_2$ film 41 having an approximately 200 nm thickness is deposited on an entire surface of the amorphous Si film 3 in accordance with the plasma CVD using mixed gas constituted of SiH$_4$ and N$_2$O.

An opening portion is formed in a predetermined area of the second SiO$_2$ film 41 of an upper layer in accordance with etching. Thereafter, in order to control hydrophilicity of a surface of the amorphous Si film 3 in the opening portion, as shown in FIG. 3($b$), a thin SiO$_2$ film 42 is formed on the surface of the amorphous Si film 3, and a surface of the thin SiO$_2$ film 42 is spin-coated with Ni acetate aqueous solution.

Next, solid-phase growing is performed at 600° C. for 12 hours, and polycrystalline Si whose crystal-growing directions are uniformed, that is, so-called continuous grain silicon is grown, so as to form a polycrystalline Si thin film 43. Further, the second SiO$_2$ films 41 and 42 on the polycrystalline Si thin film 43 are removed. Thereafter, a predetermined area of the polycrystalline Si thin film 43 is removed by etching.

Next, the SiO$_2$ film 11 having an approximately 200 nm thickness is formed by oxidizing a surface of the single crystal Si substrate 10 in advance or depositing an oxide film on the surface, and there is prepared the single crystal Si substrate 10, having a hydrogen ion implanted layer 12 obtained by implanting the hydrogen ion of the dose amount of $5 \times 10^{16}$/cm$^2$ at predetermined energy. The single crystal Si substrate 10 is cut into a shape smaller, by at least 0.3 micrometer, preferably not less than 0.5 micrometer, than the predetermined area in which the polycrystalline Si thin film 43 has been subjected to the etching removal.

After both the substrate having the polycrystalline Si thin film 43 and the single crystal Si substrate 10 are subjected to SC-1 cleaning, a surface of the single crystal Si substrate 10 which faces the hydrogen ion implanted layer 12 is in contact with the area having been subjected to the etching removal, so as to be bonded thereto. At this time, the polycrystalline Si thin film 43 is separated from the single crystal Si substrate 10 by at least 0.3 micrometer, preferably not less than 0.5 micrometer. This prevents metal atoms such as Ni, Pt, Sn, and Pd from diffusing into the single crystal Si area, thereby stabilizing its property.

Thereafter, a heating process is performed with respect to the bonded substrates at 300° C. to 600° C., here, at approximately 550° C., and a temperature of the hydrogen ion implanted layer 12 of the single crystal Si substrate 10 is increased to a temperature, above the hydrogen dissociation temperature from Si, in accordance with laser irradiation or a lamp anneal including a peak temperature of approximately not less than 700° C., so that the single crystal Si substrate 10 is divided at the hydrogen ion implanted layer 12 in an exfoliating manner.

A damaged layer of a surface of the single crystal Si substrate 10 that is left on the insulating substrate 1 after the exfoliation is removed by isotopic plasma etching or wet etching, here, by performing light etching of approximately 10 nm based on the wet etching using buffered Hydro fluoric acid. Thus, as shown in FIG. 3($d$), the polycrystalline Si thin film 43 and the single crystal Si thin film 5 each of which has an approximately 50 nm thickness are provided on the insulating substrate 1.

Next, an unnecessary portion on the polycrystalline Si thin film 43 and at least a portion of the second SiO$_2$ film that exists on the single crystal Si thin film 5 are removed by etching. Further, unnecessary portions of the polycrystalline Si thin film 43 and the single crystal Si thin film 5 are removed by etching in island shapes so as to correspond to a shape of the device. Next, an active area of the device is left, and unnecessary portions of the Si thin film are removed by etching, so that an island pattern is obtained.

Next, an SiO$_2$ film having an approximately 350 nm thickness is deposited in accordance with plasma CVD using mixed gas constituted of TEOS and oxygen. The deposited SiO$_2$ film is etched back by approximately 400 nm in accordance with RIE which is anisotropic etching. Thereafter, as the gate oxide film, the SiO$_2$ film (not shown) having an approximately 60 nm thickness is formed in accordance with the plasma CVD using mixed gas constituted of SiH$_4$ and N$_2$O. Here, a space between the first SiO$_2$ film pattern and the single crystal Si thin film pattern is substantially equalized to a length twice as long as the thickness of the first SiO$_2$ film, so that an oxide film is left in a valley-shaped portion between the polycrystalline Si thin film and the single crystal Si thin film pattern, or side walls are formed on gap portions so that the gap portions are smoothed, thereby entirely flattening the substrate.

Next, an opening portion is formed in the $SiO_2$ film in the vicinity of the active area of the devices, and $P^+$ ions are implanted with high dose (15 keV, $5\times10^{15}/cm^2$) so as to perform gettering with respect to Ni added to promote crystal growth of the $SiO_2$ film into a mask, and a heating process is performed in accordance with RTA at approximately 800° C. for one minute. Although a physical space is provided so that Ni atoms are prevented from diffusing into the single crystal Si while processing, there is a possibility that slight amount of Ni atoms may be mixed into the single crystal Si, so that it is preferable to perform the gettering also with respect to the active area of the single crystal Si, but the gettering may be omitted in terms of designing in a case where the space is prioritized.

Processes thereafter are performed in the same manner as in Embodiment 1, so that descriptions thereof are omitted.

Embodiment 4

The following description will discuss an active matrix substrate 50 using a TFT as another embodiment of the present invention. The active matrix substrate 50 is arranged substantially in the same manner as in the active matrix substrate 20 of Embodiment 1, so that only differences between the active matrix substrate 50 and the active matrix substrate 20 are described.

A thickness of the $SiO_2$ film 2 in the active matrix substrate 20 is approximately 200 nm. On the other hand, a thickness of an $SiO_2$ film 52 in the active matrix substrate 50 of the present embodiment is approximately 350 nm, and there is formed a concaved portion 55 (see FIG. 4(b)) having an approximately 150 nm depth.

Further, a thickness of the $SiO_2$ film 11 of the active matrix substrate 20 is approximately 200 nm. On the other hand, a thickness of an $SiO_2$ film 61 of the active matrix substrate 50 of the present embodiment is approximately 400 nm.

An N channel TFT formed in a conventional polycrystalline Silicon area was such that its mobility was approximately 100 cm²/V·sec. On the other hand, in the liquid crystal display active matrix substrate 50, the N channel TFT formed in the single crystal Si area is such that the mobility is approximately 500 cm²/V·sec.

In the liquid crystal display active matrix substrate 50, not only the driver but also devices formed in the area of the polycrystalline Si thin film 54 require signals and power supply voltages of 7 to 8V. On the other hand, the timing controller which is a device formed in the area of the single crystal Si thin film 55 stably operates at 3.3V.

Further, the single crystal Si substrate 60, on which the $SiO_2$ film 61 having an approximately 400 nm thickness has been formed, is used in the present embodiment. Compared with a case where non-uniformity of a threshold of a TFT is 0.3V (±σ) in Embodiment 1 in which the single crystal Si substrate 10 having the $SiO_2$ film 11 of approximately 200 nm is used, non-uniformity of a threshold of a TFT that has been obtained in the present embodiment is approximately 0.15V (±σ) which is half of the foregoing value, so that stability of operation particularly at a low voltage is improved. This is based on the following reason: the foregoing arrangement reduces influence of a fixed charge that is caused by (a) contamination on an interface between the single crystal Si substrate and a glass substrate that are bonded to each other, or (b) deformation and incompleteness of a lattice. As the $SiO_2$ film 61 is thicker, the non-uniformity of the threshold is further reduced, but a suitable value is approximately 200 nm to 400 nm in terms of (a) an efficiency of a forming process of the $SiO_2$ film (time taken to oxidize) and (b) trade off with respect to height differences. In a case where the non-uniformity is focused on, the suitable value is approximately 400 nm, and in a case where the differences and the efficiency are focused on, the suitable value is approximately 200 nm.

In a case where no problem is brought about with respect to the differences, it is needless to say that not less than 400 nm is more preferable.

The following description will discuss a manufacturing method of the active matrix substrate 50 described above referring to FIG. 4(a) to FIG. 4(h).

1737 (trade name, alkaline earth-alumino boro-silicated glass, made by Corning Incorporated) which is a high-strain-point glass is used as the insulating substrate 1, and the $SiO_2$ film 52 having an approximately 350 nm thickness is deposited on an entire surface of the insulating substrate 1 in accordance with plasma CVD using mixed gas constituted of $SiH_4$ and $N_2O$. As shown in FIG. 4(a), an amorphous Si film 53 having an approximately 50 nm thickness is deposited on an entire surface of the $SiO_2$ film 52 in accordance with the plasma CVD using $SiH_4$ gas.

Excimer laser is irradiated to heat the amorphous Si film 53 so that the amorphous Si film 53 is crystallized, so as to grow a polycrystalline Si layer, so that the polycrystalline Si thin film 54 is formed.

The polycrystalline Si thin film 54 in the predetermined area and the $SiO_2$ film 52 are partially removed by approximately 150 nm in accordance with etching, so that a concaved portion 55 having an approximately 200 nm depth is formed, as shown in FIG. 4(b).

Next, the $SiO_2$ film 61 having an approximately 400 nm thickness is formed by oxidizing a surface of the single crystal Si substrate 60 or depositing an oxide film on the surface, and there is prepared the single crystal Si substrate 60 having a hydrogen ion implanted layer 62 into which hydrogen ions of a dose amount of $5\times10^{16}/cm^2$ have been implanted at predetermined energy.

The single crystal Si substrate 60 is cut into a shape smaller than a shape of the concaved portion 55 by 0.5 micrometer.

After both the substrate 1 having the polycrystalline Si thin film 54 and the single crystal Si substrate 60 are subjected to SC-1 cleaning, a surface of the cut single crystal Si substrate 60 which faces the hydrogen ion implanted layer 62 is in contact with a bottom surface of the concaved portion 55, so as to be bonded thereto.

Thereafter, a heating process is performed with respect to the bonded substrates at 300° C. to 650° C., here, at approximately 550° C., and a temperature of the hydrogen ion implanted layer 62 of the single crystal Si substrate 60 is increased to a temperature, above the hydrogen dissociation temperature from Si, in accordance with laser irradiation or a lamp anneal including a peak temperature of approximately not less than 700° C., so that the single crystal Si substrate 60 is divided at the hydrogen ion implanted layer 62 in an exfoliating manner.

A damaged layer of a surface of the single crystal Si substrate 10 that is left on the insulating substrate 1 after the exfoliation is removed by isotopic plasma etching or wet etching, here, by performing light etching of approximately 10 nm based on the wet etching using buffered Hydro fluoric acid.

Thus, as shown in FIG. 4(d), the polycrystalline Si thin film 54 and the single crystal Si thin film 55 each of which has an approximately 50 nm thickness are provided on the insulating substrate 1.

Thereafter, the lamp anneal is performed at approximately 800° C. for a minute. Next, an active area of the device is left, and unnecessary portions of Si thin films 54 and 55 are removed by etching, so that island patterns are obtained as shown in FIG. 4(*e*).

Next, a first SiO$_2$ film having an approximately 350 nm thickness is deposited in accordance with plasma CVD using mixed gas constituted of TEOS and oxygen. The deposited SiO$_2$ film is etched back by approximately 400 nm in accordance with RIE which is anisotropic etching. Thereafter, as the gate oxide film, the SiO$_2$ film 56 having an approximately 60 nm thickness is formed, as shown in FIG. 4(*f*), in accordance with the plasma CVD using mixed gas constituted of SiH$_4$ and N$_2$O.

Thereafter, a TFT is formed in the same process as in Embodiment 1.

Embodiment 5

The following description will discuss an active matrix substrate using a TFT as still another embodiment of the present invention. A structure of the active matrix substrate is arranged in the same manner as in the active matrix substrate of Embodiment 4, so that only differences in the manufacturing method between the active matrix substrate of the present embodiment and the active matrix substrate of Embodiment 4 are described.

In Embodiment 4, there is prepared the single crystal Si substrate 60 in which a hydrogen ion of a dose amount of 5×10$^{16}$/cm$^2$ has been implanted at predetermined energy. On the other hand, in the present embodiment, there is prepared the single crystal Si substrate in which a hydrogen ion of a dose amount of 3×10$^{16}$/cm$^2$ has been implanted at predetermined energy.

Further, in Embodiment 4, the single crystal Si is divided at the hydrogen ion implantation portion 62 in an exfoliating manner, and the heating process is performed at approximately 550° C. before obtaining the single crystal Si thin film 55. On the other hand, in the present embodiment, a pulse of the excimer laser is irradiated at approximately 60 to 80% energy upon forming the polycrystalline Si layer, and the irradiation is performed with respect to the entire surface as in the growth of the polycrystalline Si layer, so that the surface is entirely heated.

An N channel TFT formed in a conventional polycrystalline Silicon area was such that its mobility was approximately 100 cm$^2$/V·sec. On the other hand, in the liquid crystal display active matrix substrate, the N channel TFT formed in the single crystal Si area is such that the mobility is approximately 600 cm$^2$/V·sec. Note that, in the liquid crystal display active matrix substrate of Embodiment 4, the TFT formed in a conventional single crystal Si area is such that its mobility is approximately 500 cm$^2$/V·sec. This difference in the mobility is caused by the following reason: since the single crystal Si thin film obtained in the present embodiment is in a condition under which the implantation amount of the hydrogen ion is reduced, it is possible to reduce the damage of the single crystal Si that is brought about upon implanting the hydrogen ion, so that the TFT property is improved.

Further, in the liquid crystal display active matrix substrate, not only the driver but also devices formed in the area of the polycrystalline Si thin film require signals and power supply voltages of 7 to 8V. On the other hand, the timing controller which is a device formed in the area of the single crystal Si thin film stably operates at 3.3V.

Embodiment 6

The following description will discuss an active matrix substrate using a TFT as still another embodiment. A structure of the active matrix substrate is the same as that of the active matrix substrate of Embodiment 1, so that description thereof is omitted.

In the present embodiment, a gate length of a TFT formed in a polycrystalline Si area is set to 5 micrometer, and a gate length of a TFT formed in a single crystal Si area is set to 0.8 micrometer. A gate oxide film thickness of the TFT formed in the polycrystalline Si area is set to 80 nm, and a gate oxide film thickness of the TFT formed in the single crystal Si area is set to 50 nm. When the TFTs are operated at power supply voltages of 8V and 3V respectively, the operation is stabilized.

While, a TFT whose gate length is 0.8 micrometer is formed in the polycrystalline Si area, and is operated at 3V, the TFT property varies and the substrate lacks in the withstand pressure between a source and a drain, so that unusable substrates tend to be manufactured.

Further, when a TFT whose gate length is 1.5 micrometer is formed in the polycrystalline Si area, and is operated at 3V, there are practical problems in a threshold voltage and variation thereof.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

Further, the embodiments of the present invention are not limited to the present content, but it is needless to say that, for example, the forming method of the polycrystalline Si, or materials for the interlayer insulating film, a thickness of the interlayer insulating film, and the like can be realized by means person with ordinary skill in the art knows. Further, it is needless to say that other materials generally used for the same object bring about the same effects.

Embodiment 7

The following description will discuss one embodiment of the present invention referring to FIG. 5 to FIG. 8.

Figure 5:
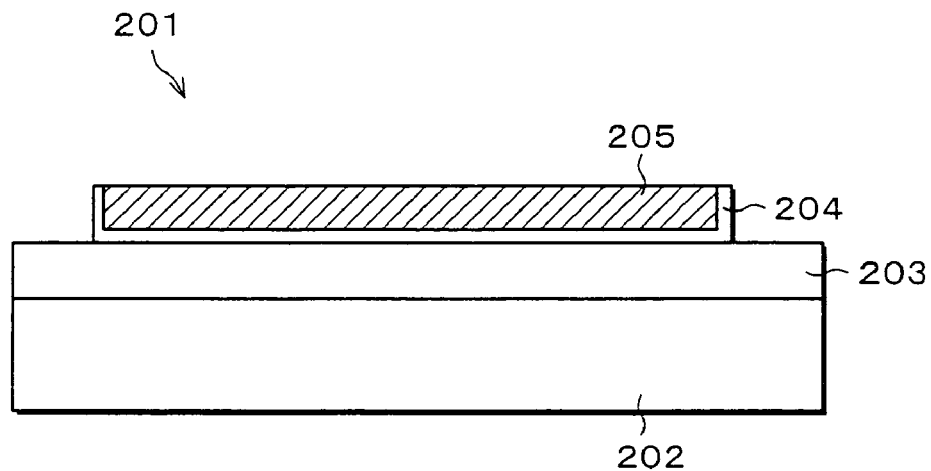
FIG. 5 is a cross sectional view of an SOI substrate of another embodiment of the present invention.

FIG. 5 is a cross sectional view of an SOI substrate 201 described as one embodiment of the present invention. The SOI substrate 201 is manufactured by the smart cut method, and is such that: a silicon dioxide film 203 is stacked on a surface of a high-strain-point nonalkali glass substrate 202 which is an amorphous nonalkali glass substrate, and a single crystal silicon thin film 205 thermally oxidized is bonded to the surface.

In FIG. 5, the single crystal silicon thin film 205 is smaller than the high-strain-point nonalkali glass substrate 202, and this results from a size relationship between the high-strain-point nonalkali glass substrate and a silicon wafer that are generally sold. Thus, the single crystal silicon thin film 205 may be as large as the high-strain-point nonalkali glass substrate 202. Further, FIG. 5 is only a pattern diagram, so that the thickness relationship is not practical. Generally, a thickness of the high-strain-point nonalkali glass substrate 203 is approximately 0.7 mm, and a thickness of the silicon dioxide films 203 and 204 is approximately 50 to 300 nm.

Further, a thickness of the single crystal silicon thin film 205 is approximately 40 to 200 nm. When the thickness of the single crystal silicon thin film 205, namely an implantation depth of the hydrogen ions, is thin such as 200 nm, it is possible to obtain a transistor that has been completely depleted, so that it is possible to improve the property largely, and to facilitate the process. While, when the thickness is less than 40 nm, large non-uniformity is brought about in the thickness, so that the safety coefficient in manufacturing drops. Thus, the foregoing setting enables the safety coefficient to be kept, so that it is possible to obtain a high element property.

Figure 6:
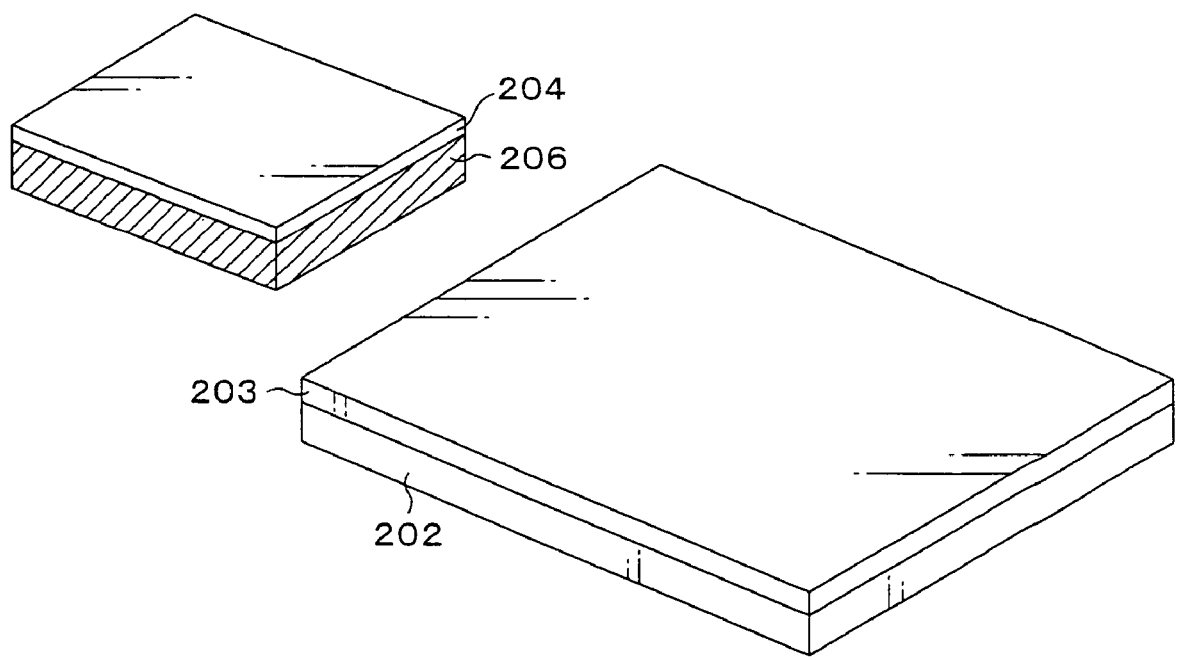
FIG. 6 is a cross sectional view showing a condition under which a single crystal silicon piece has not been bonded to a high-strain-point nonalkali glass substrate.
Figure 7:
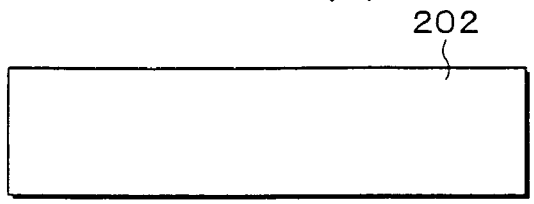
FIG. 7(a) to FIG. 7(g) are drawings each of which shows a manufacturing procedure of the SOI substrate shown in FIG. 5.
Figure 7:
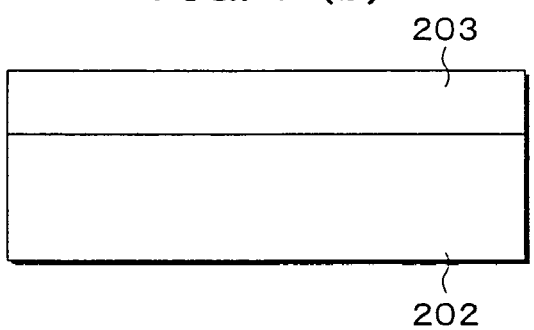
Figure 7:
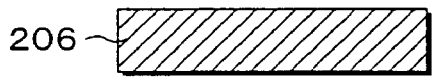
Figure 7:
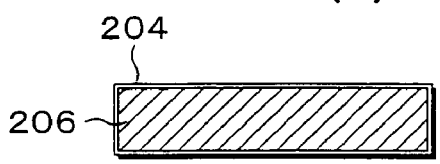
Figure 7:
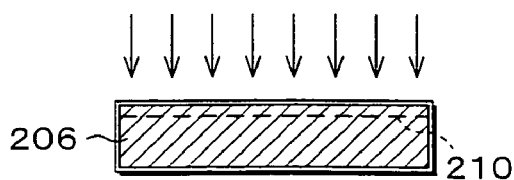
Figure 7:
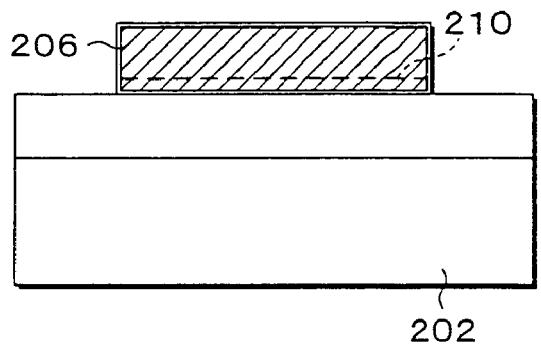
Figure 7:
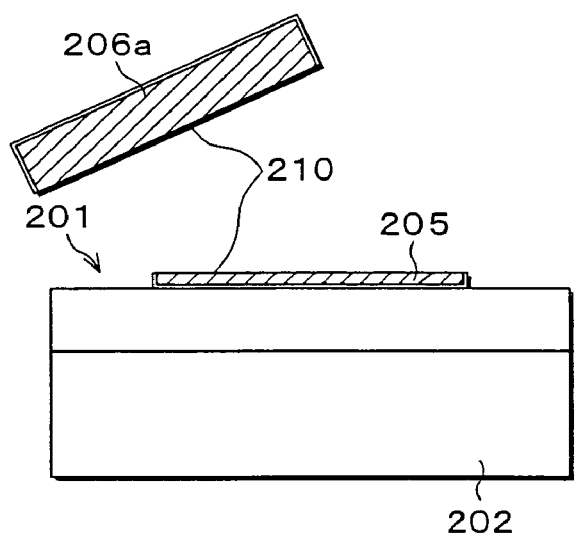

FIG. 6 shows a condition under which a single crystal silicon piece 206 has not been bonded to the high-strain-point nonalkali glass substrate 202. The silicon dioxide film 204 of the single crystal silicon piece is formed only on a surface of the single crystal silicon piece 206 as shown in FIG. 6 in a case where the film is obtained by a film-forming process such as a chemical vapor deposition (CVD process). In case of forming the film by a thermal oxidation process described later, the films are formed on both front and rear surfaces of the single crystal silicon piece 206. Further, when the single crystal silicon piece 206 is divided by the smart cut process, also the silicon dioxide film on the front surface side is removed, so that this brings about a single crystal silicon thin film 205 shown in FIG. 5.

Each of FIG. 7(a) to FIG. 7(g) shows a manufacturing procedure of the foregoing SOI substrate 201. The hydrophilicity of the high-strain-point nonalkali glass substrate 202 is insufficient as it is, so that the silicon dioxide ($SiO_2$) film 203 having an 50 to 300 nm thickness is formed, as shown in FIG. 7(a) and FIG. 7(b), so as to increase the hydrophilicity. The film can be formed as follows: TEOS (Tetra Ortho Silicate) gas and oxygen gas are emitted in a vacuum chamber, and plasma discharge is performed, in accordance with plasma chemical vapor deposition (plasma CVD) for example. In the plasma CVD, the film is formed by activating the material gas with the plasma discharge, so that the plasma CVD is suitable for forming the film on the high-strain-point nonalkali glass substrate 202 whose temperature cannot be increased to not less than 600° C. The film-forming process is concretely detailed as follows.

The TEOS gas and the oxygen gas that are used as the material gas are emitted into the vacuum chamber, and the degree of vacuum is adjusted to 133 to 1330 Pa. A substrate temperature is kept to approximately 200° C. to 400° C. A board on which the substrate is placed functions also as one electrode of a high frequency power supply, and a high frequency of 13.56 MHz, which is in a radio frequency band (RF band), is applied between the other electrode and the board, so as to bring about the plasma discharge. The power density of the high frequency is approximately 0.1 W/cm². Due to the plasma discharge, it is possible to form the silicon dioxide film 203 having an approximately 50 to 300 nm thickness in approximately one minute.

Here, the plasma frequency is not necessarily limited to the RF band, but may be in a microwave band (approximately 2.456 GHz). Further, the insufficiency in the hydrophilicity of the high-strain-point nonalkali glass substrate 202 is caused by a chemical composition thereof. The silicon dioxide ($SiO_2$) is superior in the hydrophilicity, but is contained in the substrate only by 50%, so that this results in the insufficiency of the hydrophilicity. As described above, the silicon dioxide film 203 is coated by the foregoing thickness, so that it is possible to obtain the sufficient hydrophilicity.

While, the single crystal silicon piece 206 is in disc shapes of 6, 8, and 12 inches. Further, generally, impurities such as boron and phosphor of certain density are doped, and a resistivity value thereof is set to be low such as 10 Ωcm. A crystal orientation is the most likely to be a (100) face. The silicon dioxide film 204 having an approximately 50 to 300 nm thickness is formed, as shown in FIG. 7(c) to FIG. 7(d), by a thermal oxidation etc. so that the impurities are not dispersed from the surface. As the thermal oxidation, dry $O_2$ oxidation may be performed, but an oxidation speed is slow in the process, so that it takes large time to form the oxide film having a 300 nm thickness. Thus, processes such as pyrogenic oxidation or steam oxidation, in which the oxidation speed is fast, may be performed.

Thereafter, as shown in FIG. 7(e), the hydrogen ion is implanted. An example of how the implantation is performed is as follows: an accelerating voltage is 12 to 36 kV, and an implantation amount is 4 to $6 \times 10^{16}/cm^{-2}$. As shown by a reference sign 210, the implantation of hydrogen ions causes a hydrogen ion implantation portion to be formed on a surface positioned at a predetermined depth by an accelerating voltage (40 to 200 nm as described above) of the single crystal silicon piece 206.

The high-strain-point nonalkali glass substrate 202 and the single crystal silicon piece 206 that have been prepared in this manner are rinsed with so-called SC-1 solution obtained by diluting aqua ammoniae and hydrogen peroxide solution with pure water, and so as to remove particles on the surface thereof and activate the surface. The SC-1 solution is prepared as follows: 28% commercial aqua ammoniae, 35% hydrogen peroxide solution, and pure water whose resistivity is not less than 10 MΩcm are mixed at a content ratio of 1:2:12 and the like. The high-strain-point nonalkali glass substrate 202 and the single crystal silicon piece 206 are immersed in the SCI solution for 1 to 10 minutes, so as to remove the particles on the surface. Thereafter, rinsed by flowing pure water for about 10 minutes so as to remove the solution from the surfaces, and the surfaces are dried by a spin dryer etc.

When the high-strain-point nonalkali glass substrate 202 and the single crystal silicon piece 206 that have been rinsed in this manner come closer to each other, they are bonded to each other by a van der Waals force. This condition is shown in FIG. 7(f). At this time, the single crystal silicon piece 206 is turned upside down, and a hydrogen ion implantation surface from which the hydrogen ions have been implanted is bonded on the high-strain-point nonalkali glass substrate 202. A little force is required (for example, several hundreds g) in the bonding in a case where: the rinse is performed in a preferable manner, and the particles on the surface are removed and sufficiently activated. An attraction force based on the van der Waals force varies so as to inversely relate to the 6th power of an interatomic distance. When atoms on the surfaces come closer to each other with a distance that can be compared with an interatomic distance of solids, the surfaces bond to each other. It is possible to recognize a condition, under which the surfaces bond to each other, by seeing a backside in which an interference color vanishes, in a case where the high-strain-point nonalkali glass substrate 202 is a transparent substrate.

The high-strain-point nonalkali glass substrate 202 and the single crystal silicon piece 206 are made to bond to each other by coming closer to each other as described above, and they are subjected to a heating process, so that the high-strain-point nonalkali glass substrate 202 to which the single crystal silicon piece 206 has been made to bond in this manner becomes chemically-integrated bond. That is, the hydrogen on the surfaces are dissipated by heat, and free hands of the atoms on the substrates are joined to each other, so that the adhesion is strengthened. The inventor of the present invention confirmed that this bonding was performed at not less than 300° C., and a high temperature of 800° C. to 1200° C. was not required unlike Tokukaihei 11•163363 (Japanese Patent). While, a strain point of the high-strain-point nonalkali grass which functions as a substrate is not more than 700° C., so that when the substrate is heated at a higher temperature, the substrate is deformed. Thus, in a case of using the high-strain-point nonalkali glass as the substrate like the present invention, the highest temperature for performing the heating process so as to strengthen the adhesion is limited to approximately 650° C., and the inventor of the present invention confirmed that it was possible to obtain a sufficient bond strength even when the highest temperature was 600° C.

The high-strain-point nonalkali grass substrate 202 and the single crystal silicon piece 206 that have been bonded to each other have a bond strength of $1\times10^5$ dyn/cm² in an interface therebetween. This value can be compared with a bond strength of a thin film formed by a CVD device etc. The bond strength is evaluated by performing a test in which the bonded single crystal silicon thin film 205 is stripped from an end portion. According to "Elasticity Theory" (written by L D Landau and E M Lifshitz, translated by Tsunezo Sato, published by Tokyo Tosyo (In Japan)), when a thin layer (thickness: h) is stripped from an object by an external force resisting to a surface tractional force on a separating surface, α (a bond strength per a unit length) is expressed by the following equation.

$$\alpha = \frac{Eh^3}{24(1-\sigma^2)}(\partial^2 \zeta / \partial x^2)^2$$

Here, E is a Young's modulus, σ is a Poisson ratio, h is a thickness of the thin film, x is an axis in a horizontal direction of a flat surface on which the thin film is bonded, and ζ is displacement of a film to be stripped in a normal line direction of the thin film. The bond strength α is obtained by calculating a quadratic partial differential coefficient with respect to an x axis of ζ, the displacement in a normal line direction.

Further, when the heating process for enforcing the bond strength is performed, it is important in bonding them stably that a coefficient of thermal expansion of the glass substrate is higher than that of the single crystal silicon piece 206. The coefficient of thermal expansion of silicon is approximately $2.6\times10^{-6}$ deg$^{-1}$ at a room temperature, and is approximately $4.1\times10^{-6}$ deg$^{-1}$ at 500° C. While, the high-strain-point nonalkali glass substrate is made of materials by which it is possible to obtain a substrate whose coefficient of thermal expansion is as high as or higher than that of the single crystal silicon at a temperature range from a room temperature to 700° C., for example, made of an alkaline earth-alumino boro-silicated glass, a barium-alumino boro-silicated glass, an alkaline earth-zinc-lead-alumino boro-silicated glass, or an alkaline earth-zinc-alumino boro-silicated glass, and the coefficient of thermal expansion is $4.7\times10^{-6}$ deg$^{-1}$ at a temperature ranging from 50° C. to 300° C. Thus, at the temperature ranging from 50° C. to 300° C., the coefficient of thermal expansion of the high-strain-point nonalkali glass substrate 202 is higher than that of the single crystal silicon. Note that, in the present invention, the amorphous nonalkali glass substrate contains alkali of not more than 1%, and a concrete example is #1737 glass made by Corning Incorporated.

Figure 8:
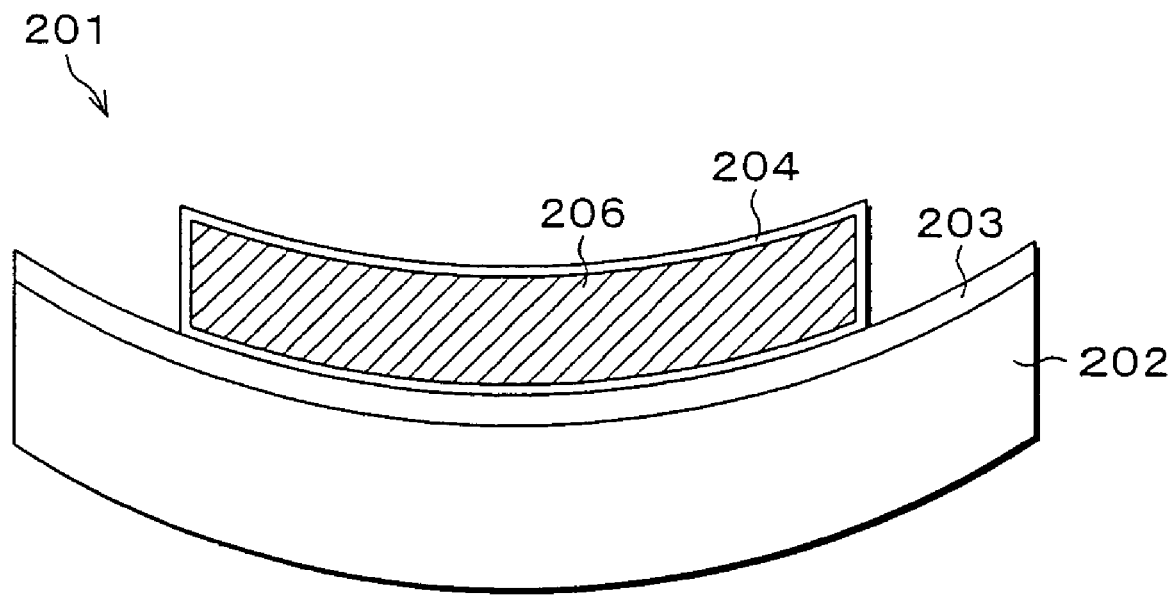
FIG. 8 is a pattern diagram showing a condition under which the high-strain-point nonalkali glass substrate according to the present invention and the single crystal silicon piece bonded thereto are curved.

The high-strain-point nonalkali glass substrate 202 and the single crystal silicon piece 206 bonded to each other are put into a furnace for the heating process, and they are warped. This state is shown in FIG. 8 as a pattern diagram. When they are exposed in a high temperature for performing the heating process under the foregoing relationship of the coefficients of thermal expansion, the high-strain-point nonalkali glass substrate 202 is warped downward in a convex direction. At this time, a portion of the single crystal silicon piece 206, that is positioned in the vicinity of the high-strain-point nonalkali glass substrate 202 bonded to the single crystal silicon piece 206 by the van der waals force, is pulled in a horizontal direction, but the high-strain-point nonalkali glass substrate 202 is warped downward in a convex direction, so that a force exerted when the single crystal silicon piece 206 is stripped from the end portion is identical to a direction in which the high-strain-point nonalkali glass substrate 202 is warped. This causes the force exerted when the single crystal silicon piece 206 is stripped of the bonded surface to be counterbalanced, so that the single crystal silicon piece 206 is not stripped. This brings about a bond. FIG. 8 shows this figure at about 600° C.

However, separation of the hydrogen ions on the hydrogen ion implantation portion 210 that is caused by hydrogen embrittlement is not brought about unless the hydrogen ion implantation portion 210 is heated at not less than 600° C. Thus, by heating the hydrogen ion implantation portion 210 at 600° C., it is possible to perform (a) the heating process for strengthening the bond strength and (b) the heating process for separating the single crystal silicon piece 206 at the same time efficiently. An example of this is as follows: when the heating process is performed at 600° C. for 30 to 60 minutes, the bond strength of the bonded surfaces is enforced, and the single crystal silicon piece 206 is divided at the hydrogen ion implantation portion 210. This state is shown in FIG. 5 and FIG. 7(g).

When evaluation of TDS (Temperature Desorption Spectroscopy) is performed in performing the heating process, it is possible to observe a condition under which the hydrogen comes off the single crystal silicon piece 206 or the surfaces of the silicon dioxide films 203 and 204 substantially above 300° C. When the hydrogen comes off, the hydrogen drastically dissipates from the hydrogen ion implantation portion 210 of the single crystal piece 206, and the single crystal silicon piece 206 is divided into the single crystal silicon thin film 205 and a single crystal silicon piece 206a, so that it is possible to obtain the single crystal silicon thin film 205 on the high-strain-point nonalkali glass substrate 202. By performing the foregoing processes, there is provided the SOI substrate 201 including the single crystal silicon thin film 205 having an approximately 40 to 200 nm thickness. It is important that a channel portion of a transistor formed within such a thickness range is completely depleted.

Note that, the foregoing description discusses the heating process performed at a single stage, but it is possible to enforce the bond strength by performing the heating process at multiple stages. Particularly, the heating process for enforcing the bond strength (temperature ranges from 300° C. to 550° C.) and the heating process for the division may be separately performed. In this case, the bond strength is enforced at not less than 300° C. as described above. Then, a first heating process for enforcing the bond strength is performed at a temperature of 300° C. to 550° C., at which the single crystal silicon piece 206 is not divided at the hydrogen ion implantation portion 210, for a short time such as not more than 15 minutes. Thereafter, a second heating process is performed at 600° C. to 700° C., so that it is possible to reduce the number of inferior products in which a film is stripped from the bonded surface and the single crystal silicon piece 206 itself is stripped after the heating process.

Further, the foregoing description shows an example where an electric furnace is used so as to perform the heating process, but it is also possible to perform the heating process by means of an instant heating anneal including a peak temperature of approximately not less than 850° C. in accordance with light (lamp) anneal such as laser. The shrinkage of the high-strain-point glass substrate 202 occurs upon heating in an electric furnace when the high-strain-point glass substrate 202 is heated above the strain point. On the other hand, rapid thermal anneal using lamp etc. or heating anneal using laser (laser anneal) prevents the shrinkage of the entire substrate, and causes an annealed portion to be heated, thereby improving the crystallization or the separating efficiency. Furthermore, it is possible to improve the throughput upon manufacturing the SOI substrate 201.

In a case where the high-strain-point nonalkali glass substrate 202 is made of material allowing transmission of visible light for example, the SOI substrate 201 manufactured in the foregoing manner is processed as follows: a thin film transistor is formed on a layer of the single crystal silicon thin film 205, so as to be used in a TFT liquid crystal display (LCD) device, a TFT organic electroluminescence (OLED: organic light emitting diode), and the like. The SOI substrate 201 of the present invention is introduced into such a display panel of active matrix driving, so that it is possible to uniform, stabilize, and improve the property of the transistor. As a result, it is also possible to integrate the driver of the active matrix, peripheral drivers, the timing controller, and the like, as a system. Further, the single crystal silicon piece 206 is bonded to a required portion, so that it is possible to cover a large size substrate.

As described above, the SOI substrate 201 of the present invention is manufactured by bonding the single crystal silicon thin film 205, obtained by the smart cut process, to the substrate, and the SOI substrate 201 is such that it is possible to obtain the sufficient bond strength even at 300° C. upon bonding. Base on such property, the high-strain-point nonalkali glass substrate 202 which is the amorphous alkali glass substrate is used as that substrate.

Thus, it is not necessary to use crystallized glass whose composition has been adjusted or heat-resistance glass, so that it is possible to manufacture the SOI substrate at low cost by using the high-strain-point nonalkali glass generally used in a liquid crystal panel based on active matrix driving, and the like. Further, since a temperature at which the heating process is performed is low, it is possible to keep the alkali metal from diffusing into a semiconductor layer by several digits. Thus, it is possible to make the silicon dioxide films 203 and 204 for preventing the dispersion thinner than conventional ones, so that it is possible to improve the throughput.

Further, the high-strain-point nonalkali glass substrate whose coefficient of thermal expansion is as high as or higher than that of the single crystal silicon at a temperature ranging from a room temperature to 700° C. is used, so that it is possible to prevent the substrate from braking up and to prevent the single crystal silicon thin film 205 from being stripped, upon performing the heating process for (a) dividing the single crystal silicon piece 206 into the single crystal silicon thin film 205 at the highest temperature of 600° C., and for (b) enforcing the bond strength between the single crystal silicon piece 206 and the high-strain-point nonalkali glass substrate 202.

The foregoing description discusses the single crystal silicon piece 206, which is the most likely to have a (100) face, but it is possible, in the same manner, to manufacture an SOI substrate, having a silicon film surface which is so flat that it is not necessary to grind the surface from the beginning, that includes other crystal orientation such as a (110) face and a (100) face.

Further, compared with the SOI substrate of the (100) face, the SOI substrate of the (110) face is such that the largest number of atoms closest to each other are disposed on the (110) face. Thus, when the single crystal silicon piece 206 is separated, the separated surface is extremely flattened, so that it is possible to reduce defective fraction of the silicon transistor formed on the SOI substrate 201.

Further, when the SOI substrate of the (111) face is used, the separated surface is identical to a cleaved surface of the single crystal silicon body, and the atoms closest to each other exist in an angle deviating a little from the (111) face. Thus, when the single crystal silicon piece 206 is separated, the separated surface is extremely flattened, so that it is possible to reduce defective fraction of the silicon transistor formed on the SOI substrate 201.

Embodiment 8

Figure 10:
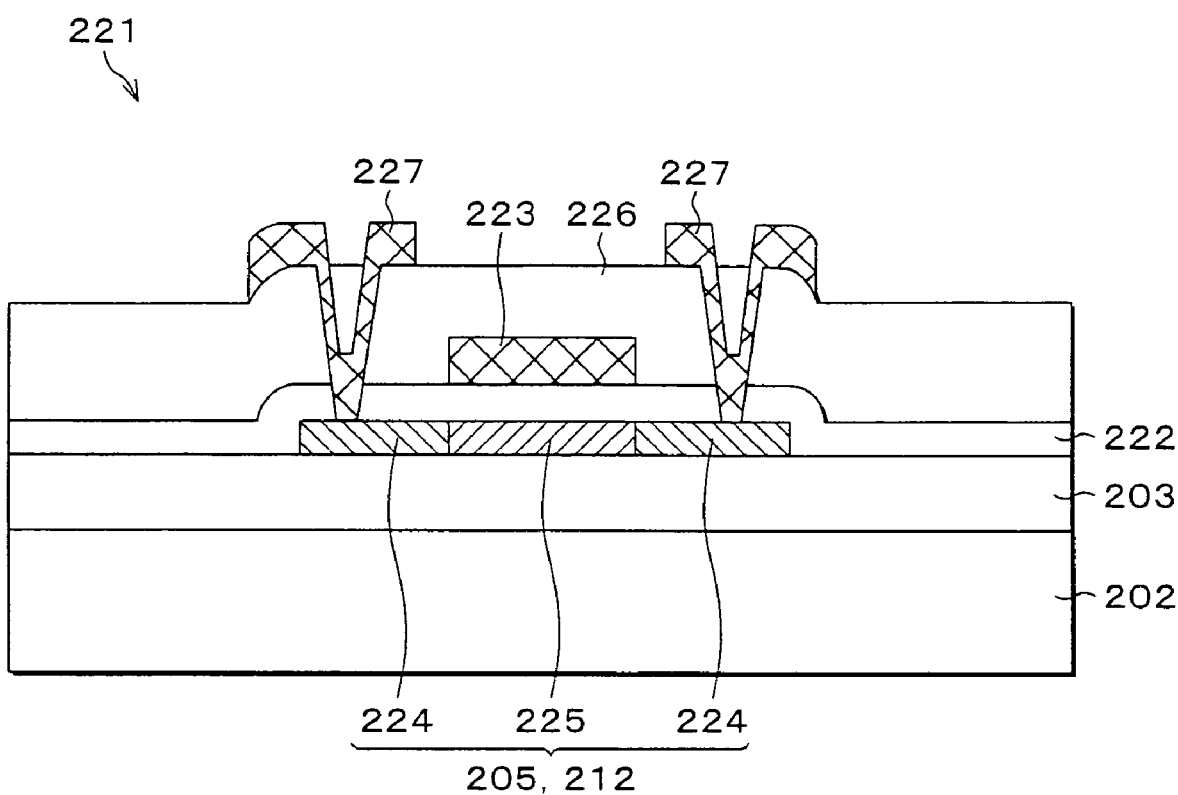
FIG. 10 is a cross sectional view showing an example of a thin film transistor manufactured based on the SOI substrate shown in FIG. 9.

The following description will discuss another embodiment of the present invention referring to FIG. 9(a) and FIG. 10.

Each of FIG. 9(a) to FIG. 9(h) shows a procedure for manufacturing an SOI substrate 211 as another embodiment of the present invention. The SOI substrate 211 is similar to the foregoing SOI substrate 201, and the same reference signs are given to corresponding portions, and description thereof is omitted. It is noteworthy that the SOI substrate 211 is such that a single crystal silicon thin film 212 and the single crystal silicon thin film 205 are formed on the same high-strain-point nonalkali glass substrate 202 as shown in FIG. 9(h).

First, as shown in FIG. 9(a) to FIG. 9(b), an insulating film 213, having an approximately 300 nm thickness, which functions as an undercoat film, is formed on the high-strain-point nonalkali glass substrate 202 in accordance with plasma chemical vapor deposition (PECVD). A top layer of the undercoat film is made of the silicon dioxide film which is superior in the hydrophilicity. Next, as shown in FIG. 9(c), an amorphous silicon film 214 having an approximately 30 to 200 nm thickness is formed in accordance with the PECVD, and dehydrogenation anneal is performed with respect to the amorphous silicon film 214 at 400° C. to 500° C., so as to dehydrogenate the amorphous silicon film 214. Thereafter, as shown in FIG. 9(d) to FIG. 9(e), an area 214a on which a TFT is to be formed using the amorphous silicon film 214 is fused and crystallized (laser crystallization) by excimer laser, so that the polycrystalline Silicon thin film 212 is formed. It is important that a thickness of the polycrystalline Silicon thin film 212 at this time corresponds to a thickness of the single crystal silicon thin film 205 formed later, for example, 40 to 200 nm.

After performing the laser crystallization, as shown in FIG. 9(e) to FIG. 9(f), a silicon film of an area 214b with which the single crystal silicon thin film 205 is bonded is removed by etching. At this time, in a case where there is concern that a surface of the polycrystalline Silicon thin film 212 is contaminated by being in contact with a photo resist, a silicon dioxide film having an approximately 30 to 100 nm thickness is formed on the surface of the polycrystalline Silicon thin film 212 before applying the photo resist. Further, if necessary, a part of the polycrystalline Silicon thin film 212 is subjected to the etching removal in a direction of thickness of the insulating film 213 so that the thickness of the single crystal silicon thin film 205 is identical to the thickness of the polycrystalline Silicon thickness 212.

Next, the single crystal silicon piece 206 in which the hydrogen ions have been implanted is cut into a shape so as to cover the area 214b that has been subjected to the etching removal, and as shown in FIG. 9(g) to FIG. 9(h), the single crystal silicon piece 206 is bonded to the area 214b having been subjected to the etching removal as in FIG. 7(f) to FIG. 7(g), and a heating process is performed at approximately 600° C., so that the single crystal silicon piece 206 is divided at the hydrogen ion implantation portion 210. This brings about the single crystal silicon thin film 205.

Even when there are both thin films 205 and 212, or when there is only the single crystal silicon thin film 205 like the SOI substrate 201, a process for forming the TFT is as shown in FIG. 10. FIG. 10 is a cross sectional view of a thin film transistor 221 using the SOI substrate 211 as an example. The following description briefly illustrates a procedure for manufacturing the thin film transistor 221. First, the thin films 205 and 212 are subjected to patterning corresponding to a size of a formed transistor. Next, a gate insulating film 222 is formed. As the gate insulating film 222, a film made of mainly silicon dioxide is the most appropriate, and its thickness is 30 to 200 nm for example. The gate insulating film 222 becomes a film inferior in the density when the gate insulating film 222 is formed at 200° C. to 400° C., so that densifying anneal is performed with respect to the gate insulating film 222 at 600° C. after forming the film. The densifying anneal also restore a crystalline substance of the single crystal silicon film, in which the hydrogen ions have been implanted, to a crystalline substance having no hydrogen ion.

Thereafter, a gate electrode film 223 having an approximately 300 nm thickness is formed, and patterning is performed with respect to the gate electrode film 223 so as to be appropriately shaped. Further, the gate electrode film 223 is used as a mask, and ions are implanted into the thin films 205 and 212, so that an $n^+$ or $p^+$ area 224 is formed. At this time, in the present invention, the thickness of the single crystal silicon thin film 205 is set to not more than 200 nm, so that it is possible to completely deplete the channel area 225.

Next, after forming an interlayer insulating film 226 having an approximately 400 nm thickness, a hole is provided in such a position that contact with a source/drain electrode is allowed. Thereafter, a source/drain metal film 227 having an approximately 400 nm thickness is formed, and patterning is performed with respect to the source/drain metal film 227. Depending on cases, an n type MOSTFT is arranged so as to have an LDD structure upon implanting ions, thereby obtaining high reliability.

In the thin film transistor 221 manufactured in this manner, a portion in which the single crystal silicon thin film 205 is obtained by bonding and dividing is such that a silicon film functioning as a channel portion is single crystal silicon film, so that there is no electric conduction from a grain boundary that is recognized in the polycrystalline Silicon thin film 212, thereby obtaining the preferable property. Further, the properties of all the transistors on the single crystal silicon thin film 205 are uniformed. Thus, in a case of using the foregoing portion in an LCD display, this is used as a source driver portion or a peripheral circuit. On the other hand, a portion of the thin film transistor 221 that is formed using the polycrystalline crystal silicon thin film 212 is used as a picture element or a gate driver portion that are comparatively inferior in the property.

According to a result of manufacturing that is given by the inventor, the single crystal silicon transistor is such that: in the NMOSTFT, electric field effect mobility is 500 $cm^2$/V·sec, a threshold value is 1.0V, an OFF current is $1\times10^{-12}$ A, and in a PMOSTFT, the electric field effect mobility is 250 $cm^2$/V·sec, the threshold value is −1.0V, the OFF current is $1\times10^{-12}$ A, so that thin film transistors each of which is superior in the uniformity are obtained.

By the foregoing arrangement, it is possible to obtain the SOI substrate 211 in which a height of the area 214b of the bonded single crystal silicon thin film 205 and a height of the area 214a of the polycrystalline Silicon thin film 212 are substantially equal. As a result, it is possible to perform processes thereafter, including the island etching, with respect to the areas 214a and 214b at the same time. Further, there are formed a transistor and a circuit whose step is small, so that this method is advantageous in controlling a thickness of a cell in a case of a liquid crystal panel.

Embodiment 9

The following description will discuss one embodiment of the present invention referring to FIG. 11(a) to FIG. 11(h) and FIG. 16.

Figure 11:
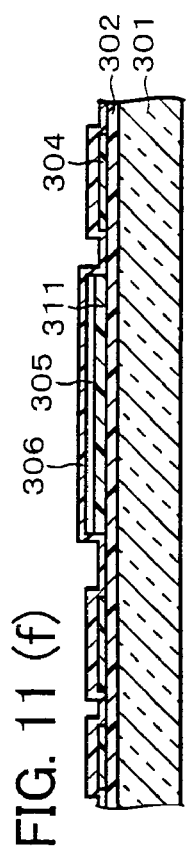
FIG. 11(a) to FIG. 11(h) are cross sectional views each of which shows an example of a semiconductor device according to still another embodiment of the present invention.
Figure 11:
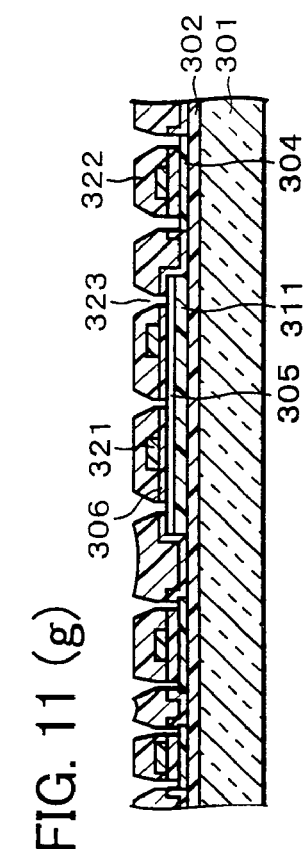
Figure 11:
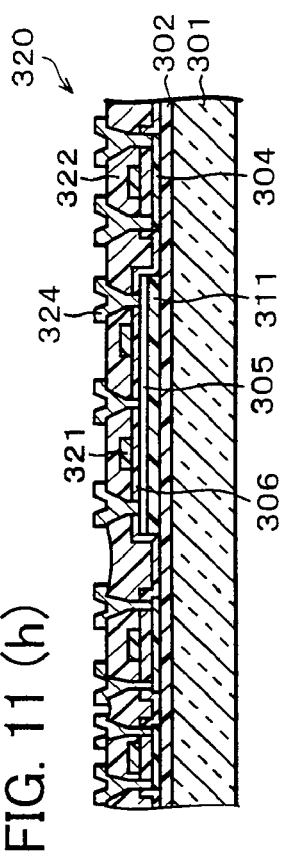
Figure 11:
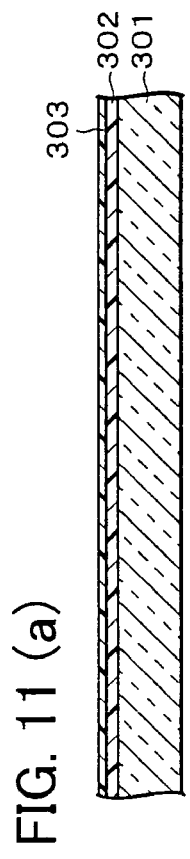
Figure 11:
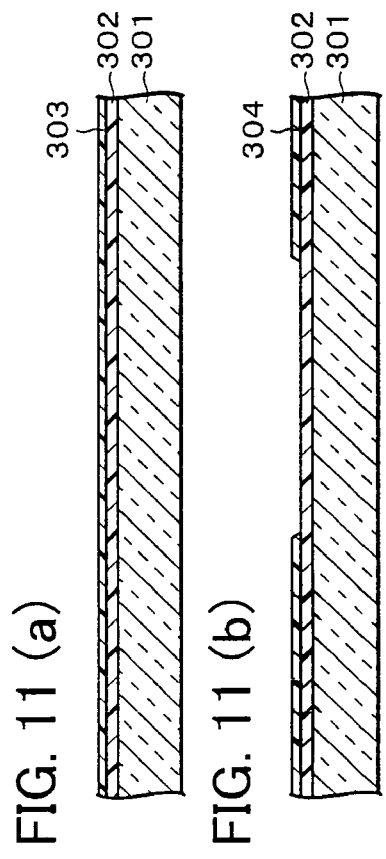
Figure 11:
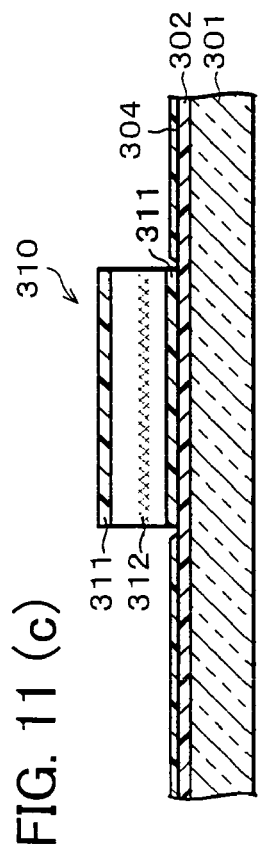
Figure 11:
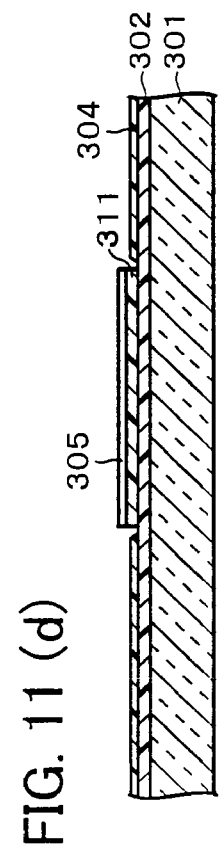
Figure 11:
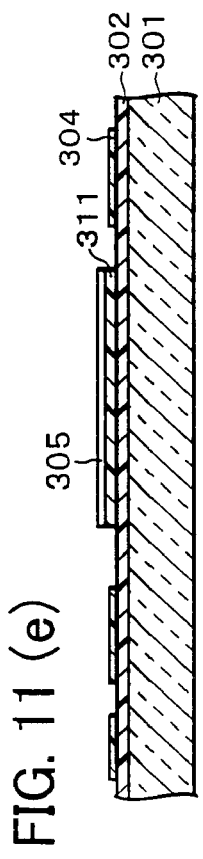

Each of FIG. 11(a) to FIG. 11(h) shows an example of a manufacturing process of an active matrix substrate 320 (semiconductor device) according to the present embodiment. As shown in FIG. 11(h), the active matrix substrate 320 includes: an insulating substrate 301; $SiO_2$ (oxide silicon) films 302 and 311; a polycrystalline Si thin film 304; a single crystal Si thin film 305; a gate oxide film 306; a gate electrode 321; an interlayer insulating film 322; and a metal wiring 324. The active matrix substrate 320 further includes a thin film transistor (TFT) which functions as a switching element. The active matrix substrate 320 is used in a liquid crystal display device an the like for example.

The insulating substrate 301 is made of high-strain-point glass. Here, as the insulating substrate 301, code 1737 (trade name, made by Corning Incorporated), which is a high-strain-point glass made of alkaline earth-alumino boro-silicated glass, is used.

Note that, the material for the insulating substrate 301 is not particularly limited, but it is possible to use the following materials: a barium-alumino boro-silicated glass, a boro-silicated glass, an alkaline earth-zinc-lead-alumino boro-silicated glass, and an alkaline earth-zinc-alumino boro-silicated glass, each of which is a high-strain-point glass.

The $SiO_2$ film 302 made of $SiO_2$ is formed on a substantially entire surface of the insulating substrate 301. A thickness of the $SiO_2$ film 302 is approximately 100 nm.

The polycrystalline Si thin film 304 and the $SiO_2$ film 311 are formed on the $SiO_2$ film 302. The polycrystalline Si thin film 304 is formed so as to be in an island shape, and its thickness is approximately 50 nm. The $SiO_2$ film 311 is formed on the $SiO_2$ film 302 so as not to be positioned in an area of the polycrystalline Si thin film 304 so as to be in an island shape, and its thickness is approximately 200 nm. The single crystal Si thin film 305 is formed on the $SiO_2$ film 311 so as to have the same shape as the $SiO_2$ film 311 so as to be in an island shape. A thickness of the single crystal Si thin film 305 is approximately 50 nm.

An area of the polycrystalline Si thin film 304 and an area of the single crystal Si thin film 305, that are adjacent to each other, are separated from each other by at least 0.3 μm, preferably not less than 0.5 μm.

This prevents metal atoms, such as Ni, Pt, Sn, and Pd that are used in a producing process of the polycrystalline Si thin film 304 described later, from diffusing into the single crystal Si area, thereby stabilizing its property.

The gate oxide film 306 made of $SiO_2$ is formed on an entire surface constituted of surfaces of the $SiO_2$ film 302, the polycrystalline Si thin film 304, and the single crystal Si thin film 305. A thickness of the gate oxide film 306 is approximately 60 nm.

The gate electrode 321 is formed on the gate oxide film 306 on surface of the island-shaped polycrystalline Si thin film 304 and single crystal Si thin film 305. The gate electrode 321 is constituted of the polycrystalline Si and W silicide. Note that, materials for the gate electrode 321 are not particularly limited, but the polycrystalline Si, other silicide or polycide, high melting point metal, and the like may be used for example.

The interlayer insulating film 322 made of $SiO_2$ is formed on an entire surface of the gate oxide film 306 having the gate electrode 321. However, the interlayer insulating film 322 has a contact hole 323 (see FIG. 11(g)) as an opening, and the metal wiring 324 made of metal such as AlSi is formed on the contact hole 323. The metal wirings 324 extends from surfaces of the island-shaped polycrystalline Si thin film 304 and single crystal Si thin film 305.

Further, the active matrix substrate 320 includes SiNx (silicon nitride) (not shown), a resin flattening film, a via hole, a transparent electrode, and the like, that are used for liquid crystal display. Further, there are formed a timing controller and a microprocessor etc. in which a driver and a TFT used for display are formed in the polycrystalline Si thin film area, and the timing controller controls timing at which driving is performed by the driver. Of course, the driver may be made of the single crystal Si. In this case, the performance is further improved, and the device area is made smaller, the preferable unity is obtained, and a low power consumption is realized, but the cost is increased, so that selection is made according to purpose for use.

The following description will discuss the manufacturing method of the active matrix substrate 320 referring to FIG. 11(a) to FIG. 11(h).

First, the $SiO_2$ film 302 having an approximately 100 nm thickness is deposited on an entire surface of the insulating substrate 301 made of code 1737 (made by Corning Incorporated) in accordance with plasma chemical vapor deposition (hereinbelow referred to as P-CVD) using TEOS (Tetra Ethoxy Silane, namely, $Si (OC_2H_5)_4$) and $O_2$ (oxygen).

Next, an amorphous Si film 303 having an approximately 50 nm thickness is deposited on the $SiO_2$ film 302 in accordance with the P-CVD using $SiH_4$ gas (FIG. 11(a)).

Further, excimer laser is irradiated to heat the amorphous Si film 303 so that the amorphous Si film 303 is crystallized, so as to grow a polycrystalline Si layer, so that the polycrystalline Si thin film 304 is formed.

Note that, the heating process of the amorphous Si film 303 for forming the polycrystal Si thin film 304 is not limited to the irradiation heating based on the excimer laser, but may be irradiation heating based on other laser, or may be a heating process using a furnace for example. Further, in order to promote the growth of the crystal, at least one of Ni, Pt, Sn, and Pd may be added to the amorphous Si film 303.

Next, a predetermined area of the polycrystalline Si thin film 304 is subjected to etching removal (FIG. 11(b)).

While, the single crystal Si substrate 310 is prepared. In the single crystal Si substrate 310, the $SiO_2$ film 311 having an approximately 200 nm thickness is formed by oxidizing a surface of the single crystal Si substrate 310 in advance or depositing an oxide film ($SiO_2$ film) on the surface. Further, in the single crystal Si substrate 310, there is provided a hydrogen ion implantation portion 312 obtained by implanting hydrogen ions of a dose amount of not less than $10^{16}/cm^2$, here, a dose amount of $5\times10^{16}/cm^2$, at predetermined energy (here, approximately 24 keV), and boron of $3\times10^{15}/cm^{-3}$ has been doped. In accordance with impurities of the boron density, a threshold of the N channel TFT is set to an appropriate value.

Further, the single crystal Si substrate 310 is cut, in accordance with dicing or anisotropic etching such as KOH, into a shape smaller, by at least 0.3 micrometer, preferably not less than 0.5 micrometer, than the predetermined area of the polycrystalline Si thin film 304 that has been removed by etching.

Next, after both the substrate having the polycrystalline Si thin film 304 and the single crystal Si substrate 310 are subjected to SC-1 cleaning so as to remove particles and activate the surfaces, a surface of the cut single crystal Si substrate 310 that faces the hydrogen ion implantation portion 312 is bonded (FIG. 11(c)) to the area having been subjected to the etching removal (FIG. 11(b)) at a room temperature. The SC-1 cleaning is one of cleaning methods generally called RCA cleaning, and in the SC-1 cleaning, rinsing solution is constituted of ammonia, hydrogen peroxide, and pure water.

Thereafter, a heating process is performed with respect to the bonded substrates at 300° C. to 600° C., here, at approximately 550° C., and a temperature of the hydrogen ion implanted layer 312 of the single crystal Si substrate 310 is increased to a temperature, above the hydrogen dissociation temperature from Si, so that the single crystal Si substrate 310 is divided at the hydrogen ion implantation portion 312 in a cleaving manner.

Note that, the heating process is not particularly limited, but the temperature of the hydrogen ion implantation portion 312 of the single crystal Si substrate 310 may be increased to not less than the temperature, at which hydrogen is separated from Si, in accordance with laser irradiation or a lamp anneal including a peak temperature of approximately not less than 700° C.

Further, a damaged layer of the single crystal Si substrate surface that is left on the insulating substrate 301 after the division is removed by isotopic plasma etching or wet etching, here, by performing light etching of approximately 20 nm based on the wet etching using buffered Hydro fluoric acid. Thus, the polycrystalline Si thin film 304 and the single crystal Si thin film 305 each of which has an approximately 50 nm thickness are provided on the insulating substrate 301 (FIG. 11(d)).

Note that, when the single crystal Si substrate 310 is thermally cleaved at approximately 550° C. after the single crystal Si substrate 310 is heated at 300° C. to 350° C. for approximately 30 minutes after bonding the substrates at a room temperature, the occurrence of stripping is reduced upon the cleavage.

Further, at this stage, it is possible to obtain sufficient bond strength between the Si and the substrate, but in order to further improve the bond strength, the lamp anneal is performed at approximately 800° C. for a minute, after performing the foregoing cleavage. This process may be performed also as activation of the implanted impurities of the source/drain.

Next, a portion which functions as an activated area of the device is left, and unnecessary portions of Si thin films 304 and 305 are removed by etching, so that island patterns are obtained (FIG. 11(e)).

Next, a $SiO_2$ film ($SiO_2$ film for etching back) having an approximately 350 nm thickness is deposited in accordance with the P-CVD using mixed gas constituted of TEOS and $O_2$ (oxygen). The deposited $SiO_2$ film is etched back by approximately 400 nm in accordance with RIE (reactive ion etching) which is anisotropic etching. Thereafter, the gate oxide film 306 ($SiO_2$ film) having an approximately 60 nm thickness is formed in accordance with the P-CVD using mixed gas constituted of $SiH_4$ and $N_2O$ (FIG. 11(f)).

At this time, when a space between patterns of the formed polycrystalline Si thin film 304 and single crystal Si thin film 305 is small, a step therebetween is filled, and when the space is large, side walls are formed.

Thereafter, the forming is performed in the same process as in a well-known forming process of a p-Si (polycrystalline Silicon) type TFT matrix substrate. That is, after the gate electrode 321 constituted of polycrystalline Si, silicide, or polycide is formed, $P^+$ and $B^+$ ions are implanted, and the interlayer insulating film ($SiO_2$ film) 322 is deposited, and the contact hole 323 is formed (FIG. 11(g)). Thereafter, the metal (AlSi) wiring 324 is formed in the contact hole 323 (FIG. 11(h)).

Note that, the single crystal Si thin film 305 and the polycrystalline Si thin film 304, that have been formed on the insulating substrate 301, are subjected to patterning based on etching, so as to form a MOS transistor, and $P^+$ ions of not less than $10^{15}/cm^2$ are implanted into at least one part of a source/drain area of an N type MOS transistor and a P type MOS transistor. Thereafter, a heating process is performed in accordance with RTA (Rapid Thermal Anneal, hereinbelow referred to as RTA), laser, and a furnace etc., and gettering of metal atoms is performed with respect not only to the polycrystalline Si thin film 304 area, but also to the single crystal Si thin film 305 area, thereby obtaining a TFT in which its property non-uniformity is little and its property is stable.

Next, there are sequentially formed SiNx (silicon nitride), a resin flattening film, a via hole, and a transparent electrode that are used for liquid crystal display. Further, a driver and a TFT for display are formed in the polycrystalline Si thin film 304 area. Then, the timing controller, a microprocessor, and the like are formed in the single crystal Si thin film 305 area.

Incidentally, after bonding the single crystal Si substrate 310 with the insulating substrate 301, when the single crystal Si substrate 310 is cleaved from the insulating substrate 301 (see FIG. 11(c) and FIG. 11(d)), whether the bonding and the cleavage are performed in a preferable manner or not depends on which material is used to constitute the insulating substrate 301.

The following description will discuss normalized linear expansion ($\Delta L/L$) of (a) material for the single crystal Si substrate 310 (Si: Silicon), (b) material for the insulating substrate 301 (code 1737 (made by Corning Incorporated)), and (b) code 7059 (made by Corning Incorporated) made of barium-boro-silicated glass, referring to FIG. 16. Note that, the normalized linear expansion (hereinbelow referred to as linear expansion) is variation (ppm) of the length that is caused by temperature variation. That is, L is an original length, and $\Delta L$ is an expanded (varied) length.

Figure 16:
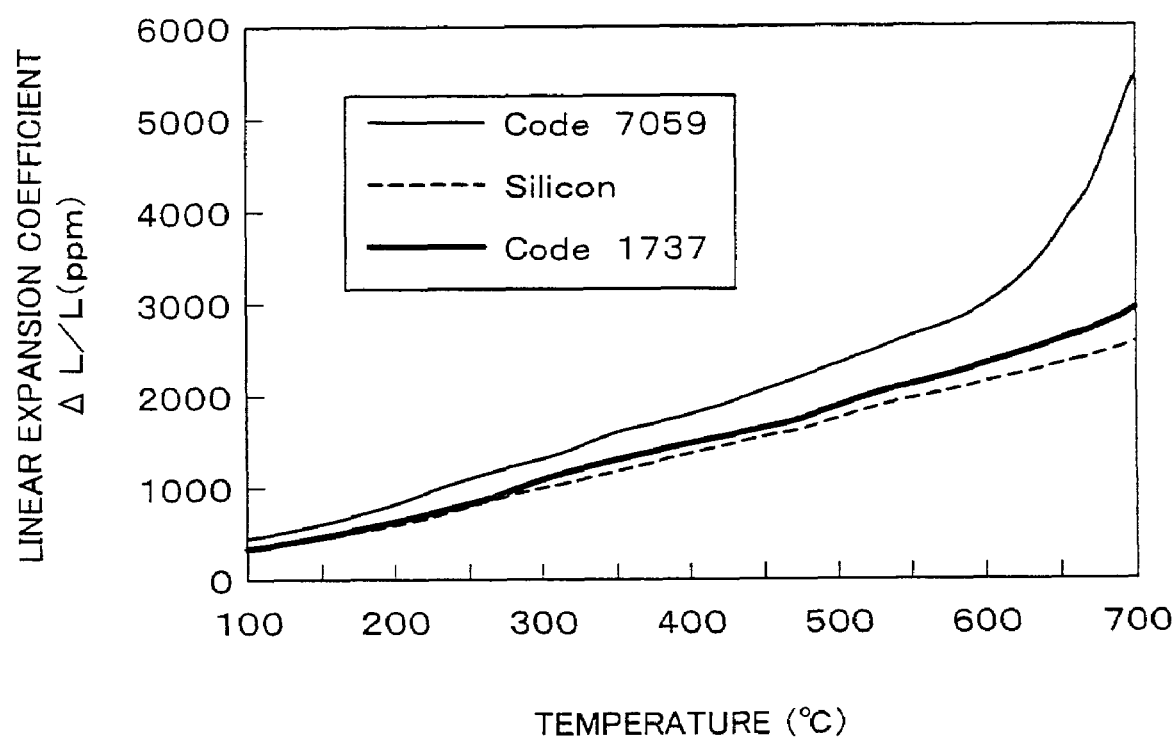
FIG. 16 is a graph showing linear expansion of (a) Si which is a material for a single crystal Si substrate, (b) code 1737 which is a material for an insulating substrate, and (c) code 7059 made of barium-boro-silicated glass.

Thus, the code 1737 is such that a linear expansion coefficient ($°C.^{-1}$) is substantially constant by the time it is heated at approximately 600° C., so that there is little difference between the code 1737 and the Si in terms of the linear expansion. Within a range from a room temperature (approximately 25° C. (FIG. 16 illustrates a case of not less than approximately 100° C.)) to approximately 600° C., the difference in the linear expansion is within approximately 250 ppm.

While, code 7059 is such that the linear expansion coefficient suddenly increases at approximately 600° C., so that the difference in the linear expansion between code 7059 and the Si is increased to approximately 800 ppm at approximately 600° C.

Thus, in a case of using code 7059 as the insulating substrate 301, even if the substrates could be bonded to each other as in a case of using code 1737, a success rate of the cleavage is extremely low. That is, when the cleavage is performed, damages of the single crystal Si substrate 310, stripping of the bonded interface, or deficiency in a crystal is brought about.

Thus, the insulating substrate 301 is made of material which is bonded generally at a temperature ranging from not less than a room temperature to not more than approximately 600° C., here, the insulating substrate 301 is made of material such that the linear expansion difference with respect to material (Si) of the single crystal Si substrate 310 is not more than approximately 250 ppm for temperature difference between room temperature to 600° C. Here, the linear expansion is normalized.

Further, consideration is given on a stress exerted on the bonded interface of the single crystal Si thin film 305. Here, a Raman shift of the single crystal Si thin film 305 was measured by a microscopic Raman measuring equipment (for example, NR-1800U made by JASCO Corporation). In this case, deviation of peak position of Raman shift was $520.52\pm0.12$ cm$^{-1}$ ($\sigma$=0.12 cm$^{-1}$). Thus, it is found that no stress is exerted on the single crystal Si thin film 305.

In a case where a crystal is grown by using laser, the deviation of peak position of Raman shift is generally such that a large stress of approximately 3 to 5 cm$^{-1}$ (corresponding to $10^9$ Pa) remains.

While, the single crystal Si substrate 310 is bonded to the insulating substrate 301 such as a glass substrate via the $SiO_2$ film at a room temperature, so that it is possible to substantially vanish the stress exerted on the bonded Si interface. That is, the deviation of peak position of Raman shift is set to be within $520.5\pm1$ (519.5 to 521.5) cm$^{-1}$, so that it is possible to substantially vanish the stress exerted on the bonded Si interface.

Thus, it is possible to prevent (a) drop and non-uniformity in the mobility that is caused by distortion of the Si crystal brought about by non-uniformity and difference in the stress exerted on the interface, or (b) deficiency in the interface and an interface fixed charge brought about in combination with the deficiency, and (c) a threshold shift and threshold non-uniformity that are caused by a localized state in the interface, and (d) drop in the property stability, and the like, without fail, compared with a TFT in a case where crystal growth is performed with respect to the Si film by using laser.

Note that, in the present embodiment, in a case where the thickness of the single crystal Si thin film 305 is increased by enlarging implantation energy of the hydrogen atom so as to make a peak position of the hydrogen atom deeper, when the thickness is 50 nm to 100 nm, the condition does not largely change, but when the thickness is 300 nm to 600 nm, the channel portion is not completely depleted, so that an S value (sub-threshold coefficient) of the TFT gradually increases, and an OFF current largely increases.

Thus, although depending on the doping density of impurities in the channel portion, it is necessary to set the thickness of the single crystal Si thin film 305 to not more than 600 nm, preferably not more than 500 nm, more preferably not more than 100 nm, taking coverage with respect to the non-uniformity into consideration.

Further, a TFT formed in a conventional polycrystalline Silicon area was such that its mobility (carrier mobility) was approximately 100 cm$^2$/V·sec (N channel). On the other hand, in the liquid crystal display active matrix substrate 320, the TFT formed in the single crystal Si area is such that the mobility is approximately 550 cm$^2$/V·sec (N channel).

Moreover, in the liquid crystal display active matrix substrate 320, not only the driver but also devices formed in the area of the polycrystalline Si thin film 304 require signals and power supply voltages of 7 to 8V. On the other hand, the timing controller, the microprocessor, and the like, each of which is a device formed in the area of the single crystal Si thin film 305, stably operate at 3.3V.

Note that, in the liquid crystal display active matrix substrate 320, transistors are formed in the area of the polycrystalline Si thin film 304 and in the area of the single crystal Si thin film 305, so that transistors, identical to each other in terms of a conductivity type, that are formed in the respective areas, are different from each other, depending on the areas, in terms of at least one of the mobility, the sub-threshold coefficient, and a threshold value. Thus, it is possible to form a transistor, corresponding to a required property, in a suitable area.

Further, in the liquid crystal display active matrix substrate 320, integrated circuits are formed in the area of the polycrystalline Si thin film 304 and in the area of the single crystal Si thin film 305, so that it is possible to form integrated circuits, corresponding to a required property, in a suitable area, and it is possible to provide integrated circuits, formed in the respective areas, that are different from each other in terms of the performance such as an operation speed and an operation power supply voltage. That is, it is possible to design the integrated circuits different from each other, depending on the areas, in terms of at least one of the gate length, the thickness of the gate oxide film, the power supply voltage, and the logic level.

In the liquid crystal display active matrix substrate 320, integrated circuits are formed in the area of the polycrystalline Si thin film 304 and in the area of the single crystal Si thin film 305, so that it is possible to apply design rules, different from each other depending on the respective areas, with respect to the integrated circuits formed in the respective areas. This is based on the following reason: there is no crystal grain boundary in a single crystal portion particularly in a case of a short channel length, so that the non-uniformity of the TFT property hardly increases, but in the polycrystal portion, the influence of the crystal grain boundary rapidly increases the non-uniformity of the TFT property, so that it is necessary to change the design rules with respect to respective portions. Thus, it is possible to form an integrated circuit, corresponding to the design rules, in a suitable area.

Note that, in the present invention, a size of the obtained single crystal Si area is limited due to a wafer size of an LSI manufacturing equipment, but this size is sufficient to form (a) a high speed logic in which high speed, low power consumption, and less non-uniformity are required, (b) a timing generator, a high-speed DAC (with current buffer), and the like.

Further, the thickness of the single crystal Si thin film 305 and the thickness of the polycrystalline Si thin film 304 are substantially equal to each other.

Thus, it is possible to perform the processes thereafter, including the island etching, at the same time, so that it is possible to form a transistor or a circuit whose step is small. Thus, this is advantageous in controlling a thickness of a cell in case of a liquid crystal panel for example.

Incidentally, in the active matrix substrate 320, a gate length of a TFT formed in a polycrystalline Si area (polycrystalline Si thin film 304) is set to 5 micrometer, and a gate length of a TFT formed in a single crystal Si area (single crystal Si thin film 305) is set to 0.8 micrometer. A gate oxide film thickness of the TFT formed in the polycrystalline Si area is set to 80 nm, and a gate oxide film thickness of the TFT formed in the single crystal Si area is set to 50 nm. When the TFTs are operated at power supply voltages of 8V and 3V respectively, the operation is stabilized.

While, a TFT whose gate length is 0.8 micrometer is formed in the polycrystalline Si area, and is operated at 3V, the TFT property varies and the substrate lacks in the withstand pressure between a source and a drain, so that unusable substrates tend to be manufactured.

Further, a TFT whose gate length is 1.5 micrometer is formed in the polycrystalline Si area, and is operated at 3V, there are practical problems in a threshold voltage and non-uniformity thereof.

Embodiment 10

The following description will discuss another embodiment of the present invention referring to FIG. 12(a) to FIG. 12(h). Note that, the same reference signs are given to components having the same functions as the components in Embodiment 9, and description thereof is omitted.

Each of FIG. 12(a) to FIG. 12(h) shows an example of a manufacturing method of an active matrix substrate 330 (semiconductor device) according to the present embodiment. As shown in FIG. 12(h), the active matrix substrate 330 includes: an insulating substrate 301; $SiO_2$ (silicon oxide) films 332, 311, and 335; a polycrystalline Si thin film 337; a single crystal Si thin film 334; a gate oxide film 338; a gate electrode 321; an interlayer insulating film 322; and a metal wiring 324. The active matrix substrate 330 further includes a thin film transistor (TFT) which functions as a switching element.

The $SiO_2$ film (first $SiO_2$ film) 332 is formed on a substantially entire surface of the insulating substrate 301 as in Embodiment 9. A thickness of the $SiO_2$ film 332 is approximately 350 nm.

The $SiO_2$ film (insulating film) 335 and the $SiO_2$ film 311 are formed on the $SiO_2$ film 332. A thickness of the $SiO_2$ film 335 is approximately 100 nm. The $SiO_2$ film 311 is formed on the $SiO_2$ film 332 so as not to be positioned in an area of the polycrystalline Si thin film 335 so as to be in an island shape, and its thickness is approximately 200 nm.

The polycrystalline Si thin film 337 is formed on the $SiO_2$ film 335 so as to be in an island shape. A thickness of the polycrystalline Si thin film 337 is approximately 50 nm.

In an area except for an area of the polycrystalline Si thin film 337, a concaved portion 333 (see FIG. 12(a)) having an approximately 150 nm depth is formed in the $SiO_2$ film 332. In the concaved portion 333, there are formed the $SiO_2$ film 311 and the single crystal Si thin film 334, having the same shape as the $SiO_2$ film 311, which is provided on the $SiO_2$ film 311 so as to be in an island shape.

An area of the polycrystalline Si thin film 337 and an area of the single crystal Si thin film 334 are separated from each other by at least 0.3 µm, preferably not less than 0.5 µm. Thus, it is possible to prevent metal atoms such as Ni, Pt, Sn, and Pd from diffusing into the single crystal Si area.

The gate oxide film 336 is formed so as to cover entire surfaces of the $SiO_2$ film 332, the polycrystalline Si thin film 337, and the single crystal Si thin film 334. A thickness of the gate oxide film 336 is approximately 60 nm.

The gate electrode 321 is formed on the gate oxide film 336 on upper surfaces of the island-shaped polycrystalline Si thin film 337 and single crystal Si thin film 334.

Further, the interlayer insulating film 322, a contact hole 323 (see FIG. 12(g)), and the metal wiring 324 are formed as in the active matrix substrate 320. Further, there are formed an SiNx (silicon nitride), a resin flattening film, a via hole, and a transparent electrode that are used for liquid-crystal display. In the polycrystalline Si thin film area, a driver and a TFT used for display are formed. In the single crystal Si thin film area, there are formed a timing controller and a microprocessor.

The following description will discuss a manufacturing method of the active matrix substrate 330 referring to FIG. 12(*a*) to FIG. 12(*h*).

First, the SiO$_2$ film 332 having an approximately 350 nm thickness is deposited on an entire surface of the insulating substrate 301 constituted of code 1737 (made by Corning Incorporated) in accordance with P-CVD using mixed gas constituted of TEOS (Tetra Ethoxy Silane, namely, Si(OC$_2$H$_5$)$_4$) and O$_2$ (oxygen). Further, a predetermined area of the SiO$_2$ film layer 332 is etched by approximately 150 nm, so as to form the concaved portion 333 (FIG. 12(*a*)).

While, the single crystal Si substrate 310 is prepared. On the single crystal Si substrate 310, an SiO$_2$ film 311 having an approximately 200 nm is formed by oxidizing a surface of the single crystal Si substrate 310 in advance or depositing an oxide film (SiO$_2$ film) on the surface. Further, the single crystal Si substrate 310 doped with $3\times10^{15}/cm^{-3}$ boron includes a hydrogen ion implantation portion 312 obtained by implanting hydrogen ions of a dose amount of $5\times10^{16}/cm^2$ at predetermined energy.

Further, the single crystal Si substrate 310 is cut into a shape smaller, by at least 0.3 μm, preferably not less than 0.5 μm, than the concaved portion 333, in accordance with dicing or anisotropic etching such as KOH.

Next, after both the insulating substrate 301 having the concaved portion 333 and the cut single crystal Si substrate 310 are subjected to SC-1 cleaning so as to remove particles and activate the surfaces, a surface of the single crystal Si substrate 310 which faces the hydrogen ion implantation portion 312 is bonded to the concaved portion 333 at a room temperature (FIG. 12(*b*)).

Thereafter, a heating process is performed with respect to the bonded substrates at 300° C. to 600° C., here, at approximately 550° C., and a temperature of the hydrogen ion implantation portion 312 of the single crystal Si substrate 310 is increased to a temperature, above the hydrogen dissociation temperature from Si. Thus, the single crystal Si substrate 310 is divided at the hydrogen ion implantation portion 312 in a cleaving manner.

Further, a damaged layer of a surface of the single crystal Si substrate 310 that is left on the insulating substrate 301 after the division is removed by isotopic plasma etching or wet etching, here, by performing light etching of approximately 10 nm based on the wet etching using buffered Hydro fluoric acid. Thus, the polycrystalline Si thin film 343 having an approximately 50 nm thickness is provided on the insulating substrate 301 (FIG. 12(*c*)).

Thereafter, an SiO$_2$ film 335 having an approximately 100 nm thickness is deposited on a substantially entire surface of the insulating substrate 301 in accordance with P-CVD using mixed gas constituted of SiH$_4$ and N$_2$O. Further, an amorphous Si film 336 having an approximately 50 nm thickness is deposited on a substantially entire surface of the SiO$_2$ film 335 in accordance with the P-CVD using SiH$_4$ gas (FIG. 12(*d*)).

Further, excimer laser is irradiated to heat the amorphous Si film 336 so that the amorphous Si film 336 is crystallized, so as to grow a polycrystalline Si layer, so that the polycrystalline Si thin film 337 is formed. This heating process improves the bond strength of the single crystal Si thin film 334.

Next, an unnecessary portion of the polycrystalline Si thin film 337 and at least portions of the single crystal SiO$_2$ thin film 335 that are position on the single crystal Si thin film 334 are removed by etching. Thereafter, an active area of the device is left, and unnecessary portions of the Si thin film are removed by etching, so that an island pattern is obtained (FIG. 12(*e*)).

Further, an SiO$_2$ film having an approximately 350 nm thickness is deposited in accordance with P-CVD using mixed gas constituted of TEOS and O$_2$. The deposited SiO$_2$ film is etched back by approximately 400 nm in accordance with RIE which is anisotropic etching. Thereafter, the SiO$_2$ film 338 having an approximately 60 nm thickness is formed in accordance with the P-CVD using mixed gas constituted of SiH$_4$ and N$_2$O (FIG. 12(*f*)).

At this time, when a space between patterns of the formed polycrystalline Si thin film 334 and single crystal Si thin film 337 is small, a step therebetween is filled, and when the space is large, side walls are formed.

Thereafter, as in Embodiment 9, the gate electrode 321 and the interlayer insulating film (SiO$_2$ film) 322 are formed, and the metal wiring 324 is formed in the contact hole 323 (FIG. 12(*h*)) after opening the contact hole 323 (FIG. 12(*g*)).

Here, an N channel TFT formed in a conventional polycrystalline Silicon area was such that its mobility was approximately 100 cm$^2$/V·sec. On the other hand, in the liquid crystal display active matrix substrate 330, the N channel TFT formed in the single crystal Si area is such that the mobility is approximately 550 cm$^2$/V·sec.

In the active matrix substrate 330, not only the driver but also devices formed in the area of the polycrystalline Si thin film 337 require signals and power supply voltages of 7 to 8V. On the other hand, the timing controller which is a device formed in the area of the single crystal Si thin film 334 stably operates at 3.3V.

Embodiment 11

Figure 13:
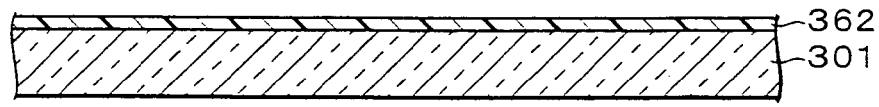
FIG. 13(a) to FIG. 13(f) are cross sectional views each of which shows an example of a semiconductor device according to further still another embodiment of the present invention.
Figure 13:
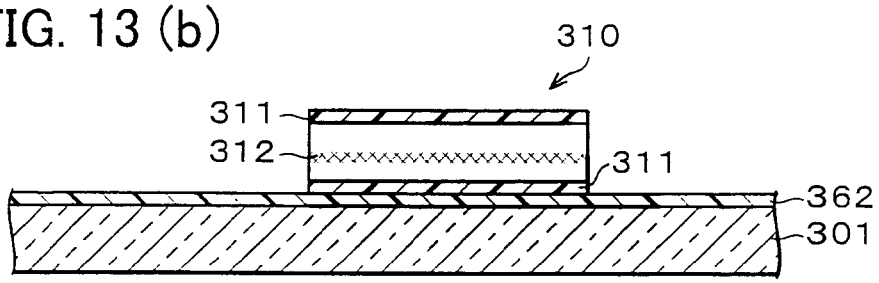
Figure 13:
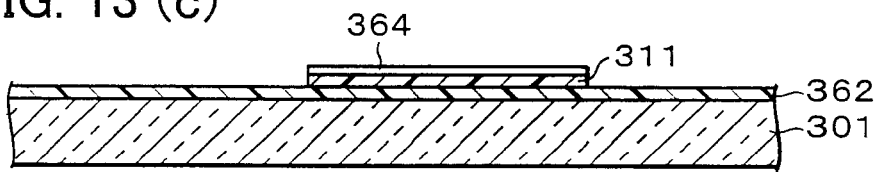
Figure 13:
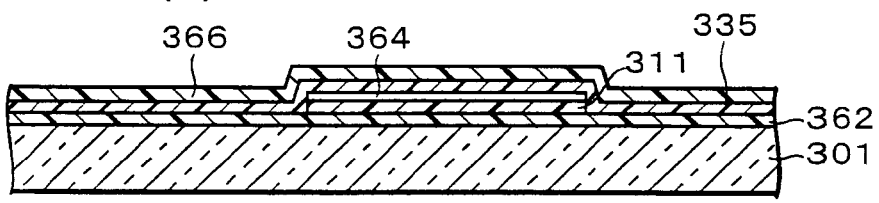
Figure 13:
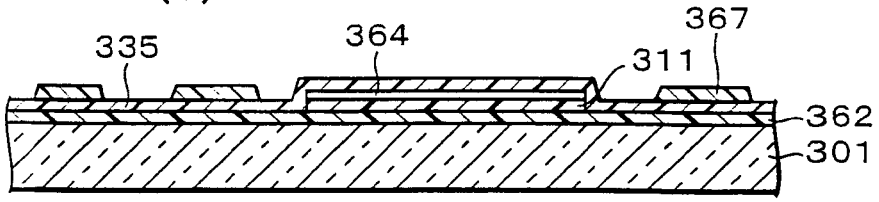
Figure 13:
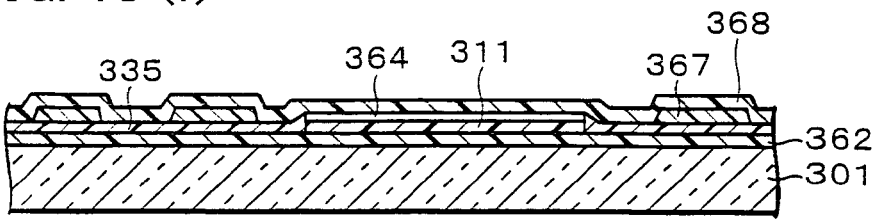

The following description will discuss another embodiment of the present invention referring to FIG. 13(*a*) to FIG. 13(*f*). Note that, the same reference signs are given to components having the same functions as the components in Embodiment 10, and description thereof is omitted.

Each of FIG. 13(*a*) to FIG. 13(*f*) shows an example of a manufacturing method of an active matrix substrate (semiconductor device) according to the present embodiment. As shown in FIG. 13(*h*), the active matrix substrate includes: an insulating substrate 301; SiO$_2$ (silicon oxide) films 362, 311, and 335; a polycrystalline Si thin film 367; a single crystal Si thin film 364; and a gate oxide film 368. The active matrix substrate further includes a thin film transistor (TFT)(not shown); a gate electrode; an interlayer insulating film; and a metal wiring, as in Embodiments 9 and 10 described above.

The SiO$_2$ film (first SiO$_2$ film) 362 constituted of SiO$_2$ is formed on a substantially entire surface of the insulating substrate 301 as in Embodiment 10. A thickness of the SiO$_2$ film 362 is approximately 50 nm.

An SiO$_2$ film (insulating film) 335 and an SiO$_2$ film 311 are formed on the SiO$_2$ film 362. A thickness of the SiO$_2$ film 335 is approximately 100 nm. The SiO$_2$ film 311 is formed on the SiO$_2$ film 336 so as not to be positioned in an area of the polycrystalline Si thin film 335 so as to be in an island shape, and its thickness is approximately 200 nm.

The single crystal Si thin film 364 is formed on the SiO$_2$ film 311 so as to be formed in the same island shape as the SiO$_2$ film 311. A thickness of the single crystal Si thin film 364 is approximately 100 nm. Further, the polycrystalline Si thin film 367 is formed on the SiO$_2$ film 335 so as to be in an island shape. A thickness of the polycrystalline Si thin film 367 is approximately 50 nm.

The gate oxide film 368 is formed so as to cover entire surfaces of the SiO₂ film 362, the polycrystalline Si thin film 367, and the single crystal Si thin film 364. A thickness of the gate oxide film 368 is approximately 60 nm.

Further, a gate electrode (not shown) is formed on the gate oxide film 368 on surfaces of the island-shaped polycrystalline Si thin film 367 and single crystal Si thin film 364. The gate electrode is constituted in the same manner as in the active matrix substrate 330 of Embodiment 10, and is made of the polycrystalline Si, silicide, or polycide and the like.

Further, as in the active matrix substrate 330, there are formed an interlayer insulating film (not shown), a contact hole, and a metal wiring. Likewise, there are formed an SiNx (silicon nitride), a resin flattening film, a via hole, and a transparent electrode that are used for liquid crystal display. In the polycrystalline Si thin film area, a driver and a TFT used for display are formed. In the single crystal Si thin film area, there are formed a timing controller and a microprocessor.

The following description will discuss a manufacturing method of the active matrix substrate referring to FIG. 13(a) to FIG. 13(f).

First, the SiO₂ film 362 having an approximately 50 nm thickness is deposited on an entire surface of the insulating substrate 301 constituted of code 1737 (made by Corning Incorporated) in accordance with P-CVD using mixed gas constituted of TEOS (Tetra Ethoxy Silane, namely, $Si(OC_2H_5)_4$) and $O_2$ (oxygen) (FIG. 13(a)).

While, there is prepared a single crystal Si substrate 310 that has been cut into an appropriate shape. In the single crystal Si substrate 310, an SiO₂ film 311 having an approximately 200 nm thickness is formed by oxidizing a surface of the single crystal Si substrate 310 in advance or depositing an oxide film (SiO₂ film) on the surface. Further, in the single crystal Si substrate 310 doped with boron of approximately $3 \times 10^{15}/cm^{-3}$, there is provided a hydrogen ion implantation portion 312 obtained by implanting hydrogen ions of a dose amount of $5 \times 10^{16}/cm^2$, at predetermined energy.

Further, after activating both the insulating substrate 301 and the single crystal Si substrate 310 in accordance with particle removal and SC-1 cleaning for activating the surface, a surface of the cut single crystal Si substrate 310 which faces the hydrogen ion implantation portion 312 is bonded to the insulating substrate 301 at a room temperature (FIG. 13(b)).

Thereafter, a heating process is performed with respect to the bonded substrates at 300° C. to 600° C., here, at approximately 550° C., and a temperature of the hydrogen ion implantation portion 312 of the single crystal Si substrate 310 is increased to a temperature, above the hydrogen dissociation temperature from Si, so that the single crystal Si substrate 310 is divided at the hydrogen ion implantation portion 312 in a cleaving manner.

Further, a damaged layer a surface of the single crystal Si substrate that is left on the insulating substrate 301 after the division is removed by isotopic plasma etching or wet etching, here, by performing light etching of approximately 20 nm based on the wet etching using buffered Hydro fluoric acid. Thus, the single crystalline Si thin film 364 having an approximately 80 nm thickness is provided on the insulating substrate 301 (FIG. 13(c)).

Next, an SiO₂ film 335 having an approximately 100 nm thickness is deposited on a substantially entire surface of the insulating substrate 301 in accordance with P-CVD using mixed gas constituted of SiH₄ and N₂O. Further, an amorphous Si film 366 having an approximately 50 nm thickness is deposited on a substantially entire surface of the SiO₂ film 335 in accordance with the P-CVD using SiH₄ gas (FIG. 13(d)).

Further, excimer laser is irradiated to heat the amorphous Si film 366 so that the amorphous Si film 366 is crystallized, so as to grow a polycrystalline Si layer, so that the polycrystalline Si thin film 367 is formed. This heating process improves the bond strength of the single crystal Si thin film 364.

Next, portions which function as an active area of the device is left, and at least unnecessary portions are removed from the single crystal Si thin film 364 by etching, so that island patterns are formed (FIG. 13(e)).

Next, an SiO₂ film having an approximately 350 nm thickness is deposited in accordance with the P-CVD using mixed gas constituted of TEOS and O₂, and a photo resist having an approximately 350 nm thickness is applied to an entire surface of the SiO₂ film as the resin flattening film. Thereafter, the resin flattening film is entirely, and the SiO₂ film 335 is partially etched back, in accordance with RIE using mixed gas constituted of O₂ and CF₄.

Thereafter, the gate oxide film 368 having an approximately 60 nm thickness is formed in accordance with the P-CVD using mixed gas constituted of SiH₄ and N₂O (FIG. 13(f)).

Thereafter, the forming is performed in the same process as in a well-known forming process of a p-Si (polycrystalline Silicon) type TFT matrix substrate as in Embodiments 9 and 10. That is, the gate electrode constituted of polycrystalline Si, silicide, or polycide is formed. Then, $P^+$ and $B^+$ ions are implanted, and the interlayer insulating film (SiO₂ film) is deposited, and the contact hole is opened. Thereafter, the metal wiring is formed in the contact hole.

Here, an N channel TFT formed in a conventional polycrystalline Silicon area was such that its mobility was approximately 100 cm²/V·sec. On the other hand, in the active matrix substrate according to the present embodiment, the N channel TFT formed in the single crystal Si area is such that the mobility is approximately 550 cm²/V·sec.

In the active matrix substrate, not only the driver but also devices formed in the area of the polycrystalline Si thin film 367 require signals and power supply voltages of 7 to 8V. On the other hand, the timing controller and the microprocessor and the like which are devices formed in the area of the single crystal Si thin film 364 stably operate at 3.3V.

Embodiment 12

The following description will discuss another embodiment of the present invention referring to FIG. 14(a) to FIG. 14(e). Note that, the same reference signs are given to components having the same functions as the components in Embodiment 9, and description thereof is omitted.

An active matrix substrate according to the present embodiment is different from the active matrix substrate 320 according to Embodiment 9 in that a polycrystalline Si thin film 343 is formed instead of the polycrystalline Si thin film 304. Other than this, the active matrix substrate is arranged in the same manner as in the active matrix substrate 320. Thus, only differences between the active matrix substrate of the present embodiment and the active matrix substrate 320 of Embodiment 9 are described.

The polycrystalline Si thin film 343 is constituted of polycrystalline Si whose crystal growth is promoted by metal assist, that is, a so-called continuous grain silicon Si.

The following description will discuss a manufacturing method of the active matrix substrate using the polycrystalline Si thin film 343, referring to FIG. 14(a) to FIG. 14(e).

First, the SiO₂ film 332 having an approximately 100 nm thickness is deposited on an entire surface of the insulating substrate 301 constituted of code 1737 (made by Corning Incorporated) in accordance with P-CVD using mixed gas constituted of TEOS (Tetra Ethoxy Silane, namely, $Si(OC_2H_5)_4$) and $O_2$ (oxygen).

Next, an amorphous Si film 303 having an approximately 50 nm thickness is deposited on the $SiO_2$ film 302 in accordance with the P-CVD using $SiH_4$ gas. Thereafter, an $SiO_2$ film 341 (second $SiO_2$ film) having an approximately 200 nm thickness is deposited on a substantially entire surface of the insulating substrate 301 in accordance with the P-CVD using mixed gas constituted of $SiH_4$ and $N_2O$ (FIG. 14(a)).

Further, an opening portion is formed in a predetermined area of the $SiO_2$ film 341 of an upper layer in accordance with etching. Thereafter, in order to control hydrophilicity of a surface of the amorphous Si film 303 in the opening portion, an oxide layer 342 is formed on the surface of the amorphous Si film 303, and a surface of the oxide film 342 is spin-coated with Ni acetate aqueous solution (FIG. 14(b)).

Next, solid-phase growing is performed at 600° C. for 12 hours, so that polycrystalline Si whose crystal growth has been promoted by the metal assist, that is, so-called continuous grain Si is grown, so as to form a polycrystalline Si thin film 343 having an approximately 50 nm thickness. Further, the $SiO_2$ films 341 and 342 on the polycrystalline Si thin film 43 are removed. Thereafter, a predetermined area of the polycrystalline Si thin film 343 is removed by etching (FIG. 14(c)).

While, a single crystal Si substrate 310 is prepared. In the single crystal Si substrate 310, an $SiO_2$ film 311 having an approximately 200 nm thickness is formed by oxidizing a surface of the single crystal Si substrate 310 in advance or depositing an oxide film ($SiO_2$ film) on the surface. Further, in the single crystal Si substrate 310 doped with boron of approximately $3\times10^{15}/cm^{-3}$, there is provided a hydrogen ion implantation portion 312 obtained by implanting hydrogen ions of a dose amount of $5\times10^{16}/cm^2$, at predetermined energy.

Further, the single crystal Si substrate 310 is cut into a shape smaller, by at least 0.3 μm, preferably not less than 0.5 μm, than the predetermined area in which the polycrystalline Si thin film 343 has been removed by etching, in accordance with dicing or anisotropic etching such as KOH. Thus, it is possible to prevent metal atoms, such as Ni, Pt, Sn, and Pd that have been used in the latter manufacturing process of the polycrystalline Si thin film 343, from diffusing into the single crystal Si area.

Figure 14:
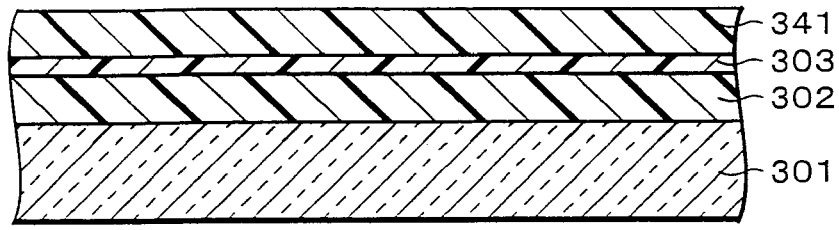
FIG. 14(a) to FIG. 14(e) are cross sectional views each of which shows an example of a semiconductor device according to still another embodiment of the present invention.
Figure 14:
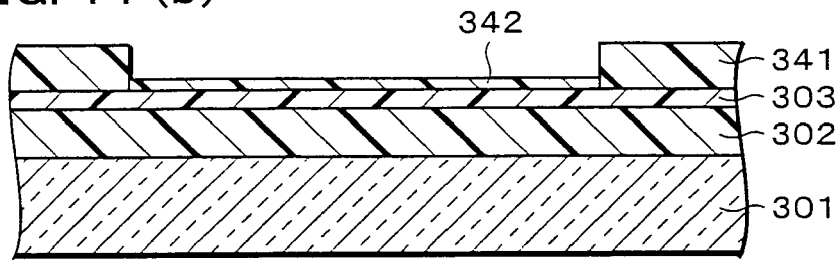
Figure 14:
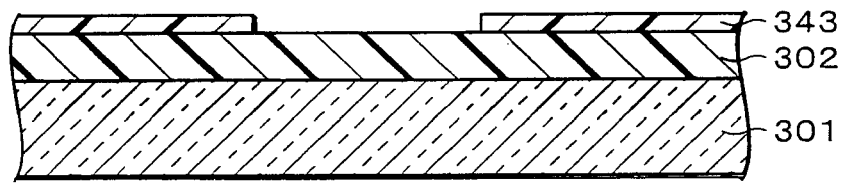
Figure 14:
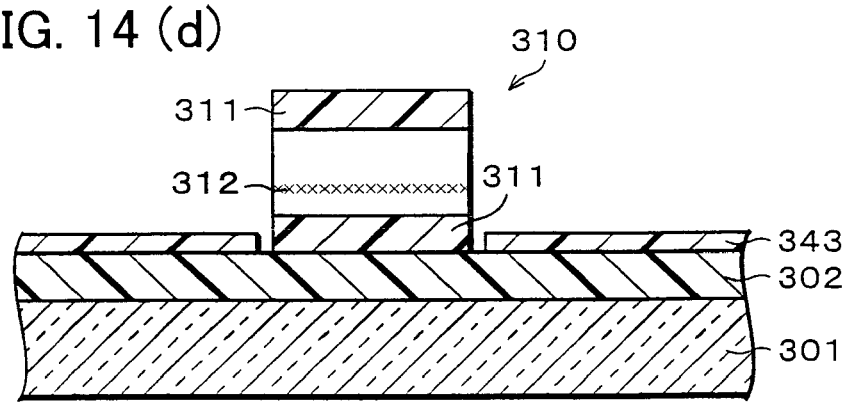
Figure 14:
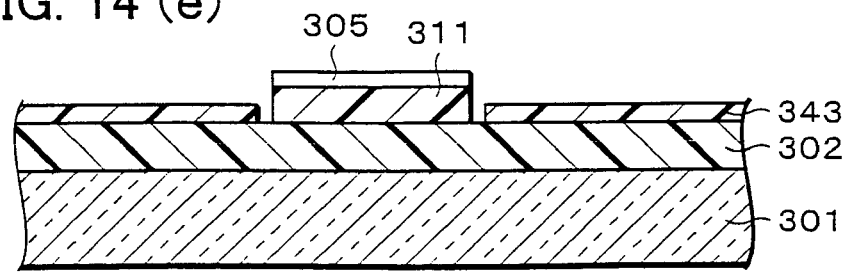

Next, after activating both the substrate having the polycrystalline Si thin film 343 and the single crystal Si substrate 310 in accordance with particle removal and SC-1 cleaning for activating the surface, a surface of the cut single crystal Si substrate 310 which faces the hydrogen ion implantation portion 312 is bonded to an area having been subjected to the etching removal (FIG. 14(c)) at a room temperature (FIG. 14(d)).

Thereafter, a temperature of the hydrogen ion implantation portion 312 of the single crystal Si substrate 310 is increased to a temperature, above the hydrogen dissociation temperature from Si, in accordance with laser irradiation or a lamp anneal including a peak temperature of approximately not less than 700° C., so that the single crystal Si substrate 310 is divided at the hydrogen ion implantation portion 312 in a cleaving manner.

Next, a damaged layer of a surface of the single crystal Si substrate 310 that is left on the insulating substrate 301 after the division is removed by isotopic plasma etching or wet etching, here, by performing light etching of approximately 10 nm based on the wet etching using buffered Hydro fluoric acid. Thus, the polycrystalline Si thin film 305 having an approximately 50 nm thickness is provided on the insulating substrate 301 (FIG. 14(e)).

Next, an opening portion is formed in the $SiO_2$ film in the vicinity of the active area of the devices, and highly-dense $P^+$ ions are implanted (15 keV, $5\times10^{15}/cm^2$) so as to perform gettering with respect to Ni added to promote crystal growth of the $SiO_2$ film into a mask, and a heating process is performed in accordance with RTA at approximately 800° C. for one minute. Although a physical space is provided so that Ni atoms are not diffused into the single crystal Si, there is a possibility that slight amount of Ni atoms may be mixed into the single crystal Si, so that it is preferable to perform the gettering also with respect to the active area of the single crystal Si, but the gettering may be omitted in terms of designing in a case where the space is prioritized.

Next, an active area of the device is left, and unnecessary portions of the polycrystalline Si thin film 343 and unnecessary portions of the single crystal Si thin film 305 are removed by etching, so that island patterns are obtained (corresponding to FIG. 11(e)).

Processes thereafter (corresponding to FIG. 11(f) to FIG. 11(h)) are performed in the same manner as in Embodiment 9, so that description thereof is omitted.

Here, an N channel TFT formed in a conventional continuous grain silicon Si area was such that its mobility was approximately 200 cm²/V·sec. On the other hand, in the active matrix substrate according to the present embodiment, the N channel TFT formed in the single crystal Si area is such that the mobility is approximately 550 cm²/V·sec.

In the active matrix substrate, not only the driver but also devices formed in the area of the polycrystalline Si thin film 367 require signals and power supply voltages of 7 to 8V. On the other hand, the timing controller and the microprocessor and the like which are devices formed in the area of the single crystal Si thin film 305 stably operate at 3.3V.

Note that, although the surface is spin-coated with Ni acetate aqueous solution in the process shown in FIG. 14(b), the process is not particularly limited. For example, ethanol and the like may be used.

Embodiment 13

The following description will discuss another embodiment of the present invention referring to FIG. 15(a) to FIG. 15(h). Note that, the same reference signs are given to components having the same functions as the components in Embodiment 9, and description thereof is omitted.

An active matrix substrate 350 according to the present embodiment is different from the active matrix substrate 320 according to Embodiment 9 in that an insulating film 352 and an amorphous Si film 353 are formed instead of the $SiO_2$ film 302 and the amorphous Si film 303. Other than this, the active matrix substrate 350 is arranged in the same manner as in the active matrix substrate 320. Thus, only differences between the active matrix substrate 350 and the active matrix substrate 320 are described.

As shown in FIG. 15(h), the active matrix substrate 350 includes a concaved portion 351 having an approximately 150 nm depth in the insulating substrate 301, and there are formed an $SiO_2$ film having an approximately 350 nm and an insulating film 352 constituted of an nitride Si film and the like.

On the $SiO_2$ film 302, there are formed a polycrystalline Si thin film 354 and an $SiO_2$ film 311. The polycrystalline Si thin film 354 is formed so as to be in an island shape as in the polycrystalline Si thin film 304, and has an approximately 50 nm thickness. The $SiO_2$ film 311 is formed, so as to be in an island shape, on the $SiO_2$ film 352 so as not to be positioned on an area of the polycrystalline Si thin film 354, and has an approximately 200 nm thickness. On the $SiO_2$ film 311, a single crystal Si thin film 305 shaped in the same manner is formed so as to be in an island shape. A thickness of the single crystal Si thin film 305 is approximately 50 nm.

Note that, in the present embodiment, a thickness of the $SiO_2$ film 311 is approximately 400 nm.

The following description will discuss a manufacturing method of the active matrix substrate 350 referring to FIG. 15(a) to FIG. 15(h).

First, the insulating film 352 having an approximately 350 nm thickness is deposited on an entire surface of the insulating substrate 301 constituted of code 1737 (made by Corning Incorporated) in accordance with P-CVD using mixed gas constituted of $SiH_4$ and $N_2O$. Next, the amorphous Si film 353 having an approximately 50 nm thickness is deposited on an entire surface of the insulating film 352 in accordance with P-CVD using $SiH_4$ gas (FIG. 15(a)).

Further, excimer laser is irradiated to heat the amorphous Si film 353 so that the amorphous Si film 353 is crystallized, so as to grow a polycrystalline Si layer, so that the polycrystalline Si thin film 354 is formed.

A predetermined area of the polycrystalline Si thin film 354 and a part of the insulating film 352 are removed by etching them by approximately 150 nm, so that the concaved portion 351 having an approximately 200 nm thickness is formed (FIG. 15(b)).

While, a single crystal Si substrate 310 is prepared. In the single crystal Si substrate 310, an $SiO_2$ film 311 having an approximately 400 nm thickness is formed by oxidizing a surface of the single crystal Si substrate 310 in advance or depositing an oxide film ($SiO_2$ film) on the surface. Further, in the single crystal Si substrate 310, there is provided a hydrogen ion implantation portion 312 obtained by implanting hydrogen ions of a dose amount of not less than $10^{16}/cm^2$, here, by implanting hydrogen ions of a dose amount of $5 \times 10^{16}/cm^2$, at predetermined energy (here, approximately 24 keV).

Further, the single crystal Si substrate 310 is cut, in accordance with dicing or anisotropic etching etc., into a shape smaller, by at least 0.5 micrometer, than the predetermined area of the polycrystalline Si thin film 345 that has been removed by etching.

Next, after activating both the substrate having the polycrystalline Si thin film 354 and the single crystal Si substrate 310 in accordance with particle removal and Sc-1 cleaning for activating the surface, a surface of the cut single crystal Si substrate 310 which faces the hydrogen ion implantation portion 312 is bonded to the concaved portion 351 at a room temperature (FIG. 15(c)).

Thereafter, a heating process is performed at 300° C. to 600° C., here, the heating process is performed at approximately 500° C., so as to increase a temperature of the hydrogen ion implantation portion 312 of the single crystal Si substrate 310 to a temperature, above the hydrogen dissociation temperature from Si, so that the single crystal Si substrate 310 is divided at the hydrogen ion implantation portion 312 in a cleaving manner.

Further, a damaged layer of a surface of the single crystal Si substrate that is left on the insulating substrate 301 after the division is removed by isotopic plasma etching or wet etching, here, by performing light etching of approximately 10 nm based on the wet etching using buffered Hydro fluoric acid. Thus, the polycrystalline Si thin film 354 having an approximately 50 nm thickness and the single crystal Si thin film 305 are provided on the insulating substrate 301 (FIG. 15(d)).

Thereafter, lamp anneal is performed at approximately 800° C. for one minute.

Next, an active area of the device is left, and unnecessary portions of the Si thin films 354 and 305 are removed by etching, so that island patterns are obtained (FIG. 15(e)).

Next, an $SiO_2$ film having an approximately 350 nm thickness is deposited in accordance with the P-CVD using mixed gas constituted of TEOS and $O_2$ (oxygen). The deposited $SiO_2$ film is etched back by approximately 400 nm in accordance with RIE (reactive ion etching) which is anisotropic etching. Thereafter, the gate oxide film 306 ($SiO_2$ film) having an approximately 60 nm thickness is formed in accordance with the P-CVD using mixed gas constituted of $SiH_4$ and $N_2O$ (FIG. 15(f)).

Processes thereafter (FIG. 15(g) and FIG. 15(h) (corresponding to FIG. 11(g) and FIG. 11(h)) are performed in the same manner as in Embodiment 9, so that description thereof is omitted.

An N channel TFT formed in a conventional polycrystalline Silicon area was such that its mobility was approximately 100 $cm^2/V \cdot sec$. On the other hand, in the liquid crystal display active matrix substrate 350, the N channel TFT formed in the single crystal Si area is such that the mobility is approximately 550 $cm^2/V \cdot sec$.

In the active matrix substrate 350, not only the driver but also devices formed in the area of the polycrystalline Si thin film 354 require signals and power supply voltages of 7 to 8V. On the other hand, the timing controller and the microprocessor and the like which are devices formed in the area of the single crystal Si thin film 305 stably operate at 3.3V.

Further, the single crystal Si substrate 310, on which the $SiO_2$ film 311 having an approximately 400 nm thickness has been formed, is used in the active matrix substrate 350. Compared with a case where non-uniformity in a threshold of a TFT is 0.3V ($\pm\sigma$) in Embodiment 9 in which the single crystal Si substrate 310 having the $SiO_2$ film 311 of approximately 200 nm is used, non-uniformity in a threshold of a TFT that has been obtained in the present embodiment is approximately 0.15V ($\pm\sigma$) which is half of the foregoing value, so that stability of operation particularly at a low voltage is improved.

This is based on the following reason: the foregoing arrangement reduces influence of a fixed charge that is caused by (a) a contamination on an interface between the single crystal Si substrate and a glass substrate that are bonded to each other, or (b) deformation and incompleteness of a lattice. As the $SiO_2$ film 311 is thicker, the non-uniformity in the threshold is further reduced, but a suitable value is approximately 200 nm to 400 nm in terms of (a) an efficiency of a forming process of the $SiO_2$ film (time taken to oxidize) and (b) trade off with respect to differences. In a case where the non-uniformity is focused on, the suitable value is approximately 400 nm, and in a case where the gap and the efficiency are focused on, the suitable value is approximately 200 nm.

In a case where no problem is brought about with respect to the differences, it is needless to say that not less than 400 nm is more preferable.

Note that, the following processes may be performed. After the concaved portion 351 is formed, an $SiO_2$ film having a several 10 nm thickness is deposited so as to entirely cover the insulating substrate 301 in accordance with a PECVD method using TEOS and $O_2$ gas. Thereafter, the single crystal Si substrate 310 and the insulating substrate 301 are bonded to each other. Thus, the bond strength is improved, so that it is possible to bond them more steadily and with a good yield.

Here, the foregoing description discusses the case of using the single crystal Si substrate 310 in which hydrogen ions of a dose amount of $5 \times 10^{16}/cm^2$ are implanted at predetermined energy, and the following description discusses a case of using a single crystal Si substrate in which hydrogen ions of a dose amount of $3 \times 10^{16}/cm^2$ are implanted at predetermined energy.

In the case of the single crystal Si substrate 310 (dose amount of hydrogen ion: $5 \times 10^{16}/cm^2$), the heating process is performed at approximately 550° C. so as to obtain the single crystal Si thin film 305, but in the case of the single crystal Si substrate (dose amount of hydrogen ion: $3 \times 10^{16}/cm^2$), a pulse of the excimer laser is irradiated at approximately 60% to 80% energy upon forming the polycrystalline Si layer, and the irradiation is performed with respect to the entire surface as in the growth of the polycrystalline Si layer, so that the surface is entirely heated.

An N channel TFT formed in a conventional polycrystalline Silicon area was such that its mobility was approximately 100 $cm^2/V \cdot sec$. On the other hand, in the foregoing case, the N channel TFT formed in the single crystal Si area is such that the mobility is approximately 600 $cm^2/V \cdot sec$.

Note that, in the active matrix substrate 350 (see FIG. 15(*h*)) using the single crystal Si substrate 310, the N channel TFT formed in the single crystal silicon area is such that the mobility is approximately 550 $cm^2/V \cdot sec$.

This difference is caused by the following reason: since the single crystal Si thin film obtained by using the single crystal Si substrate (dose amount of hydrogen ion: $3 \times 10^{16}/cm^2$) is in a condition under which the implantation amount of the hydrogen ion is reduced, it is possible to reduce the damage of the single crystal Si that is brought about upon implanting the hydrogen ion, so that the TFT property is improved.

Further, in the case of using the single crystal Si substrate (dose amount of hydrogen ion: $3 \times 10^{16}/cm^2$), not only the driver but also devices formed in the area of the polycrystalline Si thin film require signals and power supply voltages of 7 to 8V. On the other hand, the timing controller and the microprocessor and the like which are devices formed in the area of the single crystal Si thin film stably operate at 3.3V.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

Further, the embodiments of the present invention are not limited to the present content, but it is needless to say that, for example, the forming method of the polycrystalline Si, or materials for the interlayer insulating film, a thickness of the interlayer insulating film, and the like can be realized by means person with ordinary skill in the art knows. Further, it is needless to say that other materials generally used for the same object bring about the same effects.

Further, in the foregoing Embodiments 9, 10, 12, and 13, the $SiO_2$ film on the surface bonded to the single crystal Si thin film formed on the insulating substrate 301 may be deposited after etching a part of the polycrystalline Si thin film or the insulating substrate 301 and forming the concaved portion.

In addition to the foregoing configuration, the semiconductor device according to the present invention may have such an arrangement that the single crystal Si thin film has a surface, bonded to the insulating substrate, and the surface is oxidized, or an $SiO_2$ film is deposited on the surface.

Further, the insulating substrate may also have an $SiO_2$ film deposited on a surface bonded to the single crystal Si thin film. Note that, the thickness of the $SiO_2$ film deposited on the surface bonded to the single crystal Si thin film should be not less than 100 nm, and further preferably not less than 500 nm. In this arrangement, the single crystal Si film is bonded to the insulating substrate via the oxide layer or the $SiO_2$ film, so that it is possible to prevent the following problems: (a) drop in the mobility that is brought about by distortion of the Si crystal caused by a stress exerted on a bonded Si interface, or (b) deficiency in the interface, and an interface fixed charge that is brought about in combination with the deficiency, and (c) a threshold shift that is brought about by a localized state in the interface, and (d) drop in the property stability.

Further, in the foregoing arrangement, it is not necessary to use a crystallized glass, as with the one described in Japanese Laid-Open Patent Application Tokukaihei 11-163363, whose composition has been adjusted so as to prevent damages caused by thermal expansion rate difference with respect to a glass substrate when the bond strength is improved by heat treatment. Thus, there is not such a problem that the crystallized glass is contaminated with the alkali metal, so that it is possible to prevent the damages and the stripping that are caused by thermal expansion rate difference with respect to a glass substrate when the bond strength is improved by heat treatment and the exfoliation is performed even when a general low-cost high-strain-point glass is used.

On this account, there is not such a problem that the insulating substrate made of crystallized glass is contaminated with the alkali metal, and also cost reduction can be realized.

In addition to the foregoing configuration, the semiconductor device according to the present invention may have such an arrangement that the semiconductor device is an active matrix substrate including integrated circuits each of which is made of a plurality of MOSFETs provided on the insulating substrate.

With the foregoing configuration, since the semiconductor device is an active matrix substrate including integrated circuits each of which is made of a plurality of MOS (Metal Oxide Semiconductor) FETs on the insulating substrate, it is possible to obtain an active matrix substrate having the foregoing characteristic.

In addition to the foregoing configuration, the semiconductor device according to the present invention may have such an arrangement that the insulating substrate is made of high-strain-point glass in which an $SiO_2$ layer is provided on at least a surface of an area having single crystal Si.

As described, since the insulating substrate can be manufactured by using high-strain-point glass, which is generally used for such as an active matrix liquid crystal panel, instead of using a crystallized glass whose composition has been adjusted, it is possible to manufacture the semiconductor device at low cost.

In addition to the foregoing configuration, the semiconductor device according to the present invention may have such an arrangement that the insulating substrate is made of at least any one of barium-alumino boro-silicated glass, alkaline earth-alumino boro-silicated glass, boro-silicated glass, alkaline earth-zinc-lead-alumino boro-silicated glass, and alkaline earth-zinc-alumino boro-silicated glass, each of which has an $SiO_2$ film thereon.

With the foregoing configuration, since the insulating substrate is made of the described glass, i.e., high-strain-point glass, which is generally used for such as an active matrix liquid crystal panel, it is possible to manufacture the semiconductor device suitable for an active matrix substrate at low cost.

In addition to the foregoing configuration, the semiconductor device according to the present invention may have such an arrangement that an area of the single crystal Si thin film provided on the insulating substrate and an area of the polycrystalline Si thin film provided on the insulating substrate are separated from each other by at least not less than 0.3 micrometer.

With the foregoing configuration, since an area of the single crystal Si thin film and an area of the polycrystalline Si thin film are separated from each other by at least not less than 0.3 micrometer, it is possible to prevent diffusion of metal atoms, such as Ni, Pt, Sn, and Pd, from the polycrystalline Si into the single crystal Si, thereby stabilizing the property of the semiconductor device.

In addition to the foregoing configuration, the semiconductor device according to the present invention may have such an arrangement that transistors, identical to each other in terms of a conductivity type, that are respectively provided on the different areas, are different from each other in at least any one of a mobility, a sub-threshold coefficient, and a threshold value.

With the foregoing configuration, since transistors, identical to each other in terms of a conductivity type, that are respectively provided on the different areas, are different from each other in terms of at least any one of a mobility, a sub-threshold coefficient, and a threshold value, it is possible to provide those transistors on respective appropriate areas according to the required property.

In addition to the foregoing configuration, the semiconductor device according to the present invention may have such an arrangement that the integrated circuits respectively provided on the different areas are different from each other in terms of at least one of a gate length, a thickness of a gate oxide film, a power supply voltage, and a logic level.

With the foregoing configuration, since the integrated circuits respectively provided on the different areas are different from each other in terms of at least one of a gate length, a thickness of a gate oxide film, a power supply voltage, and a logic level, it is possible to provide those integrated circuits on respective appropriate areas according to the required arrangement and property.

In addition to the foregoing configuration, the semiconductor device according to the present invention may have such an arrangement that the integrated circuits respectively provided on the different areas are different from each other in a design rule.

With the foregoing configuration, since the integrated circuits respectively provided on the different areas are different from each other in terms of a design rule, it is possible to provide those integrated circuits on respective appropriate areas according to the design rule.

In addition to the foregoing configuration, in the semiconductor device according to the present invention, the thickness d of the single crystal Si thin film can be adjusted to be not more than the upper limit of 600 nm, even when the thickness d has a small value including variation of the maximum depletion length Wm, i.e., its impurity density is practical lower limit of $10^{15}/cm^{-3}$. The impurity density is determined according to the amount of impurity Ni.

Here, $Wm = [4 \epsilon s \, kT \ln (Ni/ni) \, q^2 Ni]^{1/2}$, where ni denotes intrinsic carrier density, k denotes Boltzmann constant, T denotes absolute temperature, $\epsilon s$ denotes dielectric constant of Si, q denotes electronic charge, and Ni denotes impurity density.

With the foregoing configuration, since a thickness of the single crystal Si thin film is not more than 600 nm, it is possible to further reduce S value of the semiconductor device and also to reduce OFF current.

In addition to the foregoing configuration, the semiconductor device according to the present invention may have such an arrangement that a thickness of the single crystal Si thin film is not more than 100 nm.

With the foregoing configuration, since a thickness of the single crystal Si thin film is not more than 100 nm, it is possible to further reduce S value of the semiconductor device and also to reduce OFF current.

In addition to the foregoing configuration, the manufacturing method of the semiconductor device according to the present invention may have such an arrangement that the heating process is performed at a single temperature step ranging from not less than 300° C. to not more than 650° C.

With the foregoing configuration, since the heating process is performed at a single temperature step, it is possible to carry out the heating process at a single step.

In addition to the foregoing configuration, the manufacturing method of the semiconductor device according to the present invention may have such an arrangement that the heating process is performed at multi temperature steps ranging from not less than 300° C. to not more than 650° C.

With the foregoing configuration, since the heating process is performed at multi temperature steps, it is possible to reduce occurrence of stripping upon the exfoliation of the single crystal Si.

In addition to the foregoing configuration, the manufacturing method of the semiconductor device according to the present invention may have such an arrangement that at least one of Ni, Pt, Sn, and Pd is added to the amorphous Si film upon growing the polycrystalline Si layer.

With the foregoing configuration, since at least one of Ni, Pt, Sn, and Pd is added to the amorphous Si film upon growing the polycrystalline Si layer before heating, it is possible to promote crystal growth of the polycrystalline Si layer. Thus, a mobility of the polycrystalline Si layer can be increased, thereby having an advantage at the forming of driving circuit etc.

In addition to the foregoing configuration, the manufacturing method of the semiconductor device according to the present invention may have such an arrangement that the step of dividing the single crystal Si substrate at the hydrogen ion implantation portion in the exfoliating manner is performed by raising a temperature of the hydrogen ion implantation portion of the single crystal Si substrate to a temperature, at which hydrogen dissociates from Si, in accordance with laser irradiation.

With the foregoing configuration, since a temperature of a hydrogen ion implanted layer of the single crystal Si substrate is raised by laser irradiation, it is possible to raise temperature only with respect to a small range of area, thereby suppressing damage of the single crystal Si.

In addition to the foregoing configuration, the manufacturing method of the semiconductor device according to the present invention may have such an arrangement that the single crystal Si substrate is divided at the hydrogen ion implantation portion in the exfoliating manner by performing lamp anneal including a peak temperature of approximately not less than 700° C.

With the foregoing configuration, since the single crystal Si substrate is divided at the hydrogen ion implantation portion in the exfoliating manner by performing lamp anneal (Rapid Thermal Anneal, hereinafter referred to as RTA) including a peak temperature of approximately not less than 700° C., it is possible to further improve the bond strength, and also to improve the property of transistor due to recovery of the exfoliation interface and inside of the single crystal Si thin film, which have been damaged by the hydrogen ion implantation. Note that, the property of the transistor is improved with the increase of the peak temperature of the lamp anneal; however, the increase of the peak temperature also increases bending and expansion/contraction of the substrate. Thus, the temperature and holding time should be appropriately set according to the size of substrate and/or the type of the device.

In addition to the foregoing configuration, the manufacturing method of the semiconductor device according to the present invention may have such an arrangement that a maximum size of the single crystal Si thin film is not more than 10 cm.

With the foregoing configuration, by having the single crystal Si thin film of which maximum size is not more than 10 cm, it is possible to prevent breakage such as cracking, or stripping of the Si even when high-strain-point glass is adopted, which is generally used for an active matrix liquid crystal display panel etc. and having greater thermal expansion rate difference with respect to the single crystal Si than that of quartz glass. Note that, the maximum size of the single crystal Si thin film signifies a greatest size among each outline length of the surface of the single crystal Si thin film having low thickness. For example, it signifies its diameter when the single crystal Si thin film has a disc shape, and it signifies the length of the diagonal line of upper surface rectangle when the single crystal Si thin film is a thin rectangular solid.

In addition to the foregoing configuration, the manufacturing method of the semiconductor device according to the present invention may have such an arrangement that a maximum size of the single crystal Si thin film is not more than 5 cm.

With the foregoing configuration, by having the single crystal Si thin film of which maximum size is not more than 5 cm, it is possible to more securely prevent breakage such as cracking, or stripping of the Si even when high-strain-point glass is adopted, which is generally used for an active matrix liquid crystal display panel etc. and having greater thermal expansion rate difference with respect to the single crystal Si than that of quartz glass. In addition to the foregoing configuration, the manufacturing method of the semiconductor device according to the present invention may further include the steps of: removing a damaged layer from a surface of the single crystal Si thin film by isotropic plasma etching or wet etching; patterning the polycrystalline Si thin film and the single crystal Si thin film in island shapes by etching; etching-back partially or entirely a first $SiO_2$ film, that has been deposited on entire surfaces of the polycrystalline Si thin film and the single crystal Si thin film, by anisotropic etching; and depositing a second $SiO_2$ film as a gate insulating film, wherein the steps are performed after the polycrystalline Si thin film and the single crystal Si thin film have been provided on the insulating substrate.

In the foregoing configuration, a general polysilicon TFT forming process is adopted, thus manufacturing a TFT having the foregoing characteristic by a conventional process.

In the foregoing manufacturing method, it is preferable that a space between the polycrystalline Si thin film and the single crystal Si thin film having not been subjected to island-shape-etching is substantially equalized to a length twice as long as the thickness of the first $SiO_2$ film, so that an oxide film is left in a valley-shaped portion between the polycrystalline Si thin film and the single crystal Si thin film pattern, thereby entirely flattening the substrate.

In addition to the foregoing configuration, the manufacturing method of the semiconductor device according to the present invention may have such an arrangement that a space between (a) a pattern formed on the polycrystalline Si thin film and (b) a pattern formed on the single crystal Si thin film having not been subjected to the etching performed to form the island shape is substantially equal to a length twice as long as a thickness of the first $SiO_2$ film.

In addition to the foregoing configuration, the manufacturing method of the semiconductor device according to the present invention may further includes the steps of: forming a MOS transistor by patterning the single crystal Si thin film and the polycrystalline Si thin film, that have been formed on the insulating substrate, in island shapes, in accordance with etching; and implanting $P^+$ ions of not less than $10^{15}/cm^2$ and not more than $5\times10^{15}/cm^2$ into at least each part of a source area and a drain area of an N type MOS transistor and each part of a source area and a drain area of a P type MOS transistor.

With the foregoing configuration, since implantation of $P^+$ ions of not less than $10^{15}/cm^2$ and not more than $5\times10^{15}/cm^2$ is performed into at least each part of a source area and a drain area of an N type MOS transistor and each part of a source area and a drain area of a P type MOS transistor, it is possible to obtain a TFT in which its property non-uniformity is little and its property is stable by performing a heating process in accordance with RTA, laser, and a furnace etc., and also performing gettering of metal atoms with respect not only to the polycrystalline Si thin film area, but also to the single crystal Si thin film area.

In addition to the foregoing configuration, the manufacturing method of the semiconductor device according to the present invention may have such an arrangement that a thickness of the single crystal Si thin film is substantially equal to a thickness of the polycrystalline Si thin film.

With the foregoing configuration, since a thickness of the single crystal Si thin film is substantially equal to a thickness of the polycrystalline Si thin film, it is possible to perform almost all the following processes at the same time including the step of etching performed to form the island shape, and to enable forming of a transistor or a circuit in which a large gap is not brought about. Thus, in case of a liquid crystal panel for example, it is possible to obtain an advantage in controlling a cell thickness.

In addition to the foregoing configuration, the manufacturing method of the semiconductor device according to the present invention may have such an arrangement that a thickness of the $SiO_2$ film formed in advance is not less than 200 nm, more preferably, not less than 300 nm.

As the $SiO_2$ film is thicker, the non-uniformity of the threshold is further reduced, but a suitable value is approximately 200 nm to 400 nm in terms of (a) an efficiency of a forming process of the $SiO_2$ film (time taken to oxidize) and (b) trade off with respect to differences. In a case where the non-uniformity is focused on, the suitable value is approximately 400 nm, and in a case where the differences and the efficiency are focused on, the suitable value is approximately 200 nm to 400 nm, more preferably, 250 nm to 350 nm. When the $SiO_2$ thin film is thick, stability of operation particularly at a low voltage is improved. This is based on the following reason: the foregoing arrangement reduces influence of a fixed charge that is caused by (a) a contamination on an interface between the single crystal Si substrate and a glass substrate that are bonded to each other, or (b) deformation and incompleteness of a lattice.

Accordingly, it is possible to obtain a semiconductor substrate having appropriate balance between non-uniformity of the threshold, and the differences and the efficiency of the forming process of the $SiO_2$ thin film.

In addition to the foregoing configuration, the manufacturing method of the semiconductor device according to the present invention may have such an arrangement that a thermal expansion rate of the amorphous nonalkali glass substrate is as high as or higher than that of the single crystal silicon piece.

With the foregoing configuration, when the single crystal Si thin film is exposed in a high temperature for performing the heating process for increasing division and bonding force to the substrate, the substrate is warped downward in a convex direction. This is because the thermal expansion of the substrate is greater than that of the single crystal silicon ($2.6 \times 10^{-6}$ $\deg^{-1}$) in the temperature range of the heating process. At this time, a portion of the single crystal silicon piece, that is positioned in the vicinity of the substrate by the van der waals force, is pulled in a horizontal direction, but the substrate is warped downward in a convex direction, so that a force exerted when the single crystal silicon piece is stripped from the end portion is identical to a direction in which the substrate is warped. This causes the force exerted when the single crystal silicon piece is stripped of the bonded surface to be counterbalanced, so that the single crystal silicon piece is not stripped. This brings about a bond. In this manner, it is possible to prevent the single crystal silicon thin film from being divided from the substrate, or breakage of the substrate.

More specifically, at the heating process in the process for dispelling the hydrogen ion which has been implanted in the single crystal silicon piece so as to divide the hydrogen ion from the single crystal silicon piece, and at the heating process in the process for increasing bonding force of the single crystal silicon piece to the substrate, the substrate is warped downward in a convex direction and a force exerted when the single crystal silicon piece is stripped from the end portion is identical to a direction in which the substrate is warped. Thus, the single crystal silicon piece is not stripped. As a result, it is possible to prevent the single crystal silicon thin film from being divided from the substrate, or breakage of the substrate.

Further, the SOI substrate according to the present invention may be arranged such that the amorphous nonalkali glass substrate is any one of an alkaline earth-alumino boro-silicated glass, a barium-alumino boro-silicated glass, an alkaline earth-zinc-lead-alumino boro-silicated glass, and an alkaline earth-zinc-alumino boro-silicated glass.

With the foregoing configuration, it is possible to obtain a substrate whose coefficient of thermal expansion is as high as or higher than that of the single crystal silicon Further, the SOI substrate according to the present invention may be arranged such that a bonded surface of the single crystal silicon piece is constituted of a (111) face, or a (110) face, or a (100) face.

With the foregoing configuration, by using a single crystal silicon piece having the foregoing crystal orientation, it is possible, in the same manner, to manufacture an SOI substrate, having a silicon film surface which is so flat that it is not necessary to grind the surface from the beginning.

Further, compared with the SOI substrate having the single crystal silicon piece which is most likely to be oriented to a (100) aspect, the SOI substrate of a (110) aspect is such that the largest number of atoms closest to each other are disposed on the (110) face. Thus, when the single crystal silicon piece is separated, the separated surface is extremely flattened, so that it is possible to reduce defective fraction of the silicon transistor formed on the SOI substrate.

Further, when the SOI substrate of a (111) aspect is used, the separated surface is identical to an easy to cleave surface of the single crystal silicon body, and the atoms closest to each other exist in an angle deviating a little from the (111) face.

Thus, when the single crystal silicon piece is separated, the separated surface is extremely flattened, so that it is possible to reduce defective fraction of the silicon transistor formed on the SOI substrate.

Further, the manufacturing method of the SOI substrate according to the present invention may have such an arrangement that the heating process is performed at multi temperature steps ranging from not less than 300° C. to not more than 700° C.

With the foregoing configuration, by performing the heating process at multiple stages, it is possible to reduce stripping of the single crystal Si thin film. Particularly, by performing the two-stages heating process: a first heating process for enforcing the bond strength performed at a temperature at which the single crystal silicon piece is not separated from the application surface, and a second heating process for division, it is possible to reduce the number of inferior products in which a film is stripped of the bonded surface and the single crystal silicon piece itself is stripped after the heating process.

Further, the manufacturing method of the SOI substrate according to the present invention may have such an arrangement that a depth to which the hydrogen ions are implanted ranges from 40 nm to 200 nm.

With the foregoing configuration, as described, when the thickness of the single crystal silicon thin film, namely an implantation depth of the hydrogen ions, is thin such as 200 nm, it is possible to obtain a transistor that has been completely depleted, so that it is possible to improve the property largely, and to facilitate the process. While, when the thickness is less than 40 nm, the single crystal Si thin film becomes easy to break, so that the safety coefficient in manufacturing drops.

The semiconductor device according to the present invention may have such an arrangement that the insulating substrate is constituted of a high-strain-point glass, made of alkaline earth-alumino silicated-glass, which has a surface in which an $SiO_2$ layer has been formed at least on an area containing single crystal Si.

With the foregoing configuration, since it is not necessary to use a crystallized glass whose composition has been adjusted, and the insulating substrate can be manufactured by using high-strain-point glass, which is generally used for such as an active matrix liquid crystal panel, it is possible to manufacture the semiconductor device at low cost.

The semiconductor device according to the present invention may have such an arrangement that the insulating substrate is made of any one of barium-alumino boro-silicated glass, alkaline earth-alumino boro-silicated glass, boro-silicated glass, alkaline earth-zinc-lead-alumino boro-silicated glass, and alkaline earth-zinc-alumino boro-silicated glass.

With the foregoing configuration, since the insulating substrate is manufactured by using the described high-strain-point glass, which is generally used for such as an active matrix liquid crystal panel, it is possible to manufacture the semiconductor device suitable for an active matrix substrate at low cost.

The semiconductor device according to the present invention may have such an arrangement that the semiconductor device is an active matrix substrate including an integrated circuit constituted of a plurality of MOSFETs, a bipolar transistor, or an SIT, that are provided on the insulating substrate.

With the foregoing configuration, since the semiconductor device is an active matrix substrate including integrated circuits each of which is made of a plurality of MOS (Metal Oxide Semiconductor) FETs on the insulating substrate, it is possible to obtain an active matrix substrate having the foregoing characteristic.

The semiconductor device according to the present invention may have such an arrangement that an area of the single crystal Si thin film formed on the insulating substrate is separated from an area of the polycrystalline Si thin film formed on the insulating substrate by not less than 0.3 μm.

The semiconductor device according to the present invention may have such an arrangement that an area of the single crystal Si thin film formed on the insulating substrate is separated from an area of the polycrystalline Si thin film formed on the insulating substrate by not less than 0.5 μm.

With the foregoing configuration, it is possible to prevent diffusion of metal atoms, such as Ni, Pt, Sn, and Pd, from the polycrystalline Si into the single crystal Si, thereby stabilizing the property of the semiconductor device.

The semiconductor device according to the present invention may have such an arrangement that transistors, identical to each other in terms of a conductivity type, that are respectively provided on the different areas, are different from each other in terms of at least any one of a mobility, a sub-threshold coefficient, and a threshold value.

With the foregoing configuration, since transistors, identical to each other in terms of a conductivity type, that are respectively provided on the different areas, are different from each other in at least any one of a mobility, a sub-threshold coefficient, and a threshold value, it is possible to provide those transistors on respective appropriate areas according to the required property.

The semiconductor device according to the present invention may have such an arrangement that integrated circuits respectively provided on the different areas are different from each other in terms of at least one of a gate length, a thickness of a gate oxide film, a power supply voltage, and a logic level.

With the foregoing configuration, since the integrated circuits respectively provided on the different areas are different from each other in at least one of a gate length, a thickness of a gate oxide film, a power supply voltage, and a logic level, it is possible to provide those integrated circuits on respective appropriate areas according to the required arrangement and property.

The semiconductor device according to the present invention may have such an arrangement that integrated circuits respectively provided on the different areas are different from each other in terms of a design rule.

With the foregoing configuration, since the integrated circuits respectively provided on the different areas are different from each other in a design rule, it is possible to provide those integrated circuits on respective appropriate areas according to the design rule.

In the semiconductor device according to the present invention, the thickness d of the single crystal Si thin film can be adjusted to be not more than the upper limit of 600 nm, even when the thickness d has a small value including variation of the maximum depletion length Wm, i.e., its impurity density is practical lower limit of $10^{15}/cm^{-3}$. The impurity density is determined according to the amount of impurity Ni.

Here, $Wm=[4 \epsilon skTln (Ni/ni) q^2Ni]^{1/2}$, where ni denotes intrinsic carrier density, k denotes Boltzmann constant, T denotes absolute temperature, $\epsilon$ s denotes dielectric constant of Si, q denotes electronic charge, and Ni denotes impurity density.

With the foregoing configuration, since a thickness of the single crystal Si thin film is not more than 600 nm, it is possible to further reduce S value (sub-threshold coefficient) of the semiconductor device and also to reduce OFF current.

The semiconductor device according to the present invention may have such an arrangement that a thickness of the single crystal Si thin film is approximately not more than 100 nm.

With the foregoing configuration, it is possible to further reduce S value (sub-threshold coefficient) of the semiconductor device and also to reduce OFF current.

The semiconductor device according to the present invention may have such an arrangement that the heating process is performed at a single temperature step or multi temperature steps which ranges from not less than 300° C. to not more than 650° C.

With the foregoing method, since the heating process is performed at a single temperature step, it is possible to carry out the heating process at a single step.

The semiconductor device according to the present invention may have such an arrangement that at least one of Ni, Pt, Sn, and Pd is added to the amorphous Si film upon growing the polycrystalline Si layer.

With the foregoing method, since at least one of Ni, Pt, Sn, and Pd is added to the amorphous Si film upon growing the polycrystalline Si layer before heating, it is possible to promote crystal growth of the polycrystalline Si layer. Thus, a mobility of the polycrystalline Si layer can be increased, thereby having an advantage at the forming of driving circuit etc.

The semiconductor device according to the present invention may have such an arrangement that the step of dividing the single crystal Si substrate at the hydrogen ion implantation portion in the cleaving manner is performed by raising a temperature of the hydrogen ion implantation portion of the single crystal Si substrate to a temperature, at or above which hydrogen dissociates from Si, in accordance with laser irradiation.

With the foregoing method, since a temperature of a hydrogen ion implanted layer of the single crystal Si substrate is raised by laser irradiation, it is possible to raise temperature only with respect to a small range of area, thereby suppressing damage of the single crystal Si.

The semiconductor device according to the present invention may have such an arrangement that the single crystal Si substrate is divided at the hydrogen ion implantation portion in the cleaving manner by performing lamp anneal including a peak temperature of approximately not less than 700° C.

With the foregoing method, since the single crystal Si substrate is divided at the hydrogen ion implantation portion in the cleaving manner by performing lamp anneal (Rapid Thermal Anneal) including a peak temperature of approximately not less than 700° C., it is possible to further improve the bond strength, and also to improve the property of transistor due to recovery of the exfoliation interface and inside of the single crystal Si thin film, which have been damaged by the hydrogen ion implantation. Note that, the property of the transistor is improved with the increase of the peak temperature of the lamp anneal; however, the increase of the peak temperature also increases bending and expansion/contraction of the substrate. Thus, the temperature and holding time should be appropriately set according to the size of substrate and/or the type of the device.

The method for manufacturing the semiconductor device according to the present invention may further includes the steps of: removing a damaged layer from a surface of the single crystal Si thin film by isotropic plasma etching or wet etching; patterning the polycrystalline Si thin film and the single crystal Si thin film in island shapes by etching; etching-back partially or entirely a first $SiO_2$ film, that has been deposited on entire surfaces of the polycrystalline Si thin film and the single crystal Si thin film, by anisotropic etching; and depositing an SiO$_2$ film so as to form a gate insulating film, wherein the steps are performed after the polycrystalline Si thin film and the single crystal Si thin film have been provided on the insulating substrate.

With the foregoing method, a typical polysilicon TFT forming step is performed, so that it is possible to manufacture a TFT having the foregoing mobility by using the conventional steps.

The method for manufacturing the semiconductor device according to the present invention may further includes the steps of: removing a damaged layer from a surface of the single crystal Si thin film by isotropic plasma etching or wet etching; patterning the polycrystalline Si thin film and the single crystal Si thin film in island shapes by etching; applying a resin flattening film to an entire surface of the SiO$_2$ film for etching back that has been deposited on entire surfaces of the polycrystalline Si thin film and the single crystal Si thin film; etching-back entirely the resin flattening film and partially the SiO$_2$ film for etching back, by anisotropic etching; and depositing the SiO$_2$ film so as to form a gate insulating film, wherein the steps are performed after the polycrystalline Si thin film and the single crystal Si thin film have been provided on the insulating substrate.

With the foregoing method, an oxide film (SiO$_2$ film) is left in a valley-shaped portion between the polycrystalline Si thin film and the single crystal Si thin film pattern, thereby entirely flattening the substrate.

The semiconductor device according to the present invention may further includes the steps of: forming a MOS transistor by patterning the single crystal Si thin film and the polycrystalline Si thin film, that have been formed on the insulating substrate, in island shapes, in accordance with etching; and implanting P$^+$ ions of not less than $10^{15}$/cm$^2$ and not more than $5 \times 10^{15}$/cm$^2$ into at least each part of a source area and a drain area of an N type MOS transistor and each part of a source area and a drain area of a P type MOS transistor.

With the foregoing method, since implantation of P$^+$ ions of not less than $10^{15}$/cm$^2$ and not more than $5 \times 10^{15}$/cm$^2$ is performed into at least each part of a source area and a drain area of an N type MOS transistor and each part of a source area and a drain area of a P type MOS transistor, it is possible to obtain a TFT in which its property non-uniformity is little and its property is stable by performing a heating process in accordance with RTA, laser, and a furnace etc., and also performing gettering of metal atoms with respect not only to the polycrystalline Si thin film area, but also to the single crystal Si thin film area.

The semiconductor device according to the present invention may have such an arrangement that a thickness of the single crystal Si thin film is substantially equal to a thickness of the polycrystalline Si thin film.

With the foregoing method, it is possible to perform almost all the following processes at the same time including the step of etching performed to form the island shape, and to enable forming of a transistor or a circuit in which a large step is not brought about. Thus, in case of a liquid crystal panel for example, it is possible to obtain an advantage in controlling a cell thickness.

The semiconductor device according to the present invention may have such an arrangement that a thickness of the SiO$_2$ film formed by oxidizing a surface of the single crystal Si substrate in advance or depositing the SiO$_2$ film on the surface is not less than 200 nm.

Generally, as the SiO$_2$ film is thicker, the non-uniformity of the threshold is further reduced, but a suitable value is approximately 200 nm to 400 nm in terms of (a) an efficiency of a forming process of the SiO$_2$ film (time taken to oxidize) and (b) trade off with respect to differences. In a case where the non-uniformity is focused on, the suitable value is approximately 400 nm, and in a case where the differences and the efficiency are focused on, the suitable value is approximately 200 nm to 400 nm, more preferably, 250 nm to 350 nm. When the SiO$_2$ thin film is thick, stability of operation particularly at a low voltage is improved. This is based on the following reason: the foregoing arrangement reduces influence of a fixed charge that is caused by (a) a contamination on an interface between the single crystal Si substrate and a glass substrate that are bonded to each other, or (b) deformation and incompleteness of a lattice.

Accordingly, with the foregoing method, it is possible to obtain a semiconductor substrate having appropriate balance between non-uniformity of the threshold, and the differences and the efficiency of the forming process of the SiO$_2$ thin film.

The semiconductor device according to the present invention may have such an arrangement that a maximum size of the single crystal Si thin film is not more than 10 cm.

With the foregoing method, by having the single crystal Si thin film of which maximum size is not more than 10 cm, it is possible to prevent breakage such as cracking, or stripping of the Si even when high-strain-point glass is adopted, which is generally used for an active matrix liquid crystal display panel etc. and having greater thermal expansion rate difference with respect to the single crystal Si than that of quartz glass. Note that, the maximum size of the single crystal Si thin film signifies a greatest size among each outline length of the surface of the single crystal Si thin film having low thickness. For example, it signifies its diameter when the single crystal Si thin film has a disc shape, and it signifies the length of the diagonal line of upper surface rectangle when the single crystal Si thin film is a thin rectangular solid.

The semiconductor device according to the present invention may have such an arrangement that a maximum size of the single crystal Si thin film is not more than 5 cm.

With the foregoing method, by having the single crystal Si thin film of which maximum size is not more than 5 cm, it is possible to prevent breakage such as cracking, or stripping of the Si even when high-strain-point glass is adopted, which is generally used for an active matrix liquid crystal display panel etc. and having greater thermal expansion rate difference with respect to the single crystal Si than that of quartz glass.

The semiconductor device according to the present invention may have such an arrangement that a difference between the insulating substrate and the single crystal Si thin film in terms of a normalized linear expansion is not more than approximately 250 ppm at a temperature ranging from a room temperature to not more than 600° C.

With the foregoing method, a difference between the insulating substrate and the single crystal Si thin film is small in terms of the linear expansion coefficient. Thus, in the step of forming the single crystal Si thin film on the insulating substrate, it is possible to prevent (a) damages and exfoliation of the bonded surface that are brought about by the difference in terms of the thermal expansion coefficient when the single crystal Si thin film is divided at a hydrogen ion implantation portion in a cleaving manner, or (b) deficiency in the crystal. Further, it is possible to improve the thermal bond strength.

The method for manufacturing the semiconductor device may have such an arrangement that a dose amount of the hydrogen ions implanted into the hydrogen ion implantation portion is not less than $10^{16}$/cm$^2$, or is approximately $3 \times 10^{16}$/cm$^2$.

With the foregoing method, it is possible to improve the mobility etc. of the TFT formed in the area of the single crystal Si thin film.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. A semiconductor device, comprising a polycrystalline Si thin film and a single crystal Si thin film, that are respectively provided on different areas of an insulating substrate, wherein a difference between the insulating substrate and the single crystal Si thin film in terms of a normalized linear expansion is approximately not more than 250 ppm at a temperature ranging from a room temperature to approximately 600° C., wherein
the single crystal Si thin film and the polycrystalline Si thin film are at least partially provided at different elevations in the semiconductor device, and wherein
the single crystal Si thin film and the polycrystalline Si thin film are each semiconductor layers as active layers of respective transistors in the semiconductor device.

2. The semiconductor device as set forth in claim 1, wherein the insulating substrate is constituted of a high-strain-point glass, made of alkaline earth-alumino silicated-glass, which has a surface in which an $SiO_2$ layer has been formed at least on an area containing single crystal Si.

3. The semiconductor device as set forth in claim 1, wherein the insulating substrate is made of any one of barium-alumino boro-silicated glass, alkaline earth-alumino boro-silicated glass, boro-silicated glass, alkaline earth-zinc-lead-alumino boro-silicated glass, and alkaline earth-zinc-alumino boro-silicated glass.

4. The semiconductor device as set forth in claim 1, wherein the semiconductor device is an active matrix substrate including an integrated circuit constituted of a plurality of MOSFETs, a bipolar transistor, or an SIT, that are provided on the insulating substrate.

5. The semiconductor device as set forth in claim 1, wherein an area of the single crystal Si thin film formed on the insulating substrate is separated from an area of the polycrystalline Si thin film formed on the insulating substrate by not less than 0.3 µm.

6. The semiconductor device as set forth in claim 1, wherein an area of the single crystal Si thin film formed on the insulating substrate is separated from an area of the polycrystalline Si thin film formed on the insulating substrate by not less than 0.5 µm.

7. The semiconductor device as set forth in claim 1, wherein transistors, identical to each other in terms of a conductivity type, that are respectively provided on the different areas, are different from each other in terms of at least any one of a mobility, a sub-threshold coefficient, and a threshold value.

8. The semiconductor device as set forth in claim 1, wherein integrated circuits respectively provided on the different areas are different from each other in terms of at least one of a gate length, a thickness of a gate oxide film, a power supply voltage, and a logic level.

9. The semiconductor device as set forth in claim 1, wherein integrated circuits respectively provided on the different areas are different from each other in terms of a design rule.

10. The semiconductor device as set forth in claim 1, wherein a thickness of the single crystal Si thin film is approximately not more than 600 nm.

11. The semiconductor device as set forth in claim 1, wherein a thickness of the single crystal Si thin film is approximately not more than 100 nm.

12. A semiconductor device, comprising a polycrystalline Si thin film and a single crystal Si thin film that are respectively provided on different areas of an insulating substrate, wherein deviation of peak position of Raman shift is within $520.5 \pm 1.0$ cm$^{-1}$, wherein
the single crystal Si thin film and the polycrystalline Si thin film are at least partially provided at different elevations in the semiconductor device, and wherein
the single crystal Si thin film and the polycrystalline Si thin film are each semiconductor layers as active layers of respective transistors in the semiconductor device.

13. The semiconductor device as set forth in claim 12, wherein the insulating substrate is constituted of a high-strain-point glass, made of alkaline earth-alumino silicated-glass, which has a surface in which an $SiO_2$ layer has been formed at least on an area containing single crystal Si.

14. The semiconductor device as set forth in claim 12, wherein the insulating substrate is made of any one of barium-alumino boro-silicated glass, alkaline earth-alumino boro-silicated glass, boro-silicated glass, alkaline earth-zinc-lead-alumino boro-silicated glass, and alkaline earth-zinc-alumino boro-silicated glass.

15. The semiconductor device as set forth in claim 12, wherein the semiconductor device is an active matrix substrate including an integrated circuit constituted of a plurality of MOSFETs, a bipolar transistor, or an SIT, that are provided on the insulating substrate.

16. The semiconductor device as set forth in claim 12, wherein an area of the single crystal Si thin film formed on the insulating substrate is separated from an area of the polycrystalline Si thin film formed on the insulating substrate by not less than 0.3 µm.

17. The semiconductor device as set forth in claim 12, wherein an area of the single crystal Si thin film formed on the insulating substrate is separated from an area of the polycrystalline Si thin film formed on the insulating substrate by not less than 0.5 µm.

18. The semiconductor device as set forth in claim 12, wherein transistors, identical to each other in terms of a conductivity type, that are respectively provided on the different areas, are different from each other in terms of at least any one of a mobility, a sub-threshold coefficient, and a threshold value.

19. The semiconductor device as set forth in claim 12, wherein integrated circuits respectively provided on the different areas are different from each other in terms of at least one of a gate length, a thickness of a gate oxide film, a power supply voltage, and a logic level.

20. The semiconductor device as set forth in claim 12, wherein integrated circuits respectively provided on the different areas are different from each other in terms of a design rule.

21. The semiconductor device as set forth in claim 12, wherein a thickness of the single crystal Si thin film is approximately not more than 600 nm.

22. The semiconductor device as set forth in claim 12, wherein a thickness of the single crystal Si thin film is approximately not more than 100 nm.

23. A semiconductor device, including a polycrystalline Si thin film and a single crystal Si thin film that are respectively provided on different areas of an insulating substrate, which is constituted by the steps of:

depositing an $SiO_2$ film on a surface of the insulating substrate;

cutting a single crystal Si substrate into a predetermined shape, said single crystal Si substrate having a surface which has been oxidized or on which an $SiO_2$ film has been deposited, and having a hydrogen ion implantation portion in which hydrogen ions of a predetermined dose have been implanted to a predetermined depth;

cleaning the insulating substrate and the single crystal Si substrate so as to activate surfaces of both the substrates;

bonding a hydrogen ion implantation surface of the single crystal Si substrate that has been cut into the predetermined shape to the predetermined area at a room temperature;

dividing the single crystal Si substrate at the hydrogen ion implantation portion in a cleaving manner by performing a heating process, so as to form the single crystal Si thin film on a portion of the insulating substrate;

depositing an insulating film and an amorphous Si film sequentially on a surface of the insulating substrate; and growing a polycrystalline Si layer, by heating the amorphous Si film, so as to form the polycrystalline Si thin film, wherein a maximum size of the single crystal Si thin film is not more than 10 cm, wherein the single crystal Si thin film and the polycrystalline Si thin film are at least partially provided at different elevations in the semiconductor device, and wherein the single crystal Si thin film and the polycrystalline Si thin film are each semiconductor layers as active layers of respective transistors in the semiconductor device.

24. A semiconductor device, including a polycrystalline Si thin film and a single crystal Si thin film that are respectively provided on different areas of an insulating substrate, which is constituted by the steps of:

depositing an $SiO_2$ film on a surface of the insulating substrate;

cutting a single crystal Si substrate into a predetermined shape, said single crystal Si substrate having a surface which has been oxidized or on which an $SiO_2$ film has been deposited, and having a hydrogen ion implantation portion in which hydrogen ions of a predetermined dose have been implanted to a predetermined depth;

cleaning the insulating substrate and the single crystal Si substrate so as to activate surfaces of both the substrates;

bonding a hydrogen ion implantation surface of the single crystal Si substrate that has been cut into the predetermined shape to the predetermined area at a room temperature;

dividing the single crystal Si substrate at the hydrogen ion implantation portion in a cleaving manner by performing a heating process, so as to form the single crystal Si thin film on a portion of the insulating substrate;

depositing an insulating film and an amorphous Si film sequentially on a surface of the insulating substrate; and growing a polycrystalline Si layer, by heating the amorphous Si film, so as to form the polycrystalline Si thin film, wherein a maximum size of the single crystal Si thin film is not more than 5 cm, wherein the single crystal Si thin film and the polycrystalline Si thin film are at least partially provided at different elevations in the semiconductor device, and wherein the single crystal Si thin film and the polycrystalline Si thin film are each semiconductor layers as active layers of respective transistors in the semiconductor device.

* * * * *